(12) United States Patent
Feng et al.

(10) Patent No.: US 12,374,292 B2
(45) Date of Patent: Jul. 29, 2025

(54) SHIFT REGISTER UNIT, GATE DRIVING CIRCUIT AND DISPLAY SUBSTRATE

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/279,905

(22) PCT Filed: Oct. 27, 2022

(86) PCT No.: PCT/CN2022/127926
§ 371 (c)(1),
(2) Date: Sep. 1, 2023

(87) PCT Pub. No.: WO2024/087092
PCT Pub. Date: May 2, 2024

(65) Prior Publication Data
US 2025/0029562 A1    Jan. 23, 2025

(51) Int. Cl.
*G09G 3/3266* (2016.01)
*G09G 3/00* (2006.01)
(Continued)

(52) U.S. Cl.
CPC .......... *G09G 3/3266* (2013.01); *G09G 3/006* (2013.01); *G09G 3/3233* (2013.01); *G11C 19/28* (2013.01);
(Continued)

(58) Field of Classification Search
CPC .... G09G 3/3266; G09G 3/006; G09G 3/3233; G09G 2300/0842; G09G 2310/0286;
(Continued)

(56) References Cited

U.S. PATENT DOCUMENTS 11,551,620 B2 * 1/2023 Yun ..................... G09G 3/3258
11,783,753 B2 * 10/2023 Jin ....................... G09G 3/2092
345/204
(Continued)

FOREIGN PATENT DOCUMENTS

CN         113781967 A      12/2021

OTHER PUBLICATIONS

European Patent Office, Partial Supplementary European Search Report, Apr. 29, 2025, for corresponding EP application No. 22963076.9.

*Primary Examiner* — Jeff Piziali
(74) *Attorney, Agent, or Firm* — HOUTTEMAN LAW LLC

(57) ABSTRACT

The present disclosure provides a shift register unit, including: a first sensing control input circuit and at least one first output circuit; the shift register unit further includes: a first voltage control circuit, a first sensing input leakage prevention circuit and a first current limiting circuit; the first sensing control input circuit is connected to a first pull-up node through the first sensing input leakage prevention circuit, the first sensing control input circuit is connected to the first sensing input leakage prevention circuit at a first sensing input leakage prevention node connected to a first voltage control node, the first sensing input leakage prevention circuit is connected to the clock control signal input terminal and is configured to control on/off between the first
(Continued)

sensing input leakage prevention node and the first pull-up node; the first current limiting circuit is connected to the first voltage control node.

20 Claims, 35 Drawing Sheets

(51) Int. Cl.
*G09G 3/3233* (2016.01)
*G11C 19/28* (2006.01)

(52) U.S. Cl.
CPC ............ *G09G 2300/0842* (2013.01); *G09G 2310/0286* (2013.01); *G09G 2310/08* (2013.01); *G09G 2330/025* (2013.01)

(58) Field of Classification Search
CPC ......... G09G 2310/08; G09G 2330/025; G09G 2310/0267; G09G 2320/0295; G09G 3/20; G11C 19/28
See application file for complete search history.

(56) References Cited

U.S. PATENT DOCUMENTS

| 11,961,489 | B1* | 4/2024 | Chen | .................... | G09G 3/3674 |
| 12,205,532 | B2* | 1/2025 | Lee | ......................... | G09G 3/32 |
| 2021/0201807 | A1* | 7/2021 | Feng | .................... | G09G 3/3266 |
| 2022/0114970 | A1 | 4/2022 | Feng et al. | | |

* cited by examiner

SHIFT REGISTER UNIT, GATE DRIVING CIRCUIT AND DISPLAY SUBSTRATE

TECHNICAL FIELD

The present disclosure relates to the display field, and in particular to a shift register unit, a gate driving circuit and a display substrate.

BACKGROUND

An active matrix organic light emitting diode (AMOLED) is more and more widely applied. A pixel display device of the AMOLED is an organic light emitting diode (OLED), and the AMOLED can emit light by driving a thin film transistor in a saturated state to generate a driving current, which drives the light emitting device to emit light.

SUMMARY

In a first aspect, an embodiment of the present disclosure provides a shift register unit, including: a first sensing control input circuit connected to a sensing control node, a sensing signal input terminal, a random signal input terminal, a clock control signal input terminal, and a first pull-up node; and configured to write a signal from the sensing signal input terminal to the sensing control node in response to control of a valid level signal from the random signal input terminal, and write a valid level signal to the first pull-up node in response to control of a valid level signal at the sensing control node and a valid level signal from the clock control signal input terminal; and at least one first output circuit connected to the first pull-up node, a corresponding first clock signal input terminal, and a corresponding first signal output terminal; and configured to write a signal from the corresponding first clock signal input terminal to the corresponding first signal output terminal in response to control of a valid level signal at the first pull-up node; wherein the shift register unit further includes: a first voltage control circuit, a first sensing input leakage prevention circuit and a first current limiting circuit; the first voltage control circuit is connected to a first power supply terminal, the first pull-up node and a first voltage control node, and is configured to write a valid level signal from the first power supply terminal to the first voltage control node in response to control of a valid level signal at the first pull-up node; the first sensing control input circuit is connected to the first pull-up node through the first sensing input leakage prevention circuit, the first sensing control input circuit is connected to the first sensing input leakage prevention circuit at a first sensing input leakage prevention node connected to the first voltage control node, the first sensing input leakage prevention circuit is connected to the clock control signal input terminal and is configured to form a path between the first sensing input leakage prevention node and the first pull-up node in response to control of a valid level signal at the clock control signal input terminal, and to disconnect the first sensing input leakage prevention node from the first pull-up node in response to control of an invalid level signal at the clock control signal input terminal; and the first current limiting circuit is connected to the first voltage control node.

In some embodiments, the first current limiting circuit includes: a first load circuit between the first sensing input leakage prevention node and the first voltage control node; and configured to increase a load resistance between the first sensing input leakage prevention node and the first voltage control node.

In some embodiments, the first load circuit includes: an eighty-first transistor; and a control electrode of the eighty-first transistor is connected to the first voltage control node, a first electrode of the eighty-first transistor is connected to the first sensing input leakage prevention node, and a second electrode of the eighty-first transistor is connected to the first voltage control node.

In some embodiments, the first current limiting circuit includes: a second load circuit connected to the first voltage control node and a second power supply terminal; and configured to increase a load capacitance at the first voltage control node.

In some embodiments, the second load circuit includes: an eleventh capacitor; and a first terminal of the eleventh capacitor is connected to the first voltage control node, and a second terminal of the eleventh capacitor is connected to the second power supply terminal.

In some embodiments, the shift register unit further includes: a first global reset circuit connected to a global reset signal input terminal, the second power supply terminal and the first pull-up node, and configured to write an invalid level signal from the second power supply terminal to the first pull-up node in response to control of a valid level signal from the global reset signal input terminal; and a first leakage prevention circuit; wherein the first global reset circuit is connected to the second power supply terminal through the first leakage prevention circuit; the first global reset circuit is connected to the first leakage prevention circuit at a first leakage prevention node connected to the first voltage control node; the first leakage prevention circuit is connected to the global reset signal input terminal and is configured to form a path between the first leakage prevention node and the second power supply terminal in response to control of a valid level signal from the global reset signal input terminal, and to disconnect the first leakage prevention node from the second power supply terminal in response to control of an invalid level signal from the global reset signal input terminal.

In some embodiments, the first current limiting circuit includes: a third load circuit between the first leakage prevention node and the first voltage control node, and configured to increase a load resistance between the first leakage prevention node and the first voltage control node.

In some embodiments, the third load circuit includes: an eighty-second transistor; and a control electrode of the eighty-second transistor is connected to the first voltage control node, a first electrode of the eighty-second transistor is connected to the first leakage prevention node, and a second electrode of the eighty-second transistor is connected to the first voltage control node.

In some embodiments, the shift register unit further includes: a fifth load circuit, wherein at least one of the first global reset circuit and the first leakage prevention circuit is connected to the global reset signal input terminal through the fifth load circuit, the fifth load circuit is configured to increase a load resistance between the global reset signal input terminal and at least one of the first global reset circuit and the first leakage prevention circuit.

In some embodiments, the fifth load circuit includes: an eighty-fourth transistor; and a control electrode of the eighty-fourth transistor is connected to the global reset signal input terminal, a first electrode of the eighty-fourth transistor is connected to the global reset signal input terminal, and a second electrode of the eighty-fourth transistor is connected to at least one of the first global reset circuit and the first leakage prevention circuit.

In some embodiments, the shift register unit further includes: a first pull-down control circuit connected to the second power supply terminal, a fifth power supply terminal, the first pull-up node, and the first pull-down node, and configured to write a voltage having a phase opposite to that of the voltage at the first pull-up node to the first pull-down node; and a first pull-up noise reduction circuit connected to the second power supply terminal, the first pull-up node, and the first pull-down node, and configured to write an invalid level signal from the second power supply terminal to the first pull-up node in response to control of a valid level signal at the first pull-down node; wherein the first output circuit is further connected to the first pull-down node and the second power supply terminal, and is further configured to write an invalid level signal from the second power supply terminal to the corresponding first signal output terminal in response to control of a valid level signal at the first pull-down node;

In some embodiments, the shift register unit further includes: a third leakage prevention circuit; wherein the first pull-up noise reduction circuit is connected to the second power supply terminal through the third leakage prevention circuit; the first pull-up noise reduction circuit is connected to the third leakage prevention circuit at a third leakage prevention node connected to the first voltage control node; the third leakage prevention circuit is connected to the first pull-down node, and is configured to form a path between the third leakage prevention node and the second power supply terminal in response to control of a valid level signal at the first pull-down node, and to disconnect the third leakage prevention node from the second power supply terminal in response to control of an invalid level signal at the first pull-down node.

In some embodiments, the first voltage control node is between the first sensing input leakage prevention node and the third leakage prevention node; and the first current limiting circuit includes: a fourth load circuit between the first voltage control node and the third leakage prevention node, and configured to increase a load resistance between the first voltage control node and the third leakage prevention node.

In some embodiments, the fourth load circuit includes: an eighty-third transistor; and a control electrode of the eighty-third transistor is connected to the first voltage control node, a first electrode of the eighty-third transistor is connected to the first voltage control node, and a second electrode of the eighty-third transistor is connected to the third leakage prevention node.

In some embodiments, the shift register unit further includes: a first pull-down noise reduction circuit connected to the first pull-down node, the second power supply terminal, the sensing control node and the clock control signal input terminal and configured to write an invalid level signal from the second power supply terminal to the first pull-down node in response to control of a valid level signal at the sensing control node and a valid level signal from the clock control signal input terminal.

In some embodiments, the first pull-down noise reduction circuit includes: a twenty-ninth transistor and a thirtieth transistor; a control electrode of the twenty-ninth transistor is connected to the clock control signal input terminal, a first electrode of the twenty-ninth transistor is connected to the first pull-down node, and a second electrode of the twenty-ninth transistor is connected to a first electrode of the thirtieth transistor; and a control electrode of the thirtieth transistor is connected to the sensing control node, and a second electrode of the thirtieth transistor is connected to the second power supply terminal.

In some embodiments, the first pull-down noise reduction circuit further includes: an eighty-fifth transistor; the first electrode of the twenty-ninth transistor connected to the first pull-down node through the eighty-fifth transistor; and a control electrode of the eighty-fifth transistor is connected to the sensing control node, a first electrode of the eighty-fifth transistor is connected to the first pull-down node, and a second electrode of the eighty-fifth transistor is connected to the first electrode of the twenty-ninth transistor.

In some embodiments, the shift register unit further includes: a first display input circuit connected to a display signal input terminal, the first power supply terminal, and the first pull-up node, and configured to write a valid level signal from the first power supply terminal to the first pull-up node in response to control of a valid level signal from the display signal input terminal; and a first display reset circuit connected to a display reset signal input terminal, the second power supply terminal and the first pull-up node; and configured to write an invalid level signal from the second power supply terminal to the first pull-up node in response to control of a valid level signal from the display reset signal input terminal.

In some embodiments, the shift register unit further includes: at least one of a first display input leakage prevention circuit and a second leakage prevention circuit; wherein the first display input circuit is connected to the first pull-up node through the first display input leakage prevention circuit; the first display input circuit is connected to the first display input leakage prevention circuit at a first display input leakage prevention node connected to the first voltage control node; the first display input leakage prevention circuit is connected to the display signal input terminal and is configured to form a path between the first display input leakage prevention node and the first pull-up node in response to control of a valid level signal from the display signal input terminal, and to disconnect the first display input leakage prevention node from the first pull-up node in response to control of an invalid level signal from the display signal input terminal; and the first display reset circuit is connected to the second power supply terminal through the second leakage prevention circuit, the first display reset circuit is connected to the second leakage prevention circuit at a second leakage prevention node connected to the first voltage control node; the second leakage prevention circuit is connected to the display reset signal input terminal, and configured to form a path between the second leakage prevention node and the second power supply terminal in response to control of a valid level signal from the display reset signal input terminal, and to disconnect the second leakage prevention node from the second power supply terminal in response to control of an invalid level signal from the display reset signal input terminal.

In some embodiments, the first sensing control input circuit includes: a sensing control circuit and a first sensing input circuit; the sensing control circuit is connected to the sensing control node, the sensing signal input terminal and the random signal input terminal, and is configured to write a signal from the sensing signal input terminal to the sensing control node in response to control of a valid level signal from the random signal input terminal; and the first sensing input circuit is connected to the sensing control node, the clock control signal input terminal, a sensing intermediate node and the first pull-up node, and configured to write a valid level signal to the sensing intermediate node in response to control of a valid level signal at the sensing control node and to form a path between the sensing intermediate node and the first pull-up node in response to control of a valid level signal from the clock control signal input terminal.

In some embodiments, the shift register unit further includes: a sensing control leakage prevention circuit; wherein the sensing control circuit is connected to the sensing control node through the sensing control leakage prevention circuit; the sensing control leakage prevention circuit is connected to the sensing control circuit at a sensing control leakage prevention node; the sensing control leakage prevention circuit is further connected to the first power supply terminal, the sensing control node and the random signal input terminal; and configured to write a valid level signal from the first power supply terminal to the sensing control leakage prevention node in response to control of a valid level signal at the sensing control node; configured to form a path between the sensing control leakage prevention node and the sensing control node in response to control of a valid level signal from the random signal input terminal; and to disconnect the sensing control leakage prevention node from the sensing control node in response to control of an invalid level signal from the random signal input terminal.

In some embodiments, the shift register unit further includes: a second sensing input circuit connected to the clock control signal input terminal, the second pull-up node and a preset power supply node, and configured to form a path between the preset power supply node and the second pull-up node in response to control of a valid level signal from the clock control signal input terminal; and at least one second output circuit connected to the second pull-up node, a corresponding second clock signal input terminal, and a corresponding second signal output terminal, and configured to write a signal from the corresponding second clock signal input terminal to the corresponding second signal output terminal in response to control of a valid level signal at the second pull-up node; wherein the preset power supply node is the sensing intermediate node or the first sensing input leakage prevention node.

In some embodiments, the preset power supply node is the first sensing input leakage prevention node; the shift register unit further includes: a second voltage control circuit and a second current limiting circuit; the second voltage control circuit is connected to the first power supply terminal, the second pull-up node and a second voltage control node, and is configured to write a valid level signal from the first power supply terminal to the second voltage control node in response to control of a valid level signal at the second pull-up node; and the second current limiting circuit is connected to the second voltage control node, and is configured to reduce a charging/discharging current at the second voltage control node.

In some embodiments, the second current limiting circuit includes: an eleventh load circuit between the first sensing input leakage prevention node and the second voltage control node, and configured to increase a load resistance between the first sensing input leakage prevention node and the second voltage control node.

In some embodiments, the eleventh load circuit includes: a ninety first transistor; and a control electrode of the ninety-first transistor is connected to the second voltage control node, a first electrode of the ninety-first transistor is connected to the second voltage control node, and a second electrode of the ninety-first transistor is connected to the first sensing input leakage prevention node.

In some embodiments, the preset power supply node is the sensing intermediate node; the shift register unit further includes: a second voltage control circuit, a second sensing input leakage prevention circuit and a second current limiting circuit; the second voltage control circuit is connected to the first power supply terminal, the second pull-up node and the second voltage control node, and is configured to write a valid level signal from the first power supply terminal to the second voltage control node in response to control of a valid level signal at the second pull-up node; the second sensing input circuit is connected to the second pull-up node through the second sensing input leakage prevention circuit, the second sensing input circuit is connected to the second sensing input leakage prevention circuit at a second sensing input leakage prevention node connected to the second voltage control node; the second sensing input leakage prevention circuit is connected to the clock control signal input terminal and is configured to form a path between the second sensing input leakage prevention node and the second pull-up node in response to control of a valid level signal at the clock control signal input terminal, and to disconnect the second sensing input leakage prevention node from the second pull-up node in response to control of an invalid level signal at the clock control signal input terminal; and the second current limiting circuit is connected to the second voltage control node, and is configured to reduce a charging/discharging current at the second voltage control node.

In some embodiments, the second current limiting circuit includes: an eleventh load circuit between the second sensing input leakage prevention node and the second voltage control node, and configured to increase a load resistance between the second sensing input leakage prevention node and the second voltage control node.

In some embodiments, the eleventh load circuit includes: a ninety first transistor; and a control electrode of the ninety-first transistor is connected to the second voltage control node, a first electrode of the ninety-first transistor is connected to the second sensing input leakage prevention node, and a second electrode of the ninety-first transistor is connected to the second voltage control node.

In some embodiments, the second current limiting circuit includes: a twelfth load circuit connected to the second voltage control node and the second power supply terminal; and configured to increase a load capacitance at the second voltage control node.

In some embodiments, the twelfth load circuit includes: a twelfth capacitor; and a first terminal of the twelfth capacitor is connected to the second voltage control node, and a second terminal of the twelfth capacitor is connected to the second power supply terminal.

In some embodiments, the shift register unit further includes: a second global reset circuit connected to the global reset signal input terminal, the second power supply terminal, and the second pull-up node, and configured to write an invalid level signal from the second power supply terminal to the second pull-up node in response to control of a valid level signal from the global reset signal input terminal; and a fourth leakage prevention circuit, wherein the second global reset circuit is connected to the second power supply terminal through the fourth leakage prevention circuit, the second global reset circuit is connected to the fourth leakage prevention circuit at a fourth leakage prevention node connected to the second voltage control node; the fourth leakage prevention circuit is connected to the global reset signal input terminal, and is configured to form a path between the fourth leakage prevention node and the second power supply terminal in response to control of a valid level signal from the global reset signal input terminal, and to disconnect the fourth leakage prevention node from the second power supply terminal in response to control of an invalid level signal from the global reset signal input terminal.

In some embodiments, the second current limiting circuit includes: a thirteenth load circuit between the fourth leakage prevention node and the second voltage control node, and configured to increase a load resistance between the fourth leakage prevention node and the second voltage control node.

In some embodiments, the thirteenth load circuit includes: a ninety-second transistor; and a control electrode of the ninety-second transistor is connected to the second voltage control node, a first electrode of the ninety-second transistor is connected to the fourth leakage prevention node, and a second electrode of the ninety-second transistor is connected to the second voltage control node.

In some embodiments, the shift register unit further includes: a fifteenth load circuit, wherein at least one of the second global reset circuit and the fourth leakage prevention circuit is connected to the global reset signal input terminal through the fifteenth load circuit, the fifteenth load circuit is configured to increase a load resistance between the global reset signal input terminal and at least one of the first global reset circuit and the first leakage prevention circuit.

In some embodiments, the fifteenth load circuit includes: a ninety-fourth transistor; and a control electrode of the ninety-fourth transistor is connected to the global reset signal input terminal, a first electrode of the ninety-fourth transistor is connected to the global reset signal input terminal, and a second electrode of the ninety-fourth transistor is connected to at least one of the second global reset circuit and the fourth leakage prevention circuit.

In some embodiments, the shift register unit further includes: a second pull-down control circuit connected to the second power supply terminal, a fifth power supply terminal, the second pull-up node and the second pull-down node, and configured to write a voltage having a phase opposite to that of the voltage at the second pull-up node to the second pull-down node; and a second pull-up noise reduction circuit connected to the second power supply terminal, the second pull-up node and the second pull-down node, and configured to write an invalid level signal from the second power supply terminal to the second pull-up node in response to control of a valid level signal at the second pull-down node; wherein the at least one second output circuit is further connected to the second pull-down node and the second power supply terminal, and is further configured to write an invalid level signal from the second power supply terminal to the corresponding second signal output terminal in response to control of a valid level signal at the second pull-down node;

In some embodiments, the shift register unit further includes: a sixth leakage prevention circuit; wherein the second pull-up noise reduction circuit is connected to the second power supply terminal through the sixth leakage prevention circuit, the second pull-up noise reduction circuit is connected to the sixth leakage prevention circuit at a sixth leakage prevention node connected to the second voltage control node; the sixth leakage prevention circuit is connected to the second pull-down node, and is configured to form a path between the sixth leakage prevention node and the second power supply terminal in response to control of a valid level signal at the second pull-down node, and to disconnect the sixth leakage prevention node from the second power supply terminal in response to control of an invalid level signal at the second pull-down node.

In some embodiments, the second voltage control node is between the second sensing input leakage prevention node and the sixth leakage prevention node; and the second current limiting circuit includes: a fourteenth load circuit between the second voltage control node and the sixth leakage prevention node, and configured to increase a load resistance between the second voltage control node and the sixth leakage prevention node.

In some embodiments, the fourteenth load circuit includes: a ninety-third transistor; and a control electrode of the ninety-third transistor is connected to the second voltage control node, a first electrode of the ninety-third transistor is connected to the second voltage control node, and a second electrode of the ninety-third transistor is connected to the sixth leakage prevention node.

In some embodiments, the shift register unit further includes: a third pull-down noise reduction circuit connected to the second pull-down node, the second power supply terminal, the sensing control node and the clock control signal input terminal; and configured to write an invalid level signal from the second power supply terminal to the second pull-down node in response to control of a valid level signal at the sensing control node and a valid level signal from the clock control signal input terminal.

In some embodiments, the third pull-down noise reduction circuit includes: a fifty-ninth transistor and a sixtieth transistor; a control electrode of the fifty-ninth transistor is connected to the clock control signal input terminal, a first electrode of the fifty-ninth transistor is connected to the second pull-down node, and a second electrode of the fifty-ninth transistor is connected to a first electrode of the sixtieth transistor; and a control electrode of the sixtieth transistor is connected to the sensing control node, and a second electrode of the sixtieth transistor is connected to the second power supply terminal.

In some embodiments, the third pull-down noise reduction circuit further includes: a ninety-fifth transistor through which the first electrode of the fifty-ninth transistor is connected to the second pull-down node; and a control electrode of the ninety-fifth transistor is connected to the sensing control node, a first electrode of the ninety-fifth transistor is connected to the second pull-down node, and a second electrode of the ninety-fifth transistor is connected to the first electrode of the fifty-ninth transistor.

In some embodiments, the shift register unit further includes: a second display input circuit connected to the display signal input terminal, the first power supply terminal and the second pull-up node, and configured to write a valid level signal from the first power supply terminal to the second pull-up node in response to control of a valid level signal from the display signal input terminal; and a second display reset circuit connected to the display reset signal input terminal, the second power supply terminal and the second pull-up node; and configured to write an invalid level signal from the second power supply terminal to the second pull-up node in response to control of a valid level signal from the display reset signal input terminal.

In some embodiments, the shift register unit further includes: at least one of a second display input leakage prevention circuit and a fifth leakage prevention circuit; wherein the second display input circuit is connected to the second pull-up node through the second display input leakage prevention circuit, the second display input circuit is connected to the second display input leakage prevention circuit at a second display input leakage prevention node connected to the second voltage control node; the second display input leakage prevention circuit is connected to the display signal input terminal, and is configured to form a path between the second display input leakage prevention node and the second pull-up node in response to control of a valid level signal from the display signal input terminal, and to disconnect the second display input leakage prevention node from the second pull-up node in response to control of an invalid level signal from the display signal input terminal; and the second display reset circuit is connected to the second power supply terminal through the fifth leakage prevention circuit, the second display reset circuit is connected to the fifth leakage prevention circuit at a fifth leakage prevention node connected to the second voltage control node; the fifth leakage prevention circuit is connected to the display reset signal input terminal, and is configured to form a path between the fifth leakage prevention node and the second power supply terminal in response to control of a valid level signal from the display reset signal input terminal, and to disconnect the fifth leakage prevention node from the second power supply terminal in response to control of an invalid level signal from the display reset signal input terminal.

In a second aspect, an embodiment of the present disclosure further provides a gate driving circuit, including: a plurality of cascaded shift register units, each of which is the shift register unit in the first aspect.

In a third aspect, an embodiment of the present disclosure further provides a display substrate, including: a base substrate and a gate driving circuit on the base substrate, wherein the gate driving circuit is the gate driving circuit in the second aspect.

DETAIL DESCRIPTION OF EMBODIMENTS

In order to enable one of ordinary skill in the art to better understand the technical solutions of the present disclosure, a shift register unit, a gate driving circuit and a display substrate provided by the present disclosure will be described in further detail with reference to the accompanying drawings.

The terms "first", "second", and the like used in the present disclosure are not intended to indicate any order, quantity, or importance, but rather are used for distinguishing one element from another. The term "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections.

Transistors used in the embodiments of the present disclosure may be thin film transistors or field effect transistors or other devices having the same characteristics. In this embodiment, coupling modes of a drain electrode and a source electrode of each transistor may be interchanged. Thus, in the embodiment of the present disclosure, the drain electrode and the source electrode of each transistor have no difference therebetween. Here, only in order to distinguish two electrodes of the transistor except for a control electrode (i.e., a gate electrode), one of the two electrodes is referred to as a drain electrode, and the other electrode is referred to as a source electrode. The thin film transistor used in the embodiments of the present disclosure may be an N-type transistor or a P-type transistor. In the embodiment of the present disclosure, when an N-type thin film transistor is used, a first electrode of the transistor may be a source electrode, and a second electrode of the transistor may be a drain electrode.

In the present disclosure, a "valid level signal" refers to a signal input to the control electrode of the transistor to control the transistor to be turned on, and an "invalid level signal" refers to a signal input to the control electrode of the transistor to control the transistor to be turned off. For an N-type transistor, a high level signal is a valid level signal, and a low level signal is an invalid level signal; for a P-type transistor, a low level signal is a valid level signal and a high level signal is an invalid level signal.

In the following description, as an example, the transistor is an N-type transistor for description. At this time, a valid level signal refers to a high level signal and an invalid level signal refers to a low level signal. It is conceivable that when a P-type transistor is employed, the timing of the control signal needs to be adjusted accordingly. Specific details are not set forth herein, but should be within the scope of the present disclosure.

Figure 1:
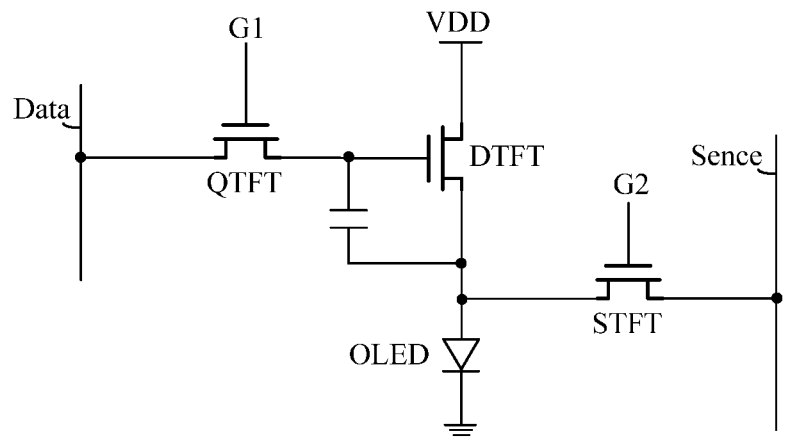
FIG. 1 is a schematic diagram of a circuit structure of a pixel circuit in an organic light emitting diode display panel.
Figure 2:
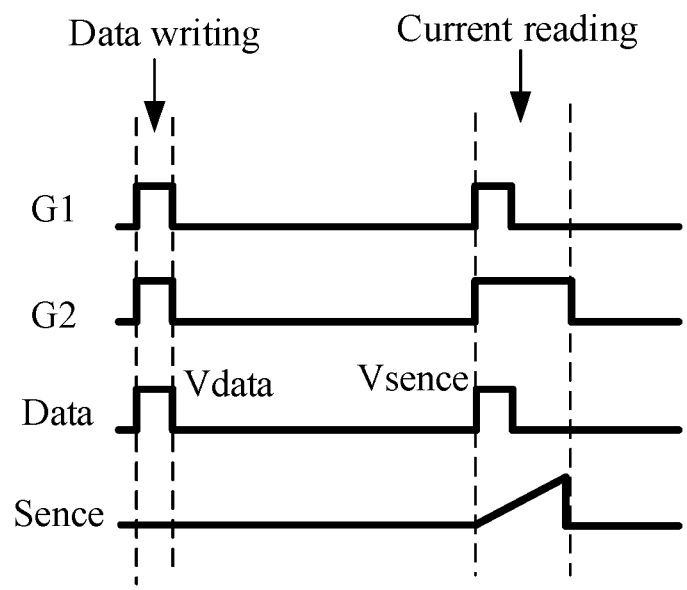
FIG. 2 is a timing diagram illustrating operation of the pixel circuit shown in FIG. 1.

FIG. 1 is a schematic diagram of a circuit structure of a pixel circuit in an organic light emitting diode display panel; FIG. 2 is a timing diagram illustrating operation of the pixel circuit shown in FIG. 1. As shown in FIGS. 1 and 2, for an organic light emitting diode display panel with an external compensation function, one frame of picture may be divided into two stages: a display driving stage and a sensing stage; in the display driving stage, pixel units in rows in the display panel have been driven to display; in the sensing stage, a current drawing (i.e., sensing) for pixel units in a row in the display panel has been completed.

Referring to FIG. 1, each pixel circuit includes a display switching transistor QTFT (having a control electrode connected to a first gate line G1), a driving transistor DTFT, a sensing switching transistor STFT (having a control electrode connected to a second gate line G2), and a capacitor Cst. When it is necessary to perform an external compensation on the pixel circuit, the operation process of the pixel circuit at least includes the following two stages: a pixel driving stage (including a data voltage writing process) and a pixel sensing stage (including a current reading process).

In the pixel driving stage, it is necessary to write a data voltage Vdata in a data line Data to the pixel unit; in the pixel sensing stage, it is necessary to write a test voltage Vsence to the pixel unit through the data line Data, and read an electrical signal at a drain electrode of the driving transistor to a signal reading line Sence through the sensing switching transistor STFT. In the current reading process, it is necessary to write a valid level voltage to a gate electrode of the sensing switching transistor STFT through the corresponding second gate line G2. It should be noted that the specific compensation process and principle for performing the external compensation on the pixel unit in the OLED display panel are not described herein again.

For the second gate line G2 for controlling the sensing switching transistor STFT, a corresponding gate driving circuit is disposed in a peripheral region of the display panel, and includes a plurality of cascaded shift register units, through which driving signals may be supplied to the corresponding second gate line G2.

Figure 3:
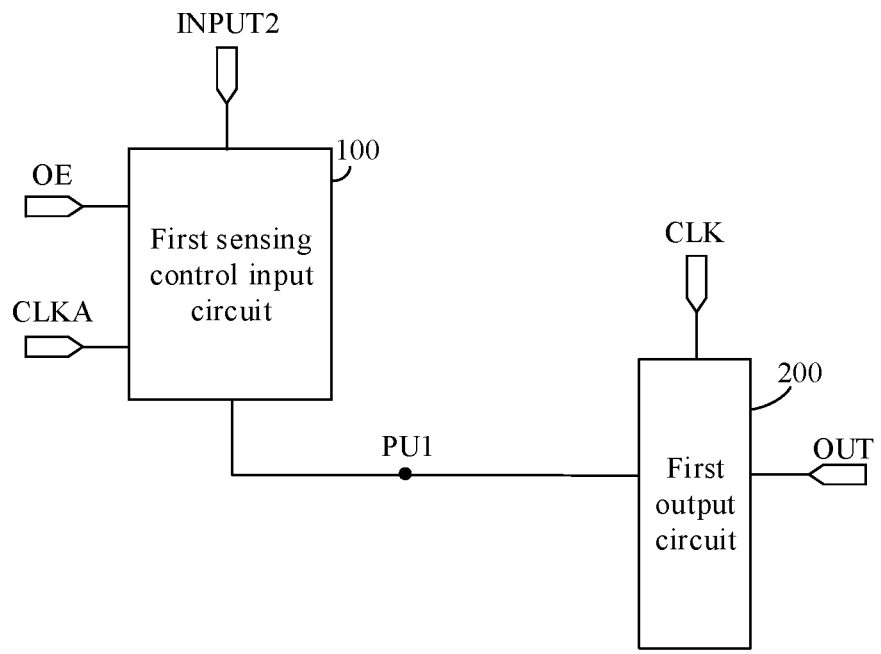
FIG. 3 is a schematic diagram of a circuit structure of a shift register unit in the related art.

FIG. 3 is a schematic diagram of a circuit structure of a shift register unit in the related art. As shown in FIG. 3, the shift register unit includes: a first sensing control input circuit 100 and at least one first output circuit 200; the first sensing control input circuit 100 is connected to a sensing signal input terminal INPUT2, a random signal input terminal OE, a clock control signal input terminal CLKA, and a first pull-up node PUT; and the first sensing control input circuit 100 is capable of writing a valid level signal to the first pull-up node PUT; the first output circuit 200 is connected to the first pull-up node PUT, a corresponding first clock signal input terminal CLK, and a corresponding first signal output terminal OUT, and is configured to write a signal provided by the first clock signal input terminal CLK to the corresponding first signal output terminal OUT terminal in response to control of a valid level signal at the first pull-up node PUT.

It is found in practical applications that after the first sensing control input circuit 100 has wrote the valid level signal to the first pull-up node PUT, the first pull-up node PUT is in a floating state for a long time; and at this time, the first pull-up node PUT easily leaks current through the first sensing control input circuit 100, so that a voltage at the first pull-up node PUT drifts; when the voltage at the first pull-up node PUT drifts to a large extent (e.g., to a low level state), the first output circuit 200 may fail to output effectively; that is, the shift register units operates abnormally.

Figure 4:
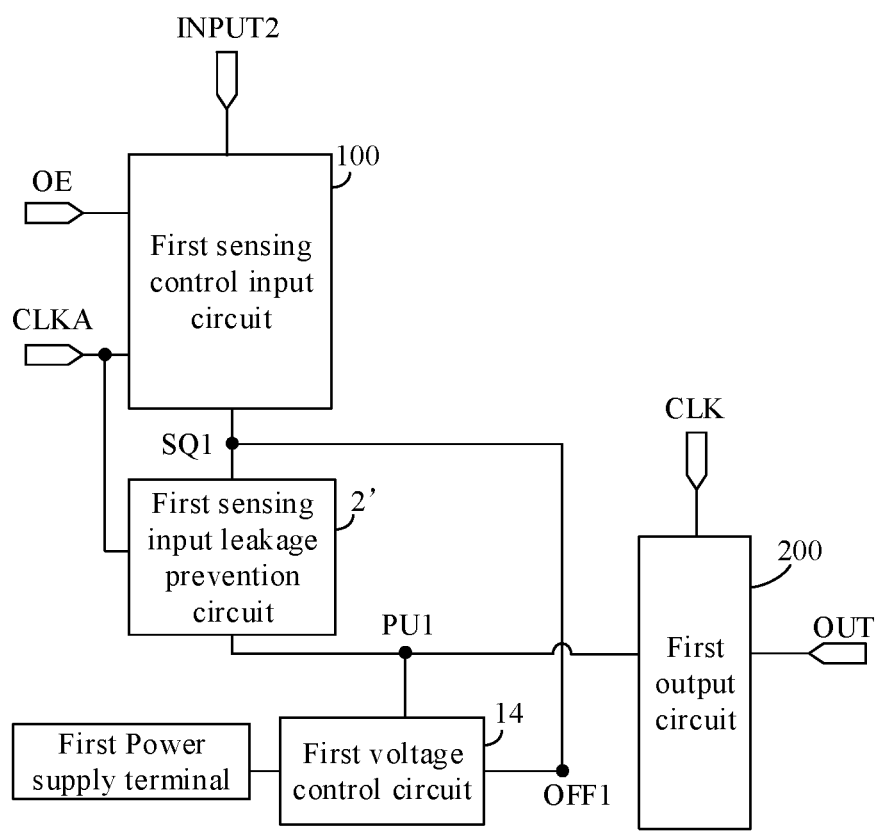
FIG. 4 is a schematic diagram of another circuit structure of a shift register unit in the related art.

FIG. 4 is a schematic diagram of another circuit structure of a shift register unit in the related art. As shown in FIG. 4, in order to effectively improve the problem that the first pull-up node PUT leaks current through the first sensing control input circuit 100, a first voltage control circuit 14 and a first sensing input leakage prevention circuit 2' are additionally provided in the shift register unit in the related art.

The first voltage control circuit 14 is connected to a first power supply terminal, the first pull-up node PU1 and a first voltage control node OFF1, and is configured to write a valid level signal provided by the first power supply terminal into the first voltage control node OFF1 in response to control of a valid level signal at the first pull-up node PU1.

The first sensing control input circuit 100 is connected to the first pull-up node PU1 through the first sensing input leakage prevention circuit 2', the first sensing control input circuit 100 is connected to the first sensing input leakage prevention circuit 2' at a first sensing input leakage prevention node SQ1, the first sensing input leakage prevention node SQ1 is connected to the first voltage control node OFF1, the first sensing input leakage prevention circuit 2' is connected to the clock control signal input terminal CLKA, and the first sensing input leakage prevention circuit 2' is configured to control on/off between the first sensing input leakage prevention node SQ1 and the first pull-up node PU1 in response to control of a signal provided by the clock control signal input terminal CLKA.

Specifically, when the first pull-up node PU1 is in a valid level state, the first voltage control circuit 14 writes a valid level signal provided by the first power supply terminal to the first voltage control node OFF1 and the first sensing input leakage prevention node SQ1 in response to control of a valid level signal at the first pull-up node PU1. Since both the first sensing input leakage prevention node SQ1 and the first pull-up node PU1 are in a valid level state, the first pull-up node PU1 cannot leak current through the first sensing control input circuit 100, thereby solving the problem that the first pull-up node PU1 leaks current through the first sensing control input circuit 100.

However, it is found in practical applications that the first sensing input leakage prevention circuit 2' is controlled by the clock control signal input terminal CLKA, and a parasitic capacitor exists between a gate electrode and a source/drain electrode of each transistor in the first sensing input leakage prevention circuit 2', so that when the level of the signal provided by the clock control signal input terminal CLKA is switched, for example, from a high level to a low level or from a low level to a high level, an excessive transient current (with a current peak value exceeding 75 uA) exists at the first sensing input leakage prevention node SQ1 and the first voltage control node OFF1, and a voltage at the first voltage control node OFF1 will also drift. The excessive transient current at the first voltage control node OFF1 may adversely affect electrical devices connected to the first voltage control node OFF1 (for example, transistors in the first voltage control circuit 14 or transistors additionally arranged at the later stage in the shift register unit and connected to the first voltage control node OFF1), and further affect an operating yield of a shift register.

In order to effectively improve the problem that the excessive transient current is generated at the first voltage control node OFF1 caused by switching the level of the signal provided by the clock control signal input terminal CLKA, the embodiment of the present disclosure provides a corresponding solution.

Figure 5A:
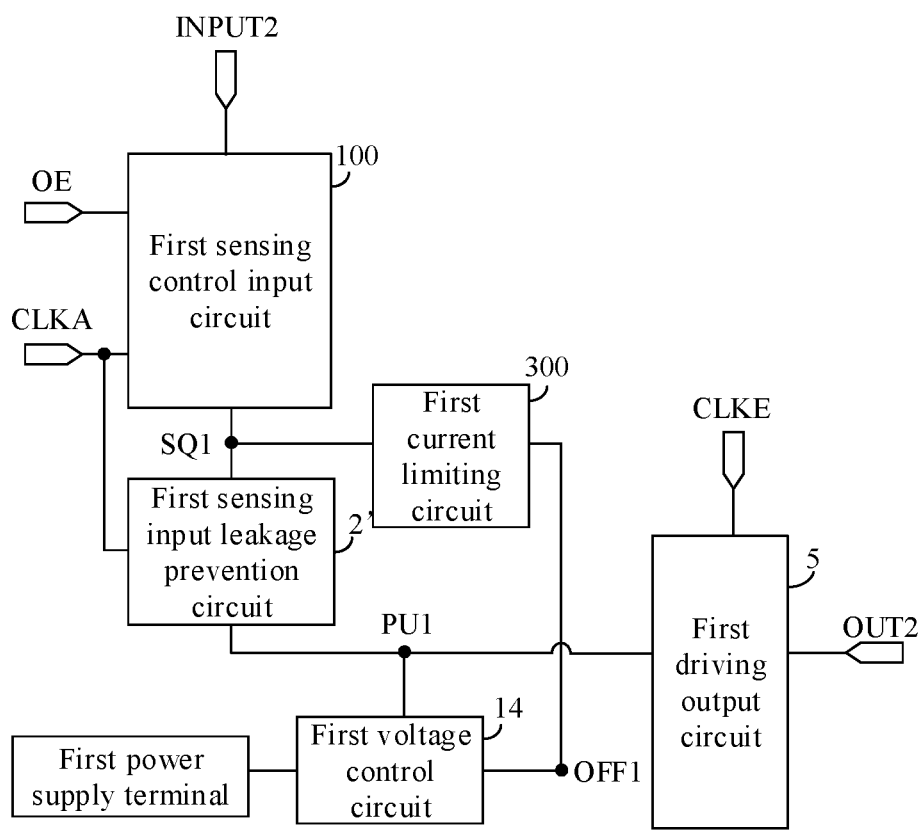
FIG. 5A and FIG. 5B are schematic diagrams of two circuit structures of a shift register unit according to an embodiment of the present disclosure.
Figure 5B:
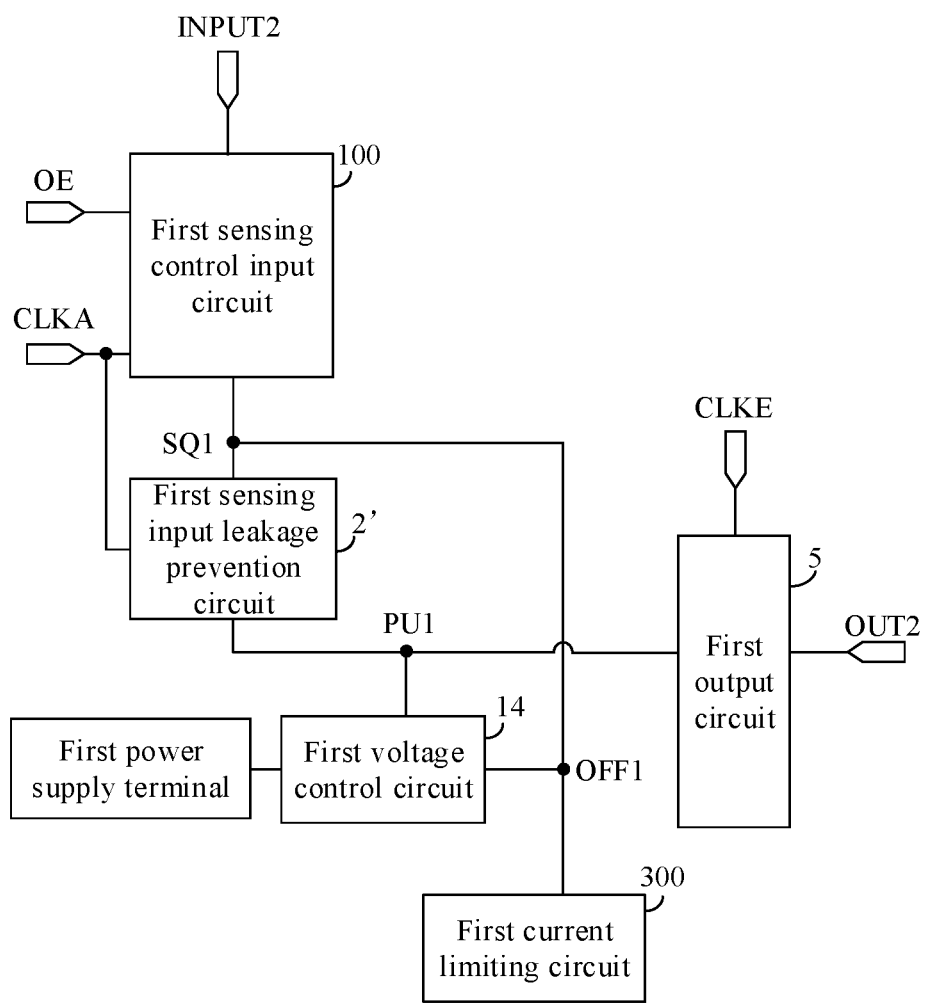

FIG. 5A and FIG. 5B are schematic diagrams of two circuit structures of a shift register unit according to an embodiment of the present disclosure. As shown in FIGS. 5A and 5B, the shift register unit includes: a first sensing control input circuit 100, at least one first output circuit, a first voltage control circuit 14, a first sensing input leakage prevention circuit 2' and a first current limiting circuit 300.

The first sensing control input circuit 100 is connected to a sensing control node, the sensing signal input terminal INPUT2, the random signal input terminal OE, the clock control signal input terminal, and the first pull-up node PUT; and the first sensing control input circuit 100 is configured to write a signal provided by the sensing signal input terminal INPUT2 to the sensing control node in response to control of a valid level signal provided by the random signal input terminal OE, and write a valid level signal to the first pull-up node PU1 in response to control of a valid level signal at the sensing control node and a valid level signal provided by the clock control signal.

The first output circuit is connected to the first pull-up node PUT, the corresponding first clock signal input terminal, and the corresponding first signal output terminal, and is configured to write a signal provided by the corresponding first clock signal input terminal to the corresponding first signal output terminal in response to control of a valid level signal at the first pull-up node PUT.

In the present disclosure, the at least one first output circuit includes at least a first driving output circuit 5; the first driving output circuit 5 is connected to the first pull-up node PUT, a first driving clock signal input terminal CLKE (a first clock signal input terminal corresponding to the first driving output circuit), and a first driving signal output terminal OUT2 (a first signal output terminal corresponding to the first driving output circuit), and is configured to write a signal provided by the first driving clock signal input terminal CLKE to the first driving signal output terminal OUT2 in response to control of a valid level signal at the first pull-up node PUT.

The first voltage control circuit 14 is connected to the first power supply terminal, the first pull-up node PUT and the first voltage control node OFF1, and is configured to write a valid level signal provided by the first power supply terminal to the first voltage control node OFF1 in response to control of a valid level signal at the first pull-up node PU1.

The first sensing control input circuit 100 is connected to the first pull-up node PU1 through the first sensing input leakage prevention circuit 2', the first sensing control input circuit 100 is connected to the first sensing input leakage prevention circuit 2' at a first sensing input leakage prevention node SQ1, the first sensing input leakage prevention node SQ1 is connected to the first voltage control node OFF1, the first sensing input leakage prevention circuit 2' is connected to the clock control signal input terminal CLKA and is configured to form a path between the first sensing input leakage prevention node SQ1 and the first pull-up node PU1 in response to control of a valid level signal at the clock control signal input terminal CLKA, and to disconnect the first sensing input leakage prevention node SQ1 from the first pull-up node PU1 (form an open circuit between the first sensing input leakage prevention node SQ1 and the first pull-up node PU1) in response to control of an invalid level signal at the clock control signal input terminal CLKA.

The first current limiting circuit 300 is connected to the first voltage control node OFF1, and is configured to reduce a charging/discharging current at the first voltage control node OFF1.

In the embodiment of the present disclosure, the first current limiting circuit 300 is disposed at the first voltage control node OFF1. When the level of the signal provided by the clock control signal input terminal CLKA is switched to cause the transient current to be generated at the first voltage control node OFF1, the charging/discharging current at the first voltage control node OFF1 can be effectively reduced based on the first current limiting circuit 300, so that the current peak value of the transient current generated at the first voltage control node OFF1 is reduced, which can effectively solve various problems caused by the excessive transient current.

It should be noted that the first current limiting circuit 300 in the embodiment of the present disclosure may be disposed between the first sensing input leakage prevention node SQ1 and the first voltage control node OFF1 as shown in FIG. 5A, or may not be disposed between the first sensing input leakage prevention node SQ1 and the first voltage control node OFF1 as shown in FIG. 5B. Alternatively, the first current limiting circuit 300 in the embodiment of the present disclosure may also be partially disposed between the first sensing input leakage prevention node SQ1 and the first voltage control node OFF1, and partially not disposed between the first sensing input leakage prevention node SQ1 and the first voltage control node OFF1, that is, both cases shown in FIG. 5A and FIG. 5B are included (not shown).

Figure 6A:
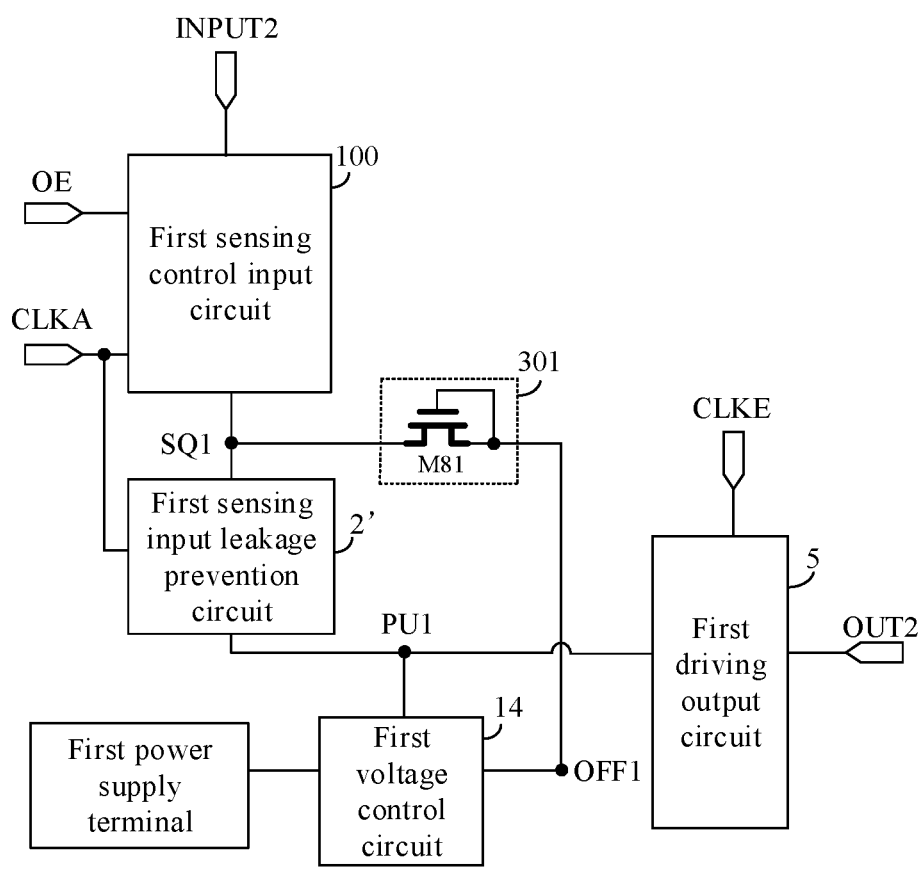
FIG. 6A and FIG. 6B are schematic diagrams of another two circuit structures of a shift register unit according to an embodiment of the present disclosure.
Figure 6B:
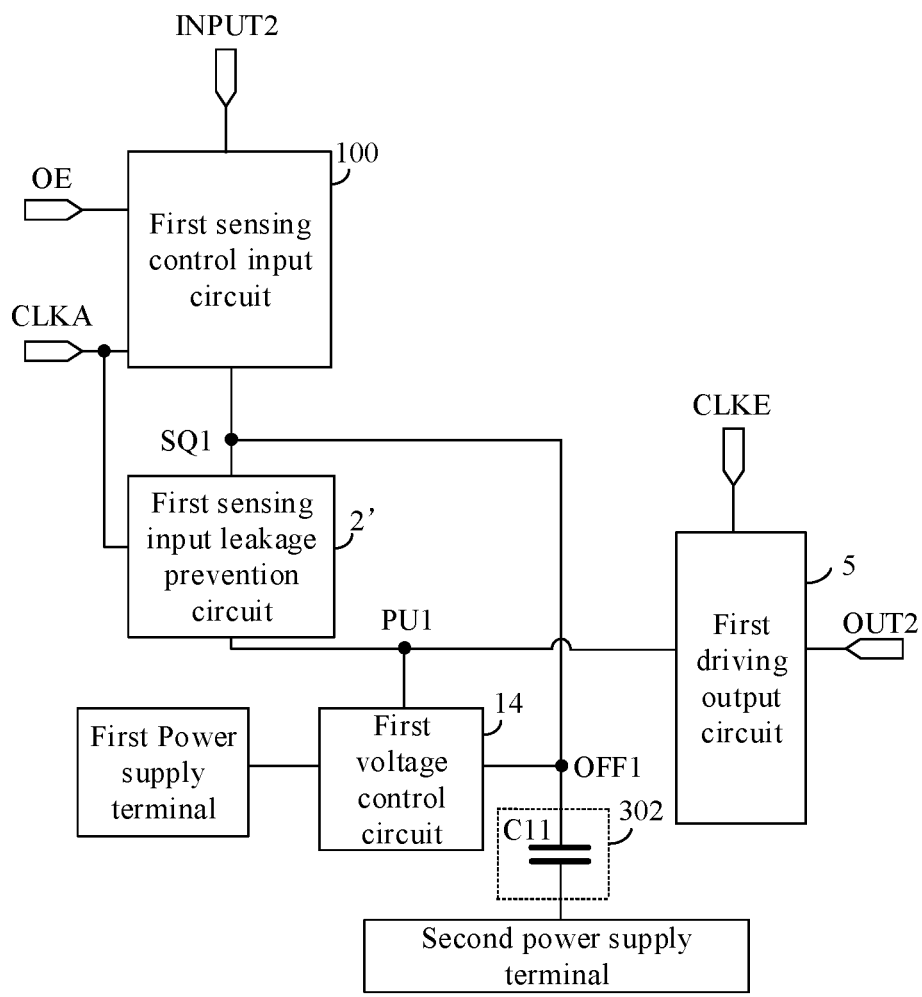

FIG. 6A and FIG. 6B are schematic diagrams of another two circuit structures of a shift register unit according to an embodiment of the present disclosure. Referring to FIG. 6A, in some embodiments, the first current limiting circuit 300 includes: a first load circuit 301; the first load circuit 301 is located between the first sensing input leakage prevention node SQ1 and the first control voltage node OFF1, and configured to increase a load resistance between the first sensing input leakage prevention node SQ1 and the first control voltage node OFF1.

In the embodiment of the present disclosure, the load resistance between the first sensing input leakage prevention node SQ1 and the first voltage control node OFF1 is increased by providing the first load circuit 301 between the first sensing input leakage prevention node SQ1 and the first voltage control node OFF1. By increasing the load resistance between the first sensing input leakage prevention node SQ1 and the first voltage control node OFF1, the transient current generated at the first voltage control node OFF1 can be reduced when the level of the signal provided by the clock control signal input terminal CLKA is switched.

The first load circuit 301 includes: an eighty-first transistor M81; a control electrode of the eighty-first transistor M81 is connected to the first voltage control node OFF1, a first electrode of the eighty-first transistor M81 is connected to the first sensing input leakage prevention node SQ1, and a second electrode of the eighty-first transistor M81 is connected to the first voltage control node OFF1. At this time, the eighty-first transistor M81 may be equivalent to a diode, which does not affect the writing of a valid level signal into the first sensing input leakage prevention node SQ1 by the first voltage control circuit 14, and can also act as a load resistor to limit the current.

Referring to FIG. 6B, in some embodiments, the first current limiting circuit 300 includes: a second load circuit 302 connected to the first voltage control node OFF1 and the second power supply terminal and configured to increase a load capacitance (a capacitance of a load capacitor) at the first voltage control node OFF1.

In the embodiment of the present disclosure, the load capacitance at the first voltage control node OFF1 is increased by providing the second load circuit 302 at the first voltage control node OFF1. By increasing the load capacitance at the first voltage control node OFF1, the transient current generated at the first voltage control node OFF1 can be reduced when the level of the signal provided at the clock control signal input terminal CLKA is switched; meanwhile, the load capacitor has a certain voltage stabilizing effect, so that the voltage drift at the first voltage control node OFF1 can be effectively reduced.

In some embodiments, the second load circuit 302 includes: an eleventh capacitor C11; a first terminal of the eleventh capacitor C11 is connected to the first voltage-control node OFF1, and a second terminal of the eleventh capacitor C11 is connected to the second power supply terminal.

Figure 7A:
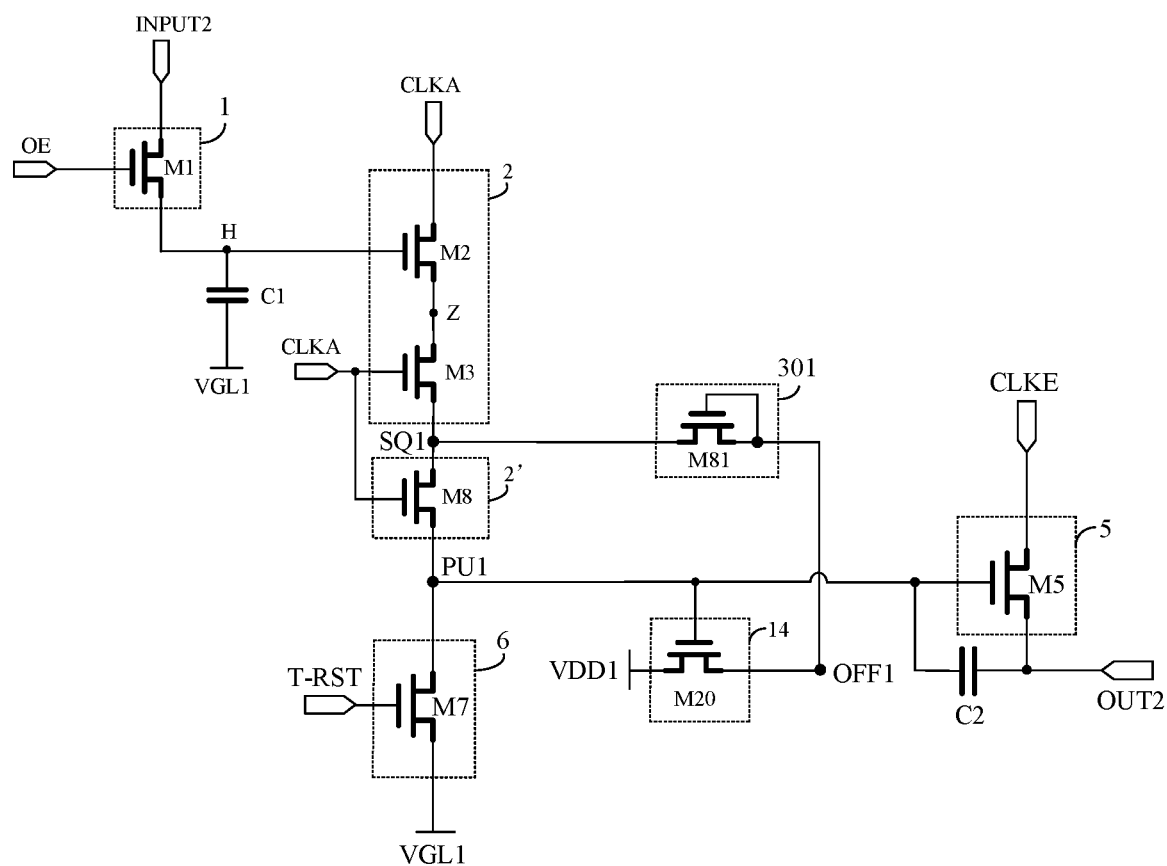
FIG. 7A and FIG. 7B are schematic diagrams of still another two circuit structures of a shift register unit according to an embodiment of the present disclosure.
Figure 7B:
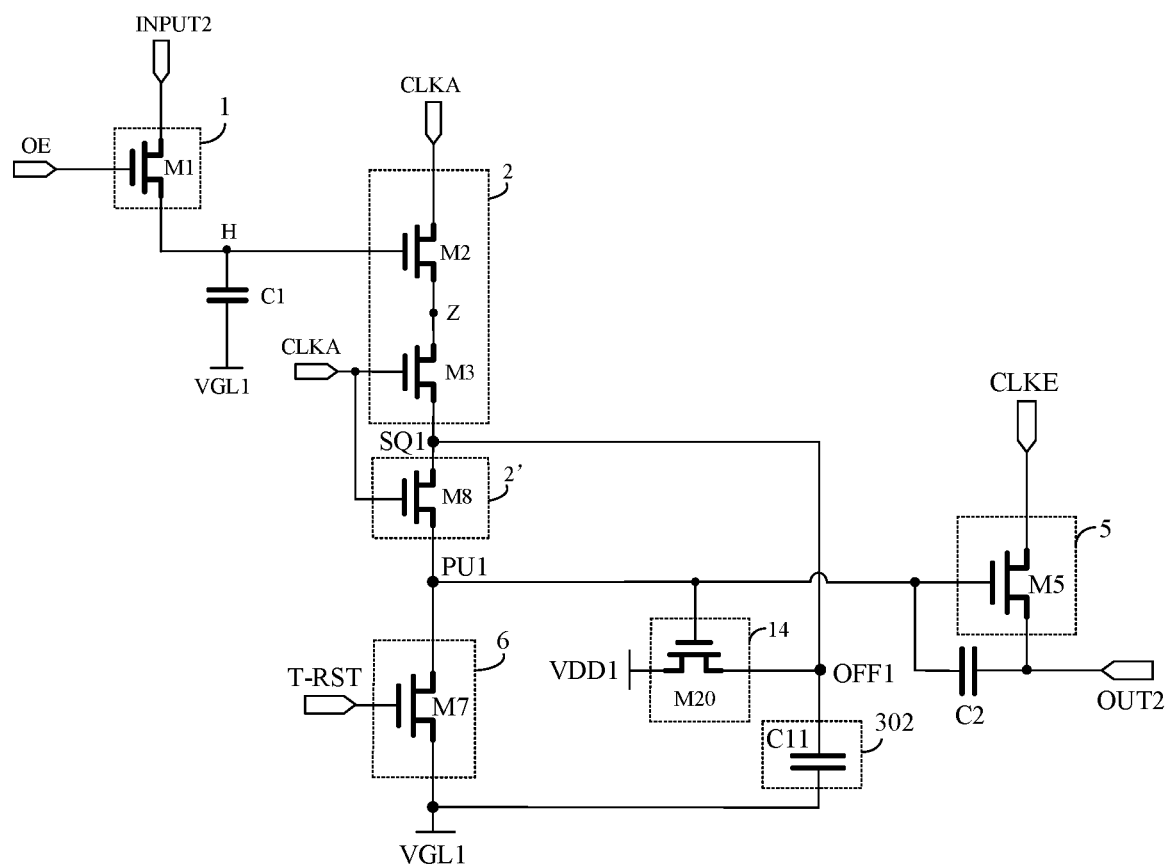

FIGS. 7A and 7B are schematic diagrams of still another two circuit structures of a shift register unit according to an embodiment of the present disclosure. As shown in FIGS. 7A and 7B, FIGS. 7A and 7B are a specific embodiment of the shift register based on FIGS. 6A and 6B. In some embodiments, the shift register further includes: a first global reset circuit 6.

The first global reset circuit 6 is connected to a global reset signal input terminal T-RST, the second power supply terminal (providing a low level voltage VGL1), and the first pull-up node PU1, and is configured to write an invalid level signal provided by the second power supply terminal to the first pull-up node PU1 in response to control of a valid level signal provided by the global reset signal input terminal T-RST.

In some embodiments, the first sensing control input circuit 100 includes: a sensing control circuit 1 and a first sensing input circuit 2; the sensing control circuit 1 is connected to the sensing control node H, the sensing signal input terminal INPUT2 and the random signal input terminal OE, and is configured to write a signal provided by the sensing signal input terminal INPUT2 to the sensing control node H in response to control of a valid level signal provided by the random signal input terminal OE; the first sensing input circuit 2 is connected to the sensing control node H, the clock control signal input terminal CLKA, a sensing intermediate node Z and the first pull-up node PU1, and configured to write a valid level signal to the sensing intermediate node Z in response to control of a valid level signal at the sensing control node H and to form a path between the sensing intermediate node Z and the first pull-up node PU1 in response to control of a valid level signal provided by the clock control signal input terminal CLKA.

In some embodiments, the sensing control circuit 1 includes a first transistor M1; a control electrode of the first transistor M1 is connected to the random signal input terminal, a first electrode of the first transistor M1 is connected to the sensing signal input terminal INPUT2, and a second electrode of the first transistor M1 is connected to the sensing control node H.

In some embodiments, the sensing control circuit 1 includes a first capacitor C1, a first terminal of the first capacitor C1 is connected to the sensing control node H, and a second terminal of the first capacitor C1 is connected to the second power supply terminal.

In some embodiments, the first sensing input circuit 2 includes a second transistor M2 and a third transistor M3; a control electrode of the second transistor M2 is connected to the sensing control node H, a first electrode of the second transistor M2 is connected to the clock control signal input terminal CLKA, and a second electrode of the second transistor M2 is connected to the sensing intermediate node Z. A control electrode of the third transistor M3 is connected to the clock control signal input terminal CLKA, a first electrode of the third transistor M3 is connected to the sensing intermediate node Z, and a second electrode of the third transistor M3 is connected to the first sensing input leakage prevention circuit.

In some embodiments, the first global reset circuit 6 includes a seventh transistor M7; a control electrode of the seventh transistor M7 is connected to the global reset signal input terminal T-RST, a first electrode of the seventh transistor M7 is connected to the first pull-up node PU1, and a second electrode of the seventh transistor M7 is connected to the second power supply terminal.

In some embodiments, the first driving output circuit 5 includes a fifth transistor M5; a control electrode of the fifth transistor M5 is connected to a first pull-up back node PUB1, a first electrode of the fifth transistor M5 is connected to the first driving clock signal input terminal CLKE, and a second electrode of the fifth transistor M5 is connected to the first driving signal output terminal OUT2.

In some embodiments, the first driving output circuit 5 includes a second capacitor C2, a first terminal of the second capacitor C2 is connected to the first pull-up node, and a second terminal of the second capacitor C2 is connected to the first driving signal output terminal OUT2.

In some embodiments, the first voltage control circuit 14 includes a twentieth transistor M20; a control electrode of the twentieth transistor M20 is connected to the first pull-up node PU1, a first electrode of the twentieth transistor M20 is connected to the first power supply terminal (providing a high level voltage VDD1), and a second electrode of the twentieth transistor M20 is connected to the first voltage control node OFF1.

In some embodiments, the first sensing input leakage prevention circuit 2' includes: an eighth transistor M8; a control electrode of the eighth transistor M8 is connected to the clock control signal input terminal CLKA, a first electrode of the eighth transistor M8 is connected to the first sensing input leakage prevention node SQ1, and a second electrode of the eighth transistor M8 is connected to the first pull-up node PUT.

FIG. 7A illustrates that the first current limiting circuit 300 includes the first load circuit 301 including the eighty-first transistor M81; FIG. 7B illustrates that the first current limiting circuit 300 includes the second load circuit 302 including the eleventh capacitor C11.

Figure 8:
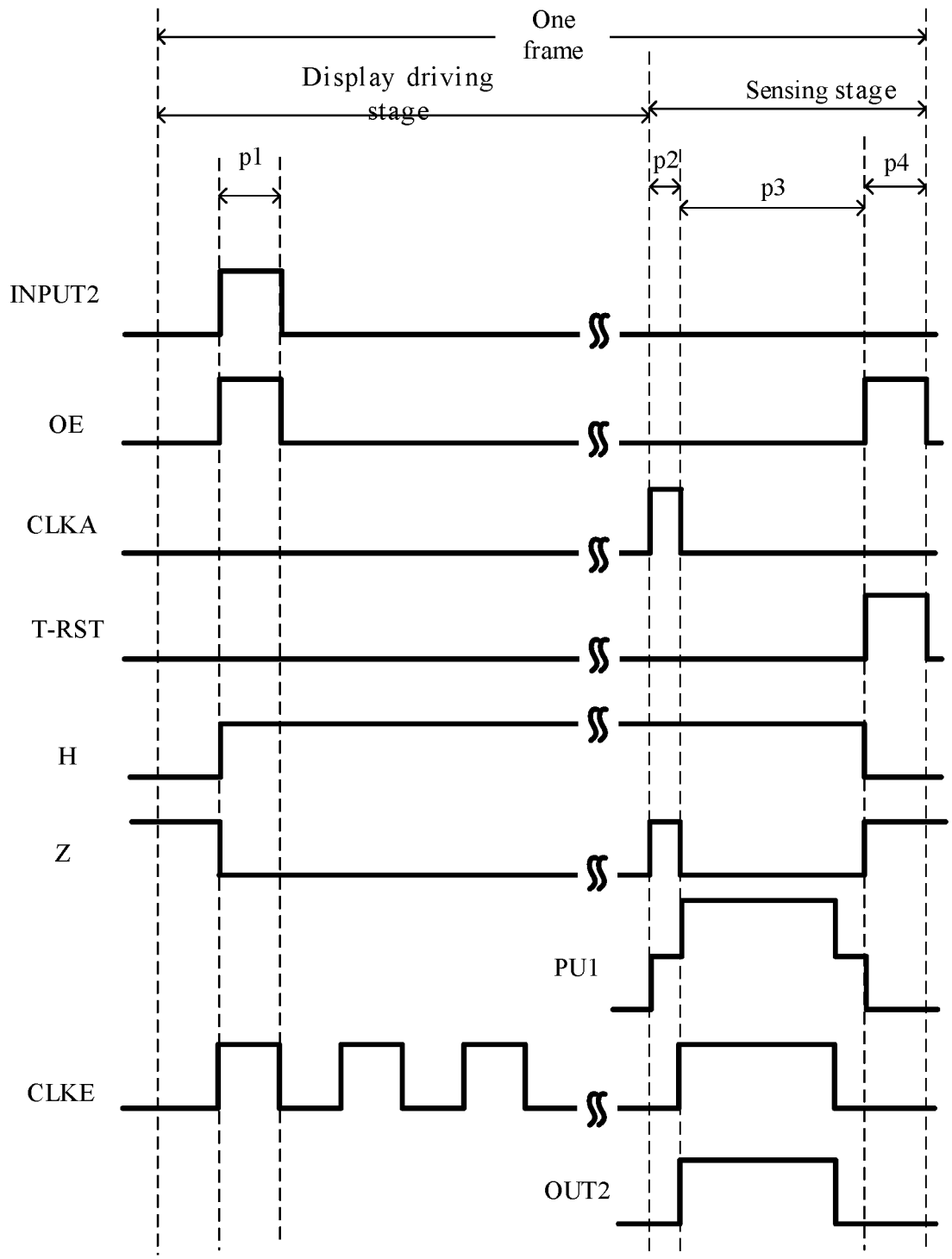
FIG. 8 is a timing diagram illustrating operation of the shift register unit shown in FIGS. 7A and 7B.

FIG. 8 is a timing diagram illustrating operation of the shift register unit shown in FIGS. 7A and 7B. As shown in FIG. 8, the operation of the shift register unit includes the following stages:

At stage p1, the sensing signal input terminal INPUT2 provides a high level signal, the random signal input terminal OE provides a high level signal, the clock control signal input terminal CLKA provides a low level signal, and the global reset signal input terminal T-RST provides a low level signal.

At this time, the first transistor M1 is turned on, and the high level signal provided by the sensing signal input terminal INPUT2 is written to the sensing control node H, and a voltage at the sensing control node H is in a high level state. Accordingly, the second transistor M2 is turned on, and the low level signal provided by the clock control signal input terminal CLKA is written to the sensing intermediate node Z through the second transistor M2, and a voltage at the sensing intermediate node Z is in a low level state.

The clock control signal input terminal CLKA provides the low level signal, so that both the third transistor M3 and the eighth transistor M8 are turned off. The global reset signal input terminal T-RST provides a low level signal, so that the seventh transistor M7 is turned off.

It should be noted that the stage p1 belongs to the display driving stage of one frame, and for the voltage applied to the first pull-up node PU1 and the first driving signal output terminal OUT2 in the display driving stage, reference can be made to the description in the following embodiments. Only the specific operation of the shift register unit in the sensing stage is described in detail in the embodiment.

At stage p2, the sensing signal input terminal INPUT2 provides a low level signal, the random signal input terminal OE provides a low level signal, the clock control signal input terminal CLKA provides a high level signal, and the global reset signal input terminal T-RST provides a low level signal.

The voltage at the sensing control node H is maintained to be at the high level state in the previous stage, so that the second transistor M2 is maintained to be turned on, and the high level signal provided by the clock control signal input terminal CLKA is written to the sensing intermediate node Z through the second transistor M2. And the third transistor M3 and the eighth transistor M8 are turned on by the high level signal provided by the clock control signal input terminal CLKA, so that the high level signal at the sensing intermediate node Z may be written to the first pull-up node PU1.

The first pull-up node PU1 is in a high level state, so that the fifth and twentieth transistors M5 and M20 are turned on. The fifth transistor M5 is turned on, so that the low level signal provided by the first driving clock signal input terminal CLKE is written to the first driving signal output terminal OUT2 through the fifth transistor M5, and the first driving signal output terminal OUT2 outputs a low level signal.

It should be noted that there is a time interval between the stage p1 and the stage p2. In order to ensure that the voltage at the sensing control node H remains stable in the time interval, the first capacitor C1 may be added at the sensing control node H.

In addition, in the process of switching the signal provided by the clock control signal input terminal CLKA from the low level to the high level at the beginning of the stage p2 and in the process of switching the signal provided by the clock control signal input terminal CLKA from the high level to the low level at the end of the stage p2, a parasitic capacitance between the gate electrode and the source/drain electrode in each of the third transistor M3 and the eighth transistor M8 may cause the transient current at the first voltage control node to be generated, but the transient current at the first voltage control node may not be too great due to the existence of the first current limiting circuit (e.g., the eighty-first transistor in FIG. 7A and the eleventh capacitor in FIG. 7B).

At stage p3, the sensing signal input terminal INPUT2 provides a low level signal, the random signal input terminal OE provides a low level signal, the clock control signal input terminal CLKA provides a low level signal, and the global reset signal input terminal T-RST provides a low level signal.

The clock control signal input terminal CLKA provides the low level signal, so that the third transistor M3 and the eighth transistor M8 are turned off. The second transistor M2 is maintained to be turned on, so that the low level signal provided by the clock control signal input terminal CLKA is written to the sensing intermediate node Z through the second transistor M2, and the sensing intermediate node Z is in the low level state. At this time, the first pull-up node PUT is maintained to be in the high level state in the previous stage, and the fifth transistor M5 and the twentieth transistor M20 is maintained to be turned on.

In this stage, the first driving clock signal input terminal CLKE provides the high level signal firstly and then provides the low level signal, the signal provided by the first driving clock signal input terminal CLKE is written to the first driving signal output terminal OUT2 through the fifth transistor M5, and the first driving signal output terminal OUT2 outputs a high level signal firstly and then outputs a low level signal. It should be noted that in the process of switching the signal output by the first driving signal output terminal OUT2 from the low level to the high level, under the bootstrap action of the second capacitor C2, the voltage at the first pull-up node PUT is pulled up to a higher level; in the process of switching the signal output by the first driving signal output terminal OUT2 from the high level to the low level, under the bootstrap action of the second capacitor C2, the voltage at the first pull-up node PUT is pulled down to the initial high level state.

At stage p4, the sensing signal input terminal INPUT2 provides a low level signal, the random signal input terminal OE provides a high level signal, the clock control signal input terminal CLKA provides a low level signal, and the global reset signal input terminal T-RST provides a high level signal.

The random signal input terminal OE provides the high level signal, so that the first transistor M1 is turned on, the low level signal provided by the sensing signal input terminal INPUT2 is written to the sensing control node H through the first transistor M1, the voltage at the sensing control node H is in a low level state, and the second transistor M2 is turned off. The clock control signal input terminal CLKA provides the low level signal, so that the third transistor M3 and the eighth transistor M8 are both turned off. At this time, the sensing intermediate node Z is in a floating state, and maintains the low level.

Meanwhile, the global reset signal input terminal T-RST provides the high level signal, so that the seventh transistor M7 is turned on, a low level voltage VGL1 provided by the second power supply terminal is written to the first pull-up node PUT through the seventh transistor M7, the first pull-up node PUT is in a low level state, both the fifth transistor M5 and the twentieth transistor are turned off, and the first driving signal output terminal OUT2 is maintained to be in the low level state in the previous stage, i.e., is maintained to output the low level signal.

Figure 9A:
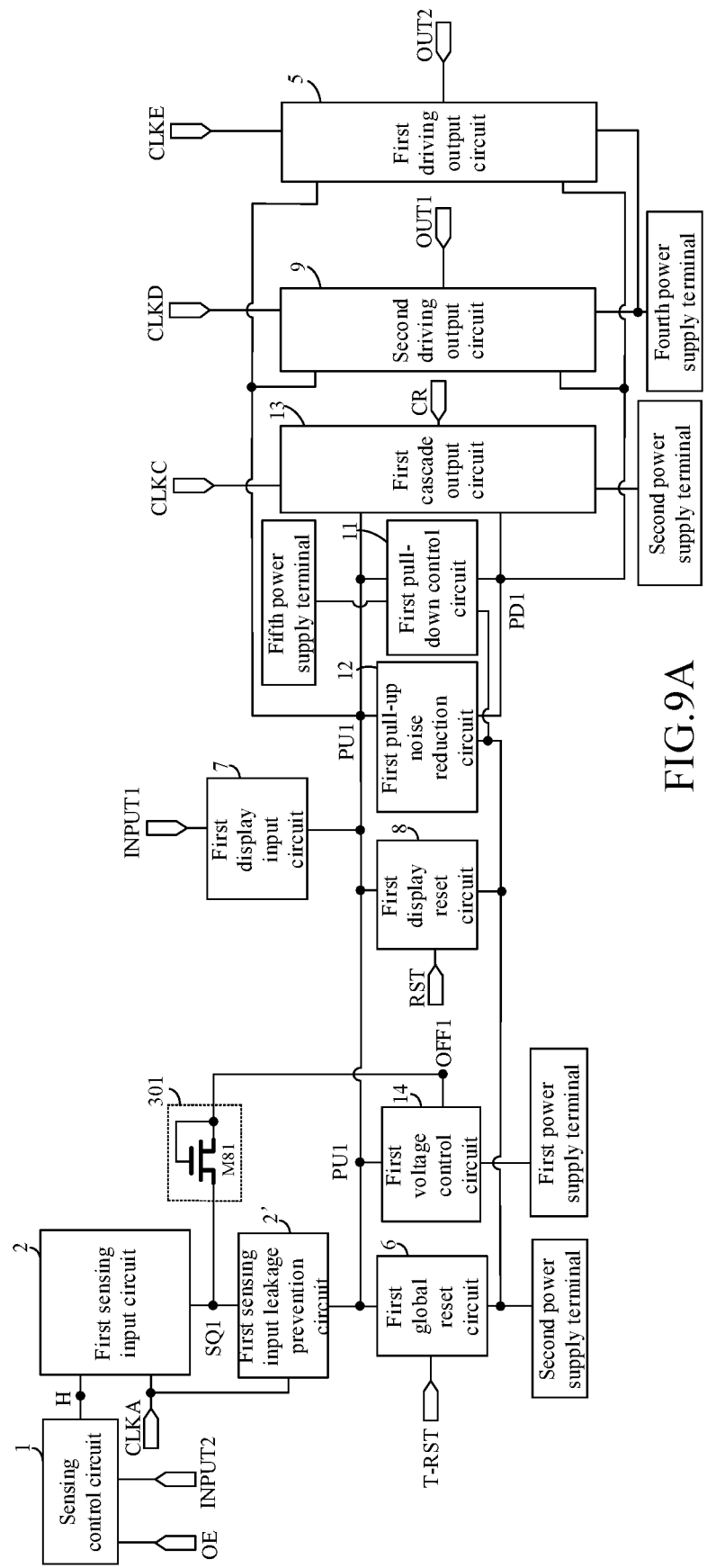
FIG. 9A and FIG. 9B are schematic diagrams of still another two circuit structures of a shift register unit according to an embodiment of the present disclosure.
Figure 9B:
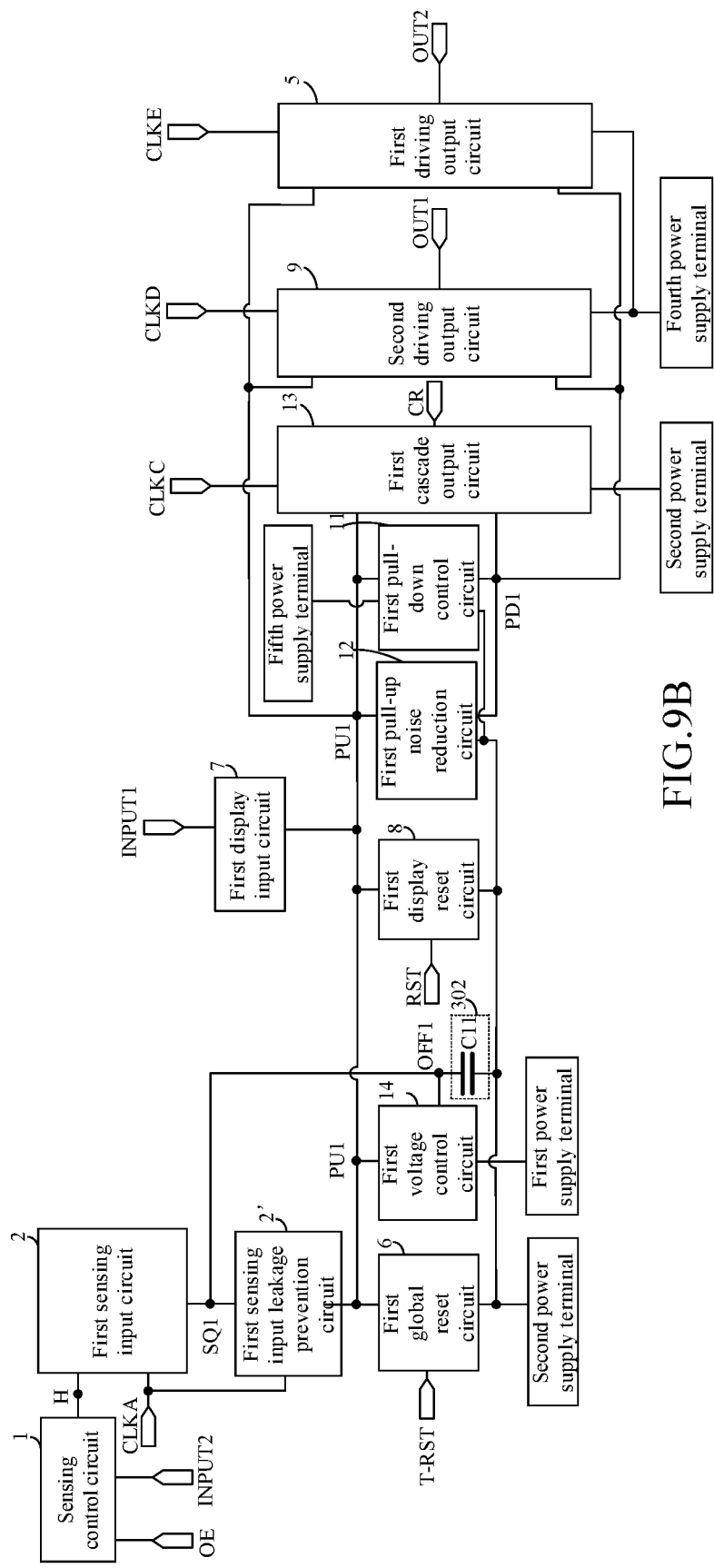

FIGS. 9A and 9B are schematic diagrams of still another two circuit structures of a shift register unit according to an embodiment of the present disclosure. As shown in FIGS. 9A and 9B, in some embodiments, the shift register unit further includes: a first display input circuit 7 and a first display reset circuit 8.

The first display input circuit 7 is connected to the display signal input terminal INPUT1 and the first pull-up node PUT, and configured to write a valid level signal provided by the display signal input terminal INPUT1 to the first pull-up node PU1 in response to control of the valid level signal provided by the display signal input terminal INPUT1.

The first display reset circuit 8 is connected to a display reset signal input terminal RST, the second power supply terminal, and the first pull-up node PUT, and is configured to write an invalid level signal provided by the second power supply terminal to the first pull-up node PU1 in response to control of a valid level signal provided by the display reset signal input terminal RST.

In some embodiments, the shift register unit further includes: a first pull-down control circuit 11 connected to the second power supply terminal, a fifth power supply terminal, the first pull-up node PUT and a first pull-down node PD1, and configured to write a voltage having a phase opposite to that of the voltage at the first pull-up node PUT to the first pull-down node PD1.

In some embodiments, the shift register unit further includes: a first pull-up noise reduction circuit 12 connected to the second power supply terminal, the first pull-up node PUT and the first pull-down node PD1, and configured to write an invalid level signal provided by the second power supply terminal to the first pull-up node PU1 in response to control of a valid level signal at the first pull-down node PD1, so as to reduce noise at the first pull-up node PUT.

At this time, the first driving output circuit 5 is further connected to the first pull-down node PD1 and a fourth power supply terminal, and is further configured to write an invalid level signal provided by the fourth power supply terminal to the first driving signal output terminal OUT2 in response to control of a valid level signal at the first pull-down node PD1.

In some embodiments, at least one first output circuit in the shift register unit includes not only the first driving output circuit 5, but also a second driving output circuit 9 and a first cascade output circuit 13.

The second driving output circuit 9 is connected to the first pull-up node PUT, the first pull-down node PD1, a second driving clock signal input terminal CLKD, the second driving signal output terminal OUT1 and the fourth power supply terminal, and is configured to write a signal provided by the second driving clock signal input terminal CLKD to the second driving signal output terminal OUT1 in response to control of a valid level signal at the first pull-up node PUT, and write an invalid level signal provided by the fourth power supply terminal OUT1 to the second driving signal output terminal OUT1 in response to control of a valid level signal at the first pull-down node PD1;

The first cascade output circuit 13 is connected to the first pull-up node PUT, the first pull-down node PD1, a first cascade clock signal input terminal CLKC, a first cascade signal output terminal CR, and the fourth power supply terminal, and configured to write a signal provided by the first cascade clock signal input terminal CLKC to the first cascade signal output terminal CR in response to control of a valid level signal at the first pull-up node PUT, and to write an invalid level signal provided by the second power supply terminal to the first cascade signal output terminal CR in response to control of a valid level signal at the first pull-down node PD1.

The shift register unit shown in FIGS. 9A and 9B has not only a sensing driving function of supplying a driving signal to the second gate line G2 in FIG. 1, but also a display driving function of supplying a driving signal to the first gate line G1 in FIG. 1. That is to say, the first gate line G1 and the second gate line G2 in the display panel may be driven by using the same gate driving circuit, so that the number of gate driving circuits configured on the display panel can be effectively reduced, and a narrow frame design of a product is facilitated.

Figure 10A:
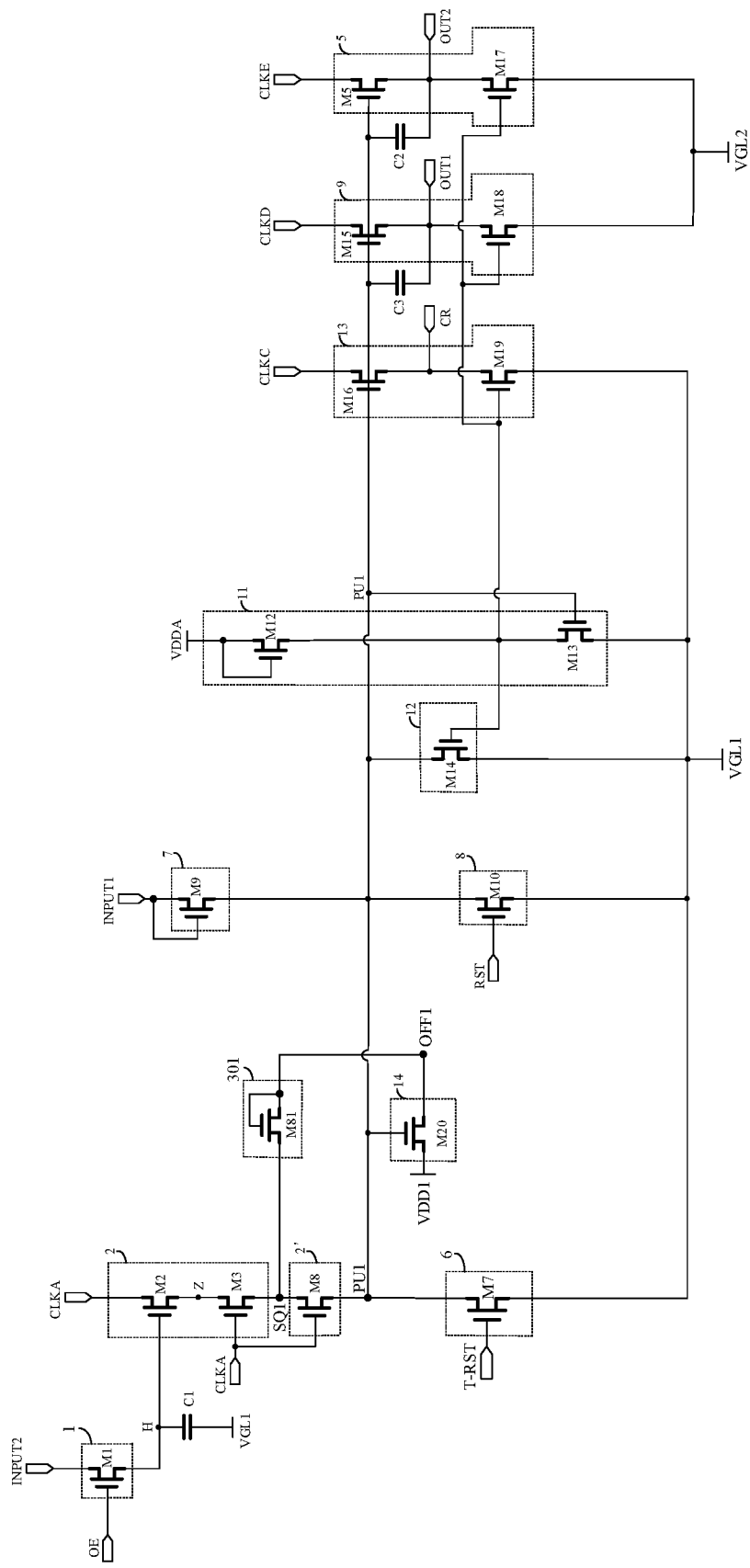
FIG. 10A and FIG. 10B are schematic diagrams of still another two circuit structures of a shift register unit according to an embodiment of the present disclosure.
Figure 10B:
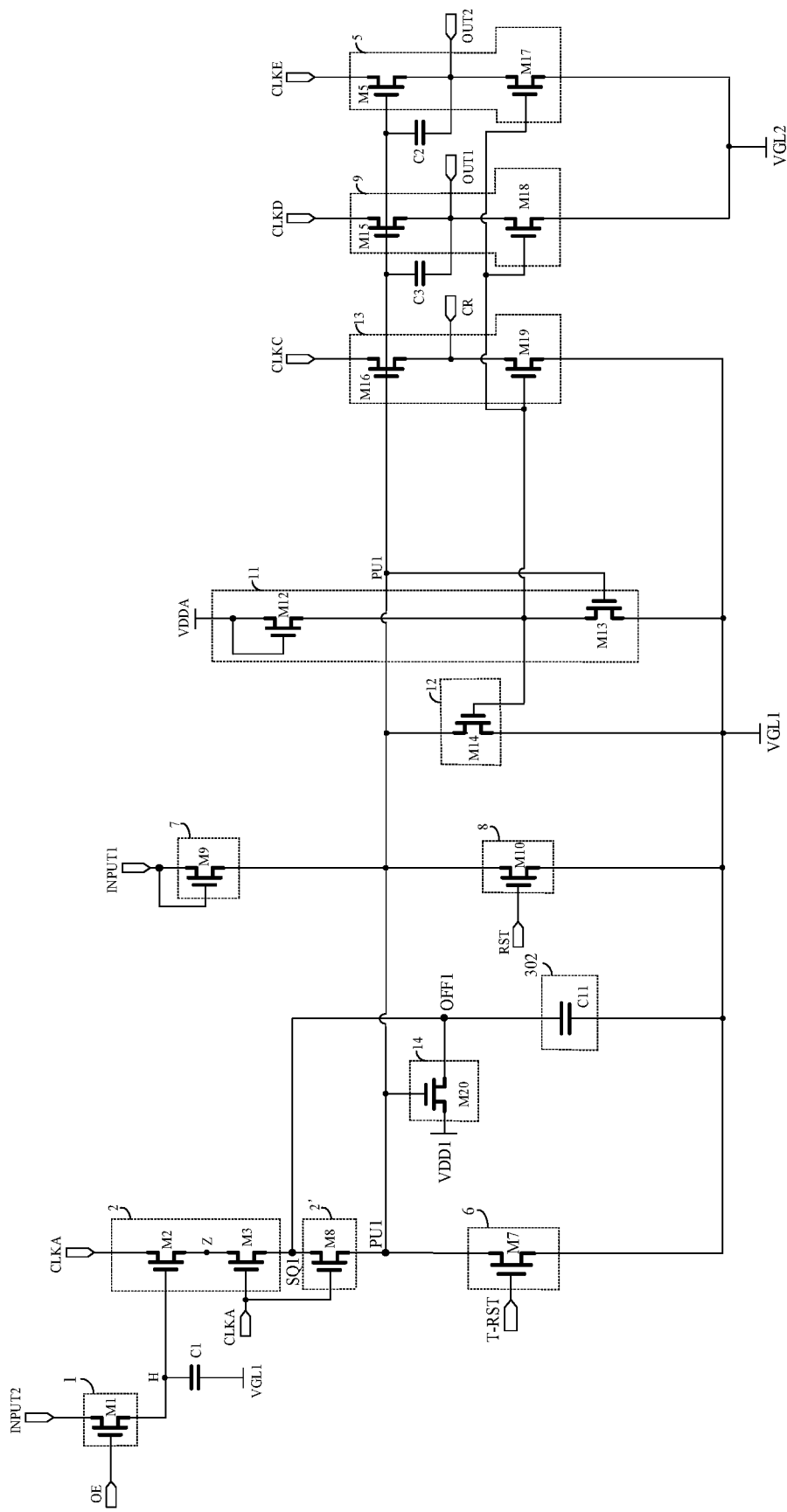

FIG. 10A and FIG. 10B are schematic diagrams of still another two circuit structures of a shift register unit according to an embodiment of the present disclosure. As shown in FIGS. 10A and 10B, the shift register unit shown in FIGS. 10A and 10B is a specific embodiment of the shift register unit shown in FIGS. 9A and 9B. The sensing control circuit 1, the first sensing input circuit 2, the first global reset circuit 6, the first voltage control circuit 14, and the first sensing input leakage prevention circuit 2' in FIGS. 10A and 10B may employ those shown in FIGS. 7A and 7B, as an example.

In some embodiments, the first display input circuit 7 includes a ninth transistor M9, the first display reset circuit 8 includes a tenth transistor M10, the first pull-down control circuit 11 includes a twelfth transistor M12 and a thirteenth transistor M13, the first pull-up noise reduction circuit 12 includes a fourteenth transistor M14, the first driving output circuit 5 includes a fifth transistor M5 and a seventeenth transistor M17, the second driving output circuit 9 includes a fifteenth transistor M15 and an eighteenth transistor M18, and the first cascade output circuit 13 includes a sixteenth transistor M16 and a nineteenth transistor M19.

A control electrode of the ninth transistor M9 is connected to the display signal input terminal INPUT1, a first electrode of the ninth transistor M9 is connected to the display signal input terminal INPUT1, and a second electrode of the ninth transistor M9 is connected to the first pull-up node PUT.

A control electrode of the tenth transistor M10 is connected to the display reset signal input terminal RST, a first electrode of the tenth transistor M10 is connected to the first pull-up node PUT, and a second electrode of the tenth transistor M10 is connected to the second power supply terminal.

A control electrode of the twelfth transistor M12 is connected to the fifth power supply terminal, a first electrode of the twelfth transistor M12 is connected to the fifth power supply terminal, and a second electrode of the twelfth transistor M12 is connected to the first pull-down node PD1.

A control electrode of the thirteenth transistor M13 is connected to the first pull-up node PUT, a first electrode of the thirteenth transistor M13 is connected to the first pull-down node PD1, and a second electrode of the thirteenth transistor M13 is connected to the second power supply terminal.

A control electrode of the fourteenth transistor M14 is connected to the first pull-down node PD1, a first electrode of the fourteenth transistor M14 is connected to the first pull-up node PUT, and a second electrode of the fourteenth transistor M14 is connected to the second power supply terminal.

A control electrode of the fifth transistor M5 is connected to the first pull-up node PUT, a first electrode of the fifth transistor M5 is connected to the first driving clock signal input terminal CLKE, and a second electrode of the fifth transistor M5 is connected to the first driving signal output terminal OUT2.

A control electrode of the seventeenth transistor M17 is connected to the first pull-down node PD1, a first electrode of the seventeenth transistor M17 is connected to the first driving signal output terminal OUT2, and a second electrode of the seventeenth transistor M17 is connected to the fourth power supply terminal.

A control electrode of the fifteenth transistor M15 is connected to the first pull-up node PU1, a first electrode of the fifteenth transistor M15 is connected to the second driving clock signal input terminal CLKD, and a second electrode of the fifteenth transistor M15 is connected to the second driving signal output terminal OUT1.

A control electrode of the eighteenth transistor M18 is connected to the first pull-down node PD1, a first electrode of the eighteenth transistor M18 is connected to the second driving signal output terminal OUT1, and a second electrode of the eighteenth transistor M18 is connected to the fourth power supply terminal.

A control electrode of the sixteenth transistor M16 is connected to the first pull-up node PU1, a first electrode of the sixteenth transistor M16 is connected to a cascade driving clock signal input terminal, and a second electrode of the sixteenth transistor M16 is connected to the first cascade signal output terminal CR.

A control electrode of the nineteenth transistor M19 is connected to the first pull-down node PD1, a first electrode of the nineteenth transistor M19 is connected to the first cascade signal output terminal CR, and a second electrode of the nineteenth transistor M19 is connected to the fourth power supply terminal.

In some embodiments, the first and second driving output circuits 5 and 6 include second and third capacitors C2 and C3, respectively.

In some embodiments, the first power supply terminal provides a high level voltage VDD1, the second power supply terminal provides a low level voltage VGL1, the fourth power supply terminal provides a low level voltage VGL2, and the fifth power supply terminal provides a high level voltage VDDA.

Figure 11:
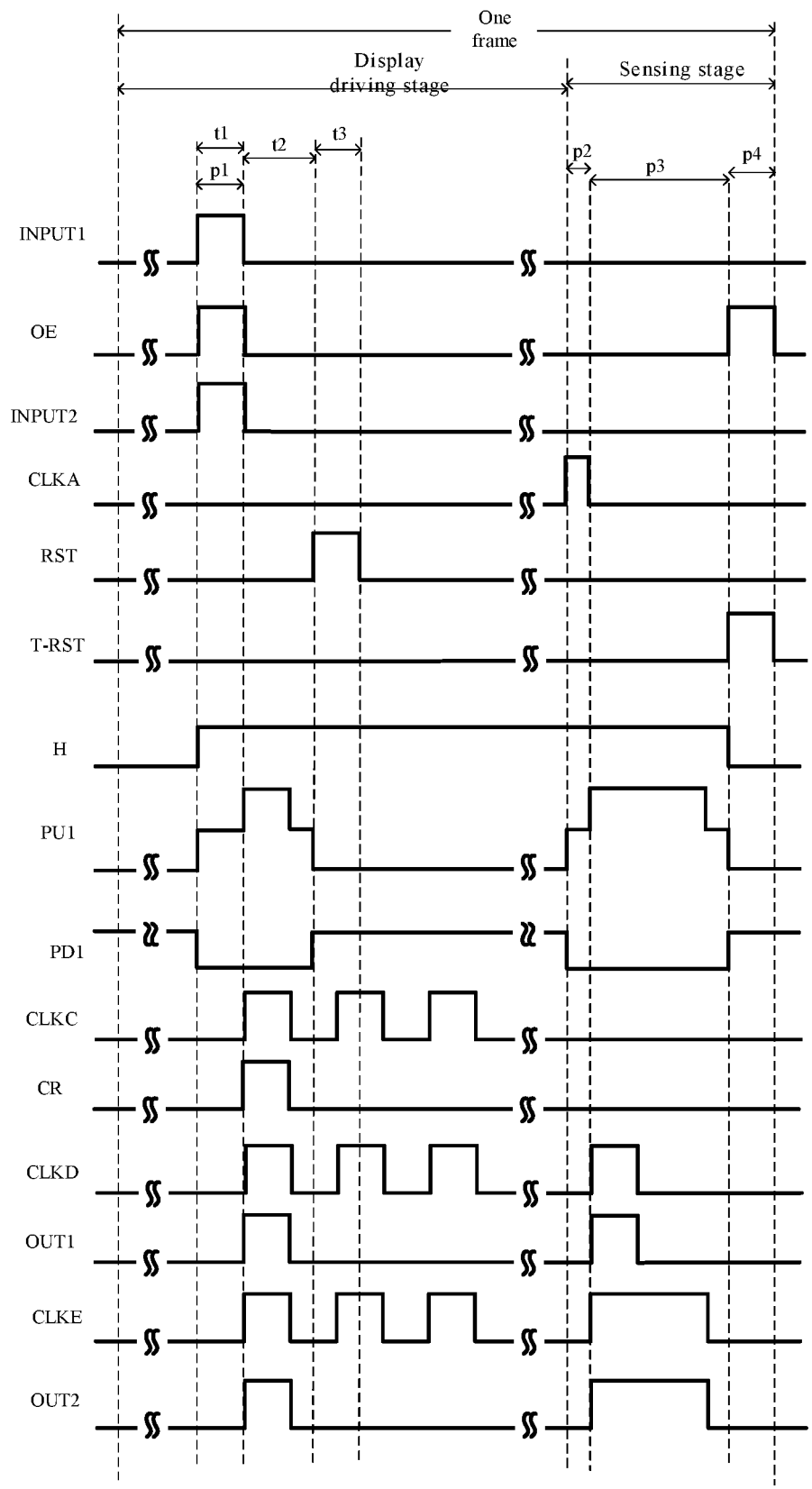
FIG. 11 is a timing diagram illustrating operation of the shift register unit shown in FIGS. 10A and 10B.

FIG. 11 is a timing diagram illustrating operation of the shift register unit shown in FIGS. 10A and 10B. As shown in FIG. 11, the operation of the shift register unit includes: a display driving process and a sensing driving process.

The display driving procedure includes: a display input stage t1, a display output stage t2 and a display reset stage t3; the sensing driving process includes: a sensing preparation stage p1, a sensing input stage p2, a sensing output stage p3, and a global reset stage p4.

In the display input stage t1, the display signal input terminal INPUT1 provides a high level signal, the ninth transistor M9 is turned on, the high level voltage VDD1 provided by the first power supply terminal is written to the first pull-up node PU1 through the ninth transistor M9, the first pull-up node PU1 is in a high level state, and accordingly, the fifth transistor M5, the fifteenth transistor M15 and the sixteenth transistor M16 are all turned on.

When the first pull-up node PUT is in a high level state, the thirteenth transistor M13 is turned on, the low level voltage VGL1 provided by the second power supply terminal is written to the first pull-down node PD1 through the thirteenth transistor M13, the first pull-down node PD1 is in a low level state, and all of the seventeenth transistor M17, the eighteenth transistor M18, and the nineteenth transistor M19 are in an off state.

At this time, the first driving clock signal input terminal CLKE writes a low level signal to the first driving signal output terminal OUT2 through the fifth transistor M5; the second driving clock signal input terminal CLKD writes a low level signal to the second driving signal output terminal OUT1 through the fifteenth transistor M15; the first cascade clock signal input terminal CLKC writes a low level signal to the first cascade signal output terminal CR through the sixteenth transistor M16. That is, the first driving signal output terminal OUT2, the second driving signal output terminal OUT1, and the first cascade signal output terminal CR all output a low level signal.

In the display output stage t2, the display signal input terminal INPUT1 provides the low level signal, the ninth transistor M9 is turned off, and the first pull-up node PUT is in a floating state and maintains a high level in the previous stage; the fifth transistor M5, the fifteenth transistor M15, and the sixteenth transistor M16 are all maintained to be turned on.

At the initial time of the display output stage t2, the signal provided by the first driving clock signal input terminal CLKE changes from a low level signal to a high level signal, the voltage at the first pull-up node PUT is pulled up to a higher level under the bootstrap action of the second capacitor C2, and the first driving signal output terminal OUT2 outputs a high level signal. After a period of time has elapsed since the display output stage t2, the signal provided by the first driving clock signal input terminal CLKE changes from a high level signal to a low level signal, the voltage at the first pull-up node PUT is pulled down to the initial high level voltage under the bootstrap action of the second capacitor C2, the fifth transistor M5 is maintained to be turned on, and the first driving signal output terminal OUT2 outputs a low level signal.

Similarly, in the whole display output stage t2, the second driving signal output terminal OUT1 and the first cascade signal output terminal CR both output a high level signal firstly and then output a low level signal.

In the display reset stage t3, the display reset signal input terminal RST provides the high level signal, the tenth transistor M10 is turned on, the low level signal provided by the second power supply terminal is written to the first pull-up node PUT through the tenth transistor M10, the first pull-up node PU1 is in a low level state, and the fifth transistor M5, the fifteenth transistor M15 and the sixteenth transistor M16 are all turned off.

At this time, the thirteenth transistor M13 is also turned off, the high level voltage VDDA provided by the fifth power supply terminal is written to the first pull-down node PD1 through the twelfth transistor M12, the first pull-down node PD1 is in a high level state, and the seventeenth transistor M17, the eighteenth transistor M18, and the nineteenth transistor M19 are all turned on.

At this time, the fourth power supply terminal writes the low level signal to the first driving signal output terminal OUT2 through the seventeenth transistor M17; the fourth power supply terminal writes the low level signal to the second driving signal output terminal OUT1 through the eighteenth transistor M18; the second power supply terminal writes the low level signal to the first cascade signal output terminal CR through the nineteenth transistor M19. That is, the first driving signal output terminal OUT2, the second driving signal output terminal OUT1, and the first cascade signal output terminal CR all output low level signals.

In addition, since the first pull-down node PD1 is in a high level state, the fourteenth transistor M14 is also turned on, and the low level voltage VGL1 provided by the second power supply terminal is written to the first pull-up node PUT through the fourteenth transistor M14 to reduce noise at the first pull-up node PUT.

In the sensing preparation stage p1, the sensing signal input terminal INPUT2 and the random signal input terminal OE both provide the high level signal, and the first transistor M1 is turned on; the high level signal provided by the sensing signal input terminal INPUT2 is written to the sensing control node H through the first transistor M1 to charge the sensing control node H, and a voltage at the sensing control node H is in a high level state. Accordingly, the second transistor M2 is turned on. However, the clock control signal input terminal CLKA provides the low level signal, so that both the third transistor M3 and the eighth transistor M8 are turned off, and thus, the clock control signal input terminal CLKA is disconnected from the first pull-up node PUT.

In the sensing input stage p2, the clock control signal input terminal CLKA provides the high level signal, so that the third transistor M3 and the eighth transistor M8 are both turned on. At this time, the second transistor M2 is is maintained to be turned on by the voltage at the sensing control node H in the high level state, the high level signal provided by the clock control signal input terminal CLKA may be written to the first pull-up node PUT through the second transistor M2, the third transistor M3 and the eighth transistor M8. That is, the voltage at the first pull-up node PUT is in the high level state.

Accordingly, the twentieth transistor M20, the fifth transistor M5, the fifteenth transistor M15, and the sixteenth transistor M16 are all turned on.

When the first pull-up node PUT is in a high level state, the thirteenth transistor M13 is turned on, the low level voltage VGL1 provided by the second power supply terminal is written to the first pull-down node PD1 through the thirteenth transistor M13, the first pull-down node PD1 is in a low level state, and all of the seventeenth transistor M17, the eighteenth transistor M18, and the nineteenth transistor M19 are in an off state.

At this time, the first driving clock signal input terminal CLKE writes the low level signal to the first driving signal output terminal OUT2 through the fifth transistor M5; the second driving clock signal input terminal CLKD writes the low level signal to the second driving signal output terminal OUT1 through the fifteenth transistor M15; the first cascade clock signal input terminal CLKC writes the low level signal to the first cascade signal output terminal CR through the sixteenth transistor M16. That is, the first driving signal output terminal OUT2, the second driving signal output terminal OUT1, and the first cascade signal output terminal CR all output low level signals.

In the sensing output stage p3, the clock control signal input terminal CLKA provides the low level signal, so that the third transistor M3 is turned off, and the clock control signal input terminal CLKA is disconnected from the first pull-up node PUT again. The first pull-up node PUT is in a floating state and maintains the high level in the previous stage; the fifth transistor M5, the fifteenth transistor M15, and the sixteenth transistor M16 are all maintained to be turned on.

At the initial time of the sensing output stage p3, the signal provided by the first driving clock signal input terminal CLKE changes from a low level signal to a high level signal, the voltage at the first pull-up node PUT is pulled up to a higher level under the bootstrap action of the second capacitor C2, and the first driving signal output terminal OUT2 outputs a high level signal. After a period of time has elapsed since the display output stage t2, the signal provided by the first driving clock signal input terminal CLKE changes from a high level signal to a low level signal, the voltage at the first pull-up node PUT is pulled down to the initial high level voltage under the bootstrap action of the second capacitor, the fifth transistor M5 is maintained to be turned on, and the first driving signal output terminal OUT2 outputs a low level signal.

Similarly, the first driving clock signal input terminal CLKE provides the high level signal firstly and then provides the low level signal in the whole sensing output stage p3, so that the second driving signal output terminal OUT1 outputs the high level signal firstly and then outputs the low level signal in the whole sensing output stage p3. The first cascade signal output terminal CR provides the low level signal in the whole sensing output stage p3, so that the first cascade signal output terminal CR always outputs a low level signal in the whole sensing output stage p3.

In the global reset stage p4, the global reset signal input terminal T-RST provides the high level signal, the seventh transistor M7 is turned on, and the low level voltage VGL1 provided by the second power supply terminal is written to the first pull-up node PUT through the seventh transistor M7, to reset the first pull-up node PUT.

When the first pull-up node PUT is in a low level state, the high level voltage VDDA provided by the fifth power supply terminal is written to the first pull-down node PD1 through the twelfth transistor M12, the first pull-down node PD1 is in a high level state, and the seventeenth transistor M17, the eighteenth transistor M18, and the nineteenth transistor M19 are all turned on.

In the embodiment of the present disclosure, the period in which the sensing signal input terminal INPUT2 and the random signal input terminal OE simultaneously provide a valid level signal is the sensing preparation stage p1; the overlapping of the sensing preparation stage p1 and the display input stage t1 in FIG. 11 is only an alternative embodiment in the present disclosure, and the sensing signal input terminal INPUT2 and the display signal input terminal INPUT1 may be the same signal input terminal, which is only an alternative embodiment in the present disclosure and cannot limit the scope of the technical solution of the present disclosure. In the embodiment of the present disclosure, the sensing preparation stage p1 may also be before the display input stage t1, or after the display input stage t2, as long as it is ensured that the sensing preparation stage p1 is before the sensing input stage p2.

FIG. 12A to 12D are schematic diagrams of still another four circuit structures of a shift register unit according to an embodiment of the present disclosure. As shown in FIGS. 12A to 12D, in some embodiments, the shift register unit includes not only the first global reset circuit 6 but also a first leakage prevention circuit 15.

The first global reset circuit 6 is connected to the second power supply terminal through the first leakage prevention circuit 15; the first global reset circuit 6 is connected to the first leakage prevention circuit 15 at a first leakage prevention node Q1 connected to the first voltage control node OFF1; the first leakage prevention circuit 15 is connected to the global reset signal input terminal T-RST and is configured to form a path between the first leakage prevention node Q1 and the second power supply terminal in response to control of a valid level signal provided by the global reset signal input terminal T-RST, and to disconnect the first leakage prevention node Q1 from the second power supply terminal in response to control of an invalid level signal provided by the global reset signal input terminal T-RST.

Similar to the clock control signal input terminal CLKA, when the level of the signal provided by the global reset signal input terminal T-RST is switched, for example, from a high level to a low level, or from a low level to a high level, an excessive transient current is generated between the first leakage prevention node Q1 and the first voltage control node OFF1.

Figure 12A:
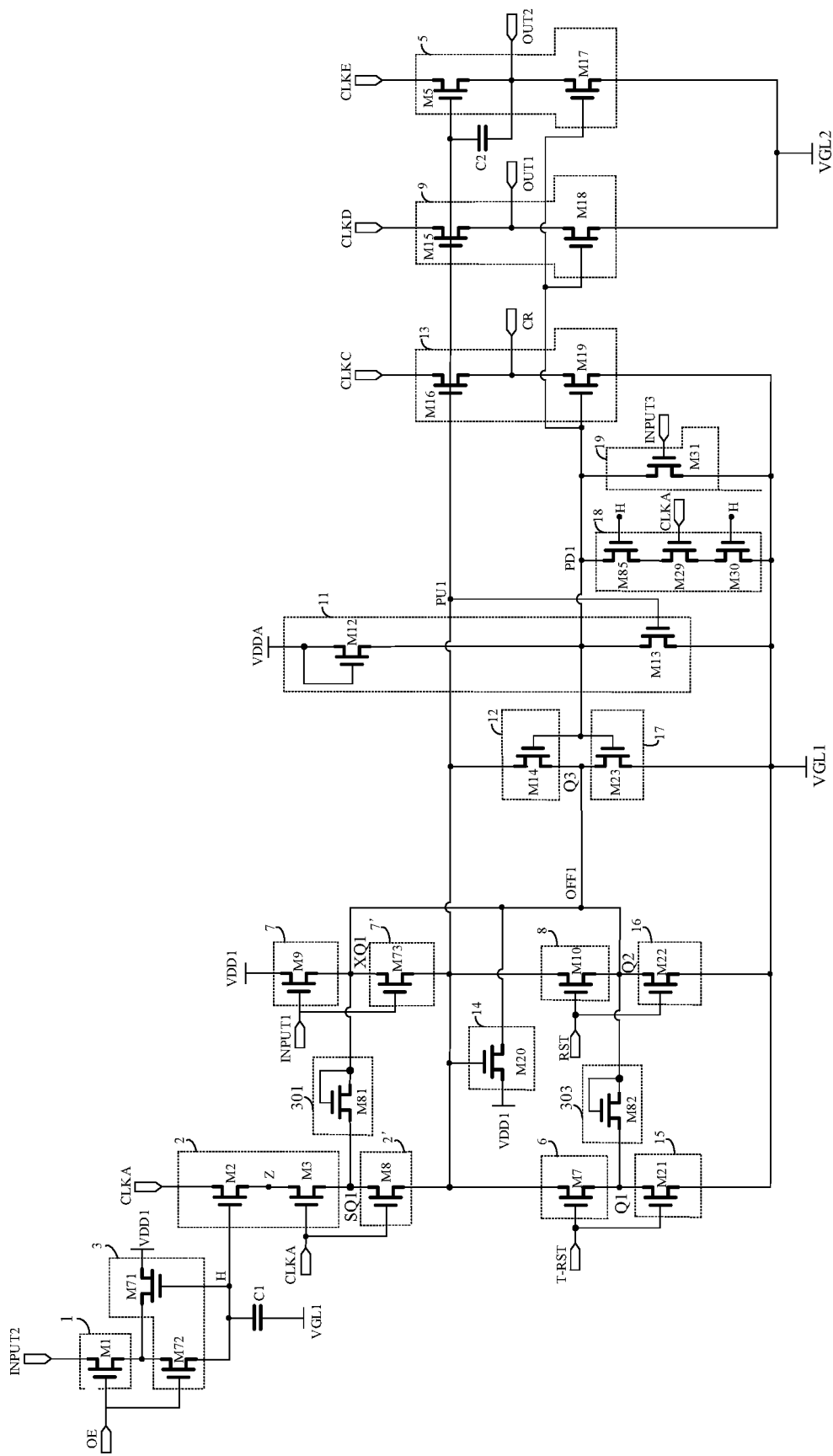
FIG. 12A to 12D are schematic diagrams of still another four circuit structures of a shift register unit according to an embodiment of the present disclosure.
Figure 12B:
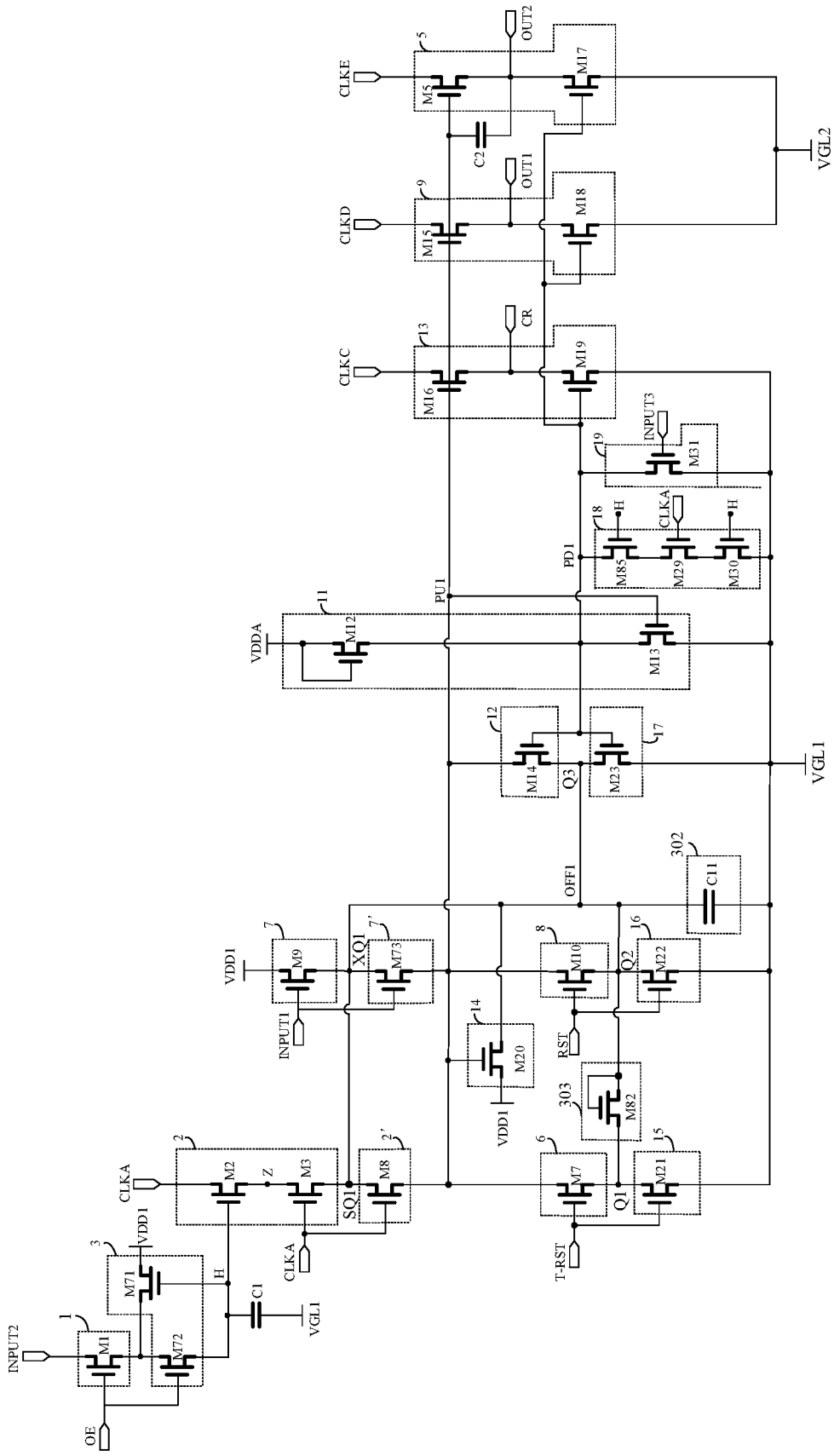

Referring to FIGS. 12A and 12B, in order to effectively improve the problem that the excessive transient current is generated at the first voltage control node OFF1 due to the switching of the level of the signal provided by the global reset signal input terminal T-RST, in some embodiments, the first current limiting circuit 300 includes: a third load circuit 303 located between the first leakage prevention node Q1 and the first voltage control node OFF1, and configured to increase a load resistance between the first leakage prevention node Q1 and the first voltage control node OFF1.

In some embodiments, the third load circuit 303 includes: an eighty-second transistor M82; a control electrode of the eighty-second transistor M82 is connected to the first voltage control node OFF1, a first electrode of the eighty-second transistor M82 is connected to the first leakage prevention node Q1, and a second electrode of the eighty-second transistor M82 is connected to the first voltage control node OFF1. At this time, the eighty-second transistor M82 may be equivalent to a diode, which does not affect the writing of the valid level signal into the first leakage prevention node Q1 by the first voltage control circuit 14, and can also act as a load resistor to limit the current.

In some embodiments, the shift register unit includes not only the first pull-up noise reduction circuit 12 but also a third leakage prevention circuit 17. The first pull-up noise reduction circuit 12 is connected to the second power supply terminal through the third leakage prevention circuit 17; the first pull-up noise reduction circuit 12 is connected to the third leakage prevention circuit 17 at a third leakage prevention node Q3 connected to the first voltage control node OFF1; the third leakage prevention circuit 17 is connected to the first pull-down node PD1, and is configured to form a path between the third leakage prevention node Q3 and the second power supply terminal in response to control of a valid level signal at the first pull-down node PD1, and to disconnect the third leakage prevention node Q3 from the second power supply terminal in response to control of an invalid level signal at the first pull-down node PD1.

It is found through research that when the third leakage prevention circuit 17 is provided, the first voltage control node is connected to the third leakage prevention node Q3. When the transient current is generated at the first voltage control node OFF1, if the path is formed between the third leakage prevention node Q3 and the second power supply terminal, the transient current generated at the first voltage control node OFF1 will flow to the second power supply terminal through the third leakage prevention node Q3 and the third leakage prevention circuit 17; if the third leakage prevention node Q3 is disconnected from the second power supply terminal, the transient current generated at the first voltage control node OFF1 will cause a leakage current generated at the third leakage prevention circuit 17 and flowing to the second power supply terminal. That is, when the third leakage prevention circuit 17 is provided in the shift register unit, if the transient current is generated at the first voltage control node OFF1, a transient current is also generated between the third leakage prevention circuit 17 and the second power supply terminal.

The clock control signal input terminal CLKA and the global reset signal input terminal T-RST are global signal input terminals, that is, all the shift register units in the gate driving circuit are connected to the same clock control signal input terminal CLKA and the same global reset signal input terminal T-RST, so that when the level of the signal provided by the clock control signal input terminal CLKA or the global reset signal input terminal T-RST is switched, transient currents in the same direction may be simultaneously generated at the first voltage control nodes OFF1 in all the shift register units in the gate driving circuit, and correspondingly, transient currents in the same direction may be simultaneously generated between the third leakage prevention circuit 17 and the second power supply terminal in each of all the shift register units. All of the transient currents may be finally superposed on the second power supply terminal or a certain signal transmission line connected to the second power supply terminal, resulting in an extreme transient current on the second power supply terminal or the certain signal transmission line connected to the second supply terminal. For example, a current peak value of the transient current between each shift register unit and the second power supply terminal is about I, and when M stages of shift register units are included in the gate driving circuit, the current peak value of the transient current at the second power supply terminal is about M×I, which is very likely to cause damage to the electrical devices connected to the second power supply terminal (for example, the signal transmission lines connected to the second power supply terminal are burned out by an excessive loading current).

Figure 12C:
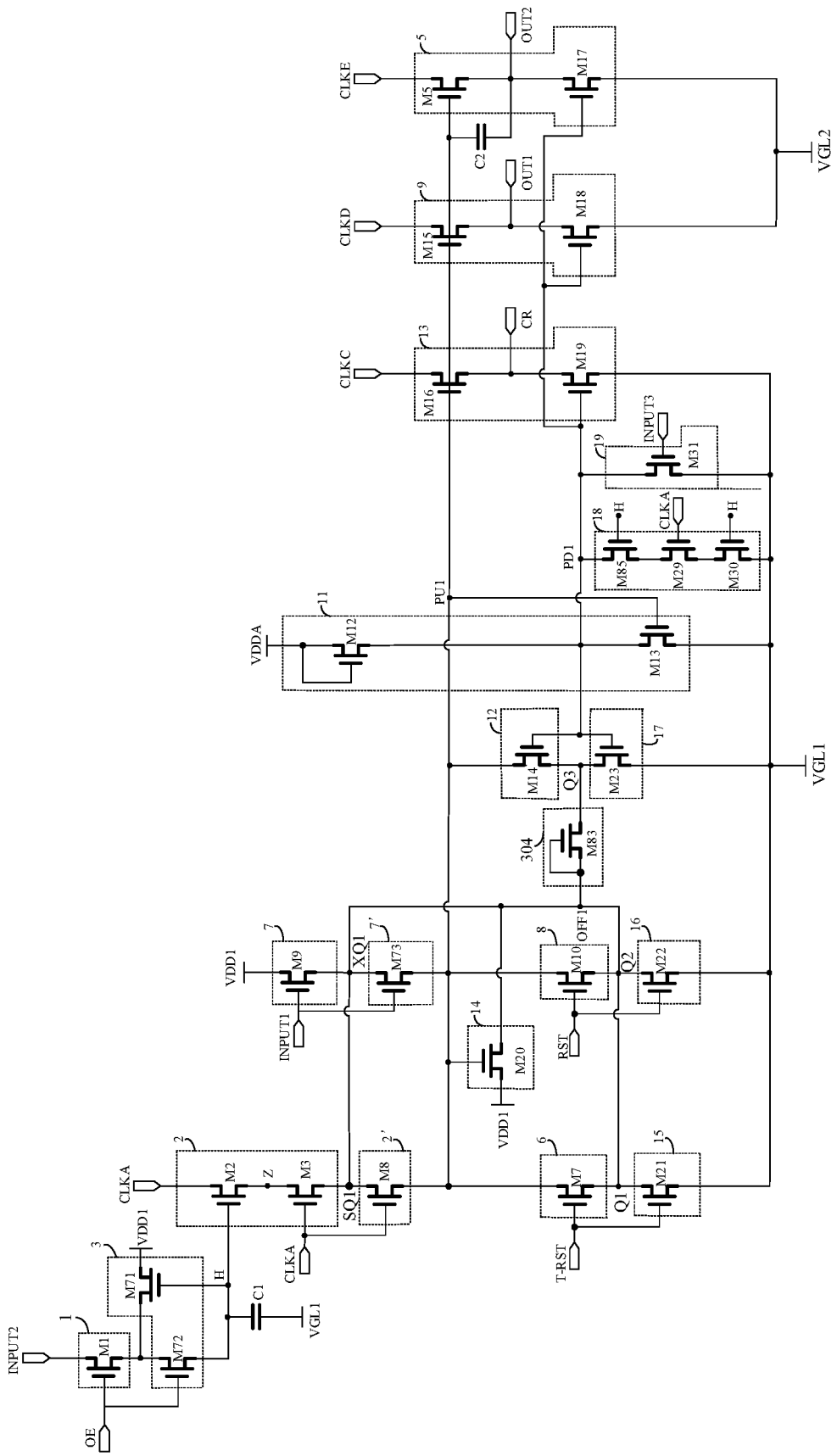
Figure 12D:
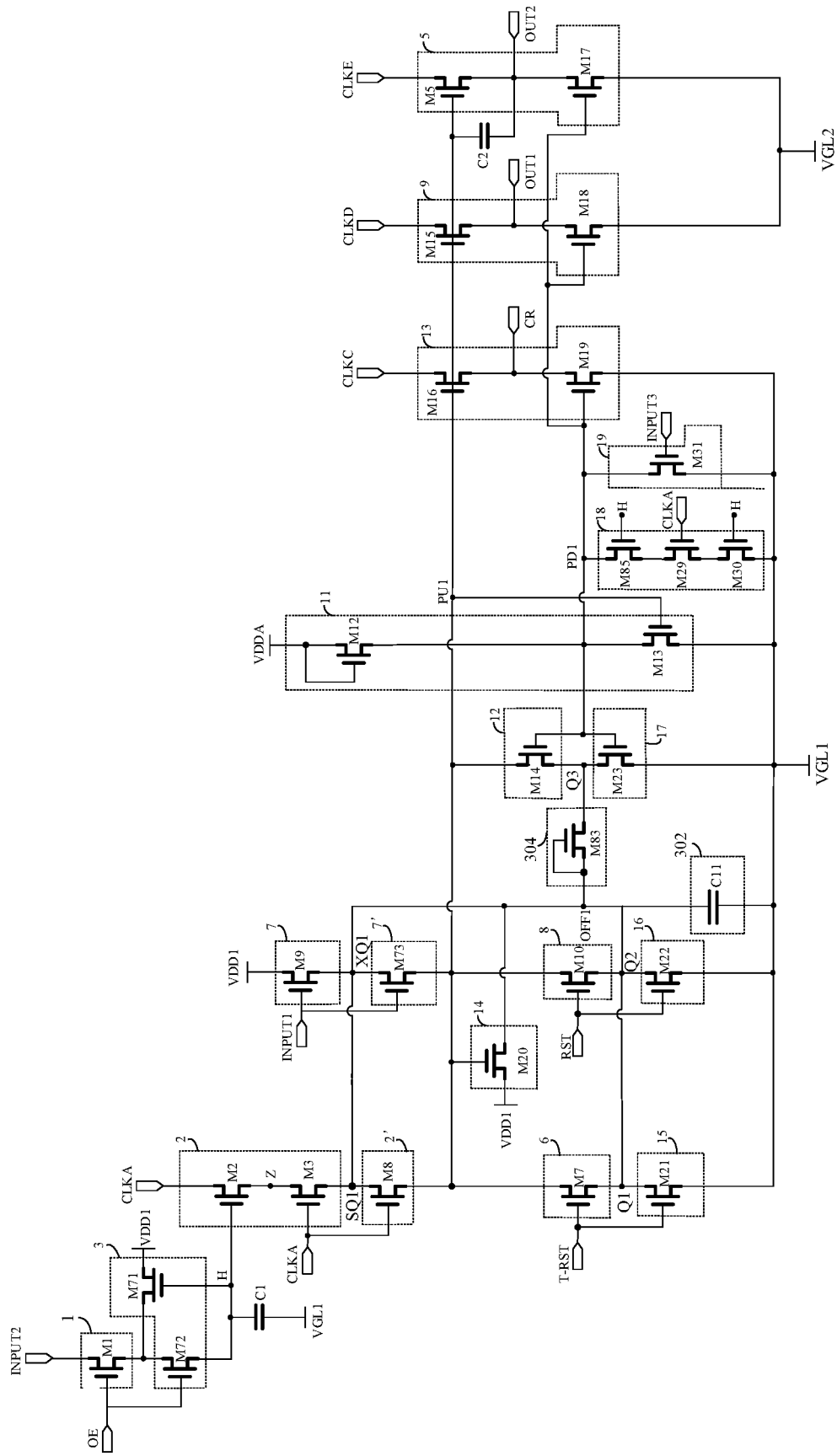
Figure 12E:
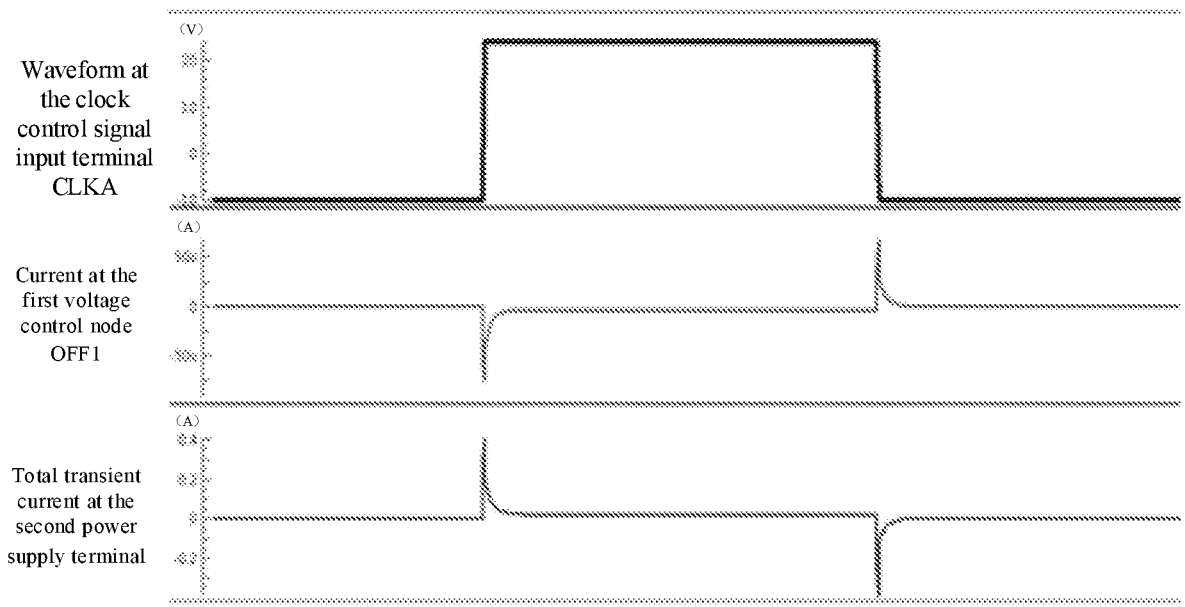
FIG. 12E is a simulation diagram illustrating current changes at a first voltage control node and a second power supply terminal of the shift register unit shown in FIG. 12A without an eighty-first transistor.

FIG. 12E is a simulation diagram of current changes at a first voltage control node and a second power supply terminal when an eighty-first transistor is not provided in the shift register unit shown in FIG. 12A. As shown in FIG. 12E, without the eighty-first transistor for increasing the load resistance in the shift register unit shown in FIG. 12A, when the level of the signal provided by the clock control signal input terminal CLKA is switched, a current peak value of the transient current generated at the first voltage control node OFF1 is about 78 uA, and a current peak value of the transient current at the second power supply terminal is about 0.42 A.

Figure 12F:
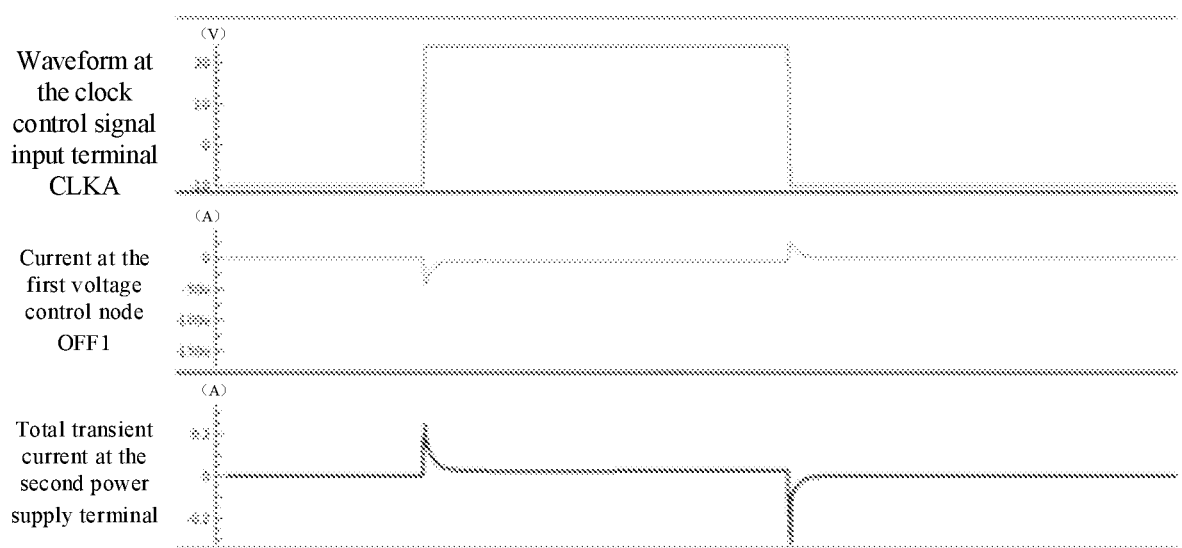
FIG. 12F is a simulation diagram of current changes at a first voltage control node and a second power supply terminal the shift register unit shown in FIG. 12A provided with an eighty-first transistor.

FIG. 12F is a simulation diagram of current changes at a first voltage control node and a second power supply terminal when an eighty-first transistor is provided in the shift register unit shown in FIG. 12A. As shown in FIG. 12F, with the eighty-first transistor, when the level of the signal provided by the clock control signal input terminal CLKA is switched, a current peak value of the transient current generated at the first voltage control node OFF1 is about 38 uA, and a current peak value of the transient current at the second power supply terminal is about 0.28 A. As can be seen from FIGS. 12E and 12F, with the eighty-first transistor, the current peak value of the transient current at the first voltage control node OFF1 can be effectively reduced, and the current peak value of the transient current at the second power supply terminal can also be effectively reduced.

In the embodiment of the present disclosure, the transient current between the first voltage control node OFF1 and the third leakage prevention node Q3 in the shift register unit can be reduced, so that the transient current between the third leakage prevention circuit 17 and the second power supply terminal is reduced, and the transient current at the second power supply terminal is reduced. For example, as shown in FIGS. 12A and 12B, by providing at least one of the eighty-first transistor M81, the eighty-second transistor M82, and the eleventh capacitor C11, the transient current between the first voltage control node OFF1 and the third leakage prevention node can be effectively reduced. The schemes shown in FIGS. 12A and 12B can improve the problem of the excessive transient current at the second power supply terminal due to the switching of the level of the signal provided by the clock control signal input terminal CLKA or the global reset signal input terminal T-RST.

Unlike in FIGS. 12A and 12B, the first current limiting circuit as shown in FIGS. 12C and 12D includes: a fourth load circuit 304 located between the first voltage control node OFF1 and the third leakage prevention node Q3, and configured to increase a load resistance between the first voltage control node OFF1 and the third leakage prevention node Q3.

In some embodiments, the fourth load circuit 304 includes: an eighty-third transistor M83; a control electrode of the eighty-third transistor M83 is connected to the first voltage control node OFF1, a first electrode of the eighty-third transistor M83 is connected to the first voltage control node OFF1, and a second electrode of the eighty-third transistor M83 is connected to the third leakage prevention node Q3. At this time, the eighty-third transistor M83 may be equivalent to a diode, which does not affect the writing of the valid level signal to the third leakage prevention node by the first voltage control circuit, and also serves as a load resistor to limit the current.

It should be noted that in the embodiment of the present disclosure, the first current limiting circuit 300 may selectively include at least one of the first load circuit 301 (the eighty-first transistor M81), the second load circuit 302 (the eleventh capacitor C11), the third load circuit 303 (the eighty-second transistor M82), and the fourth load circuit 304 (the eighty-third transistor M83), which can effectively improve the problem of the excessive transient current at the second power supply terminal due to the switching of the level of the signal provided by the clock control signal input terminal CLKA or the global reset signal input terminal T-RST.

Figure 12G:
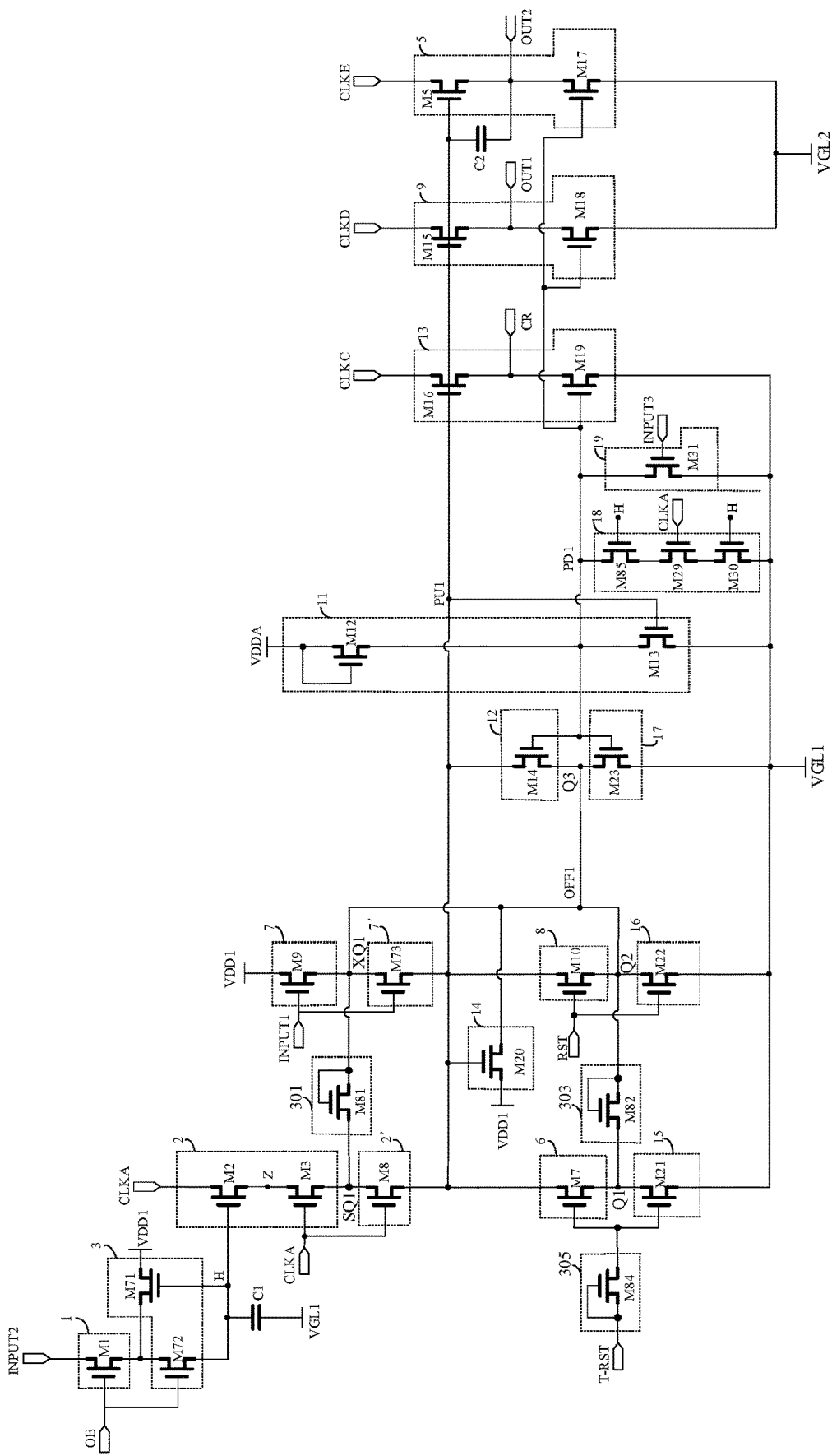
FIG. 12G is a schematic diagram of another circuit structure of a shift register unit according to an embodiment of the present disclosure.

FIG. 12G is a schematic diagram of another circuit structure of a shift register unit according to an embodiment of the present disclosure. As shown in FIG. 12G, unlike the previous embodiment, the shift register unit shown in FIG. 12G includes a fifth load circuit 305; at least one of the first global reset circuit 6 and the first leakage prevention circuit 15 is connected to the global reset signal input terminal T-RST through the fifth load circuit 305, and the fifth load circuit 305 is configured to increase a load resistance between the global reset signal input terminal T-RST and at least one of the first global reset circuit 6 and the first leakage prevention circuit 15.

By taking the case as an example where the first global reset circuit 6 and the first leakage prevention circuit 15 are both connected to the global reset signal input terminal T-RST through the fifth load circuit 305, by providing the fifth load circuit 305 to increase the load resistance between the global reset signal input terminal T-RST and each of the first global reset circuit 6 and the first leakage prevention circuit 15, the transient current between the global reset signal input terminal T-RST and each of the first global reset circuit 6 and the first leakage prevention circuit 15 may be smaller when the level of the signal provided by the global reset signal input terminal T-RST is switched, so that the transient current between the first leakage prevention node Q1 and the first voltage control node OFF1 may be smaller.

In some embodiments, the fifth load circuit 305 includes: an eighty-fourth transistor M84; a control electrode of the eighty-fourth transistor M84 is connected to the global reset signal input terminal T-RST, a first electrode of the eighty-fourth transistor M84 is connected to the global reset signal input terminal T-RST, and a second electrode of the eighty-fourth transistor M84 is connected to at least one of the first global reset circuit 6 and the first leakage prevention circuit 15.

It should be noted that the fifth load circuit 305 shown in FIG. 12G may be selectively provided in the shift register unit shown in the foregoing embodiments (for example, the shift register unit shown in FIGS. 12B to 12D) as needed, which also belongs to the protection scope of the present disclosure.

With continued reference to FIGS. 12A to 12D and 12G, in some embodiments, the shift register unit further includes: at least one of a first display input leakage prevention circuit 7' and a second leakage prevention circuit 16.

The first display input circuit 7 is connected to the first pull-up node through the first display input leakage prevention circuit 7'; the first display input circuit 7 is connected to the first display input leakage prevention circuit 7' at a first display input leakage prevention node XQ1 connected to the first voltage control node OFF1; the first display input leakage prevention circuit 7' is connected to the display signal input terminal INPUT1 and is configured to form a path between the first display input leakage prevention node XQ1 and the first pull-up node PU1 in response to control of a valid level signal provided by the display signal input terminal INPUT1, and to disconnect the first display input leakage prevention node XQ1 from the first pull-up node PU1 in response to control of an invalid level signal provided by the display signal input terminal INPUT1.

The first display reset circuit 8 is connected to the second power supply terminal through the first leakage prevention circuit 16, the first display reset circuit 8 is connected to the first leakage prevention circuit 16 at a second leakage prevention node Q2 connected to the first voltage control node OFF1; the first leakage prevention circuit 16 is connected to the display reset signal input terminal RST, and configured to form a path between the second leakage prevention node Q2 and the second power supply terminal in response to control of a valid level signal provided by the display reset signal input terminal RST, and to disconnect the second leakage prevention node Q2 from the second power supply terminal in response to control of an invalid level signal provided by the display reset signal input terminal RST.

In some embodiments, the shift register unit further includes: a sensing control leakage prevention circuit 3; the sensing control circuit 1 is connected to the sensing control node H through the sensing control leakage prevention circuit 3; the sensing control leakage prevention circuit 3 is connected to the sensing control circuit 1 at a sensing control leakage prevention node; the sensing control leakage prevention circuit 3 is also connected to the first power supply terminal, the sensing control node H and the random signal input terminal OE and configured to write a valid level signal provided by the first power supply terminal to the sensing control leakage prevention node in response to control of a valid level signal at the sensing control node H; to form a path between the sensing control leakage prevention node and the sensing control node H in response to control of a valid level signal provided by the random signal input terminal OE; and to disconnect the sensing control leakage prevention node from the sensing control node H in response to control of an invalid level signal provided by the random signal input terminal OE.

For specific circuit structures of the sensing control circuit 1, the first sensing input circuit 2, the first global reset circuit 6, the first display input circuit 7, the first display reset circuit 8, the first driving signal output circuit 5, the second driving signal output circuit 9, the first cascade signal output circuit 13, the first pull-down control circuit 11, and the first pull-up noise reduction circuit 12 in FIGS. 12A to 12D and 12G, reference may be made to those shown in FIGS. 10A and 10B, and details are not repeated here.

In some embodiments, the first leakage prevention circuit 15 includes a twenty-first transistor M21, the second leakage prevention circuit 16 includes a twenty-second transistor M22, the third leakage prevention circuit 17 includes a twenty-third transistor M23, the sensing control leakage prevention circuit 3 includes a seventy-first transistor M71 and a seventy-second transistor M72, and the first display input leakage prevention circuit 7' includes a seventy-third transistor M73.

A control electrode of the twenty-first transistor M21 is connected to the global reset signal input terminal T-RST, a first electrode of the twenty-first transistor M21 is connected to the global reset circuit and the first voltage control node OFF1, and a second electrode of the twenty-second transistor M22 is connected to the second power supply terminal.

A control electrode of the twenty-second transistor M22 is connected to the display reset signal input terminal RST, a first electrode of the twenty-second transistor M22 is connected to the display reset circuit and the first voltage control node OFF1, and a second electrode of the twenty-second transistor M22 is connected to the second power supply terminal.

A control electrode of the twenty-third transistor M23 is connected to the first pull-down node PD1, a first electrode of the twenty-third transistor M23 is connected to the first pull-down control circuit and the first voltage control node OFF1, and a second electrode of the twenty-third transistor M23 is connected to the second power supply terminal.

A control electrode of the seventy-first transistor M71 is connected to the sensing control node H, a first electrode of the seventy-first transistor M71 is connected to the sensing control leakage prevention node, and a second electrode of the seventy-first transistor M71 is connected to the first power supply terminal.

A control electrode of the seventy-second transistor M72 is connected to the random signal input terminal OE, a first electrode of the seventy-second transistor M72 is connected to the sensing control leakage prevention node, and a second electrode of the seventy-second transistor M72 is connected to the sensing control node H.

A control electrode of the seventy-third transistor M73 is connected to the display signal input terminal INPUT1, a first electrode of the seventy-third transistor M73 is connected to the first display input leakage prevention node XQ1, and a second electrode of the seventy-third transistor M72 is connected to the first pull-up node PU1.

With continued reference to FIGS. 12A to 12E, in some embodiments, the shift register unit further includes: a first pull-down noise reduction circuit 18; the first pull-down noise reduction circuit 18 is connected to the first pull-down node PD1, the second power supply terminal, the sensing control node H and the clock control signal input terminal CLKA, and is configured to write an invalid level signal provided by the second power supply terminal to the first pull-down node PD1 in response to control of a valid level signal at the sensing control node H and a valid level signal provided by the clock control signal input terminal CLKA, to reduce noise of the voltage at the first pull-down node PD1.

In some embodiments, the first pull-down noise reduction circuit 18 includes: a twenty-ninth transistor M29 and a thirtieth transistor M30; a control electrode of the twenty-ninth transistor M29 is connected to the clock control signal input terminal CLKA, a first electrode of the twenty-ninth transistor M29 is connected to the first pull-down node PD1, and a second electrode of the twenty-ninth transistor M29 is connected to a first electrode of the thirtieth transistor M30; a control electrode of the thirtieth transistor M30 is connected to the sensing control node H, and a second electrode of the thirtieth transistor M30 is connected to the second power supply terminal.

It is found in practical applications that when the level of the signal provided by the clock control signal input terminal CLKA is switched, the voltage at the first pull-down node PD1 may drift due to the influence of a coupling capacitor between a gate electrode and a source/drain electrode of the twenty-ninth transistor M29, and thus, there is a risk of abnormal operation of the shift register unit.

To avoid the voltage at the first pull-down node PD1 being affected by the switching of the level of the signal provided by the clock control signal input terminal CLKA, in some embodiments, the first pull-down noise reduction circuit 18 preferably further includes: an eighty-fifth transistor M85; the first electrode of the twenty-ninth transistor M29 is connected to the first pull-down node PD1 through the eighty-fifth transistor M85; a control electrode of the eighty-fifth transistor M85 is connected to the sensing control node H, a first electrode of the eighty-fifth transistor M85 is connected to the first pull-down node PD1, and a second electrode of the eighty-fifth transistor M85 is connected to the first electrode of the twenty-ninth transistor M29.

In some embodiments, the shift register unit further includes a second pull-down noise reduction circuit 19; the second pull-down noise reduction circuit 19 is connected to the first pull-down node PD1, the second power supply terminal, and a pull-down noise reduction signal input terminal INPUT3, and is configured to write an invalid level signal provided by the second power supply terminal to the first pull-down node PD1 in response to control of a valid level signal provided by the pull-down noise reduction signal input terminal INPUT3, to reduce noise of the voltage at the first pull-down node PD1.

In some embodiments, the second pull-down noise reduction circuit 19 includes: a thirty-first transistor M31; a control electrode of the thirty-first transistor M31 is connected to the pull-down noise reduction signal input terminal INPUT3, a first electrode of the thirty-first transistor M31 is connected to the first pull-down node PD1, and a second electrode of the thirty-first transistor M31 is connected to the second power supply terminal.

In some embodiments, the pull-down noise reduction signal input terminal INPUT3 may be the sensing signal input terminal INPUT2.

Figure 13A:
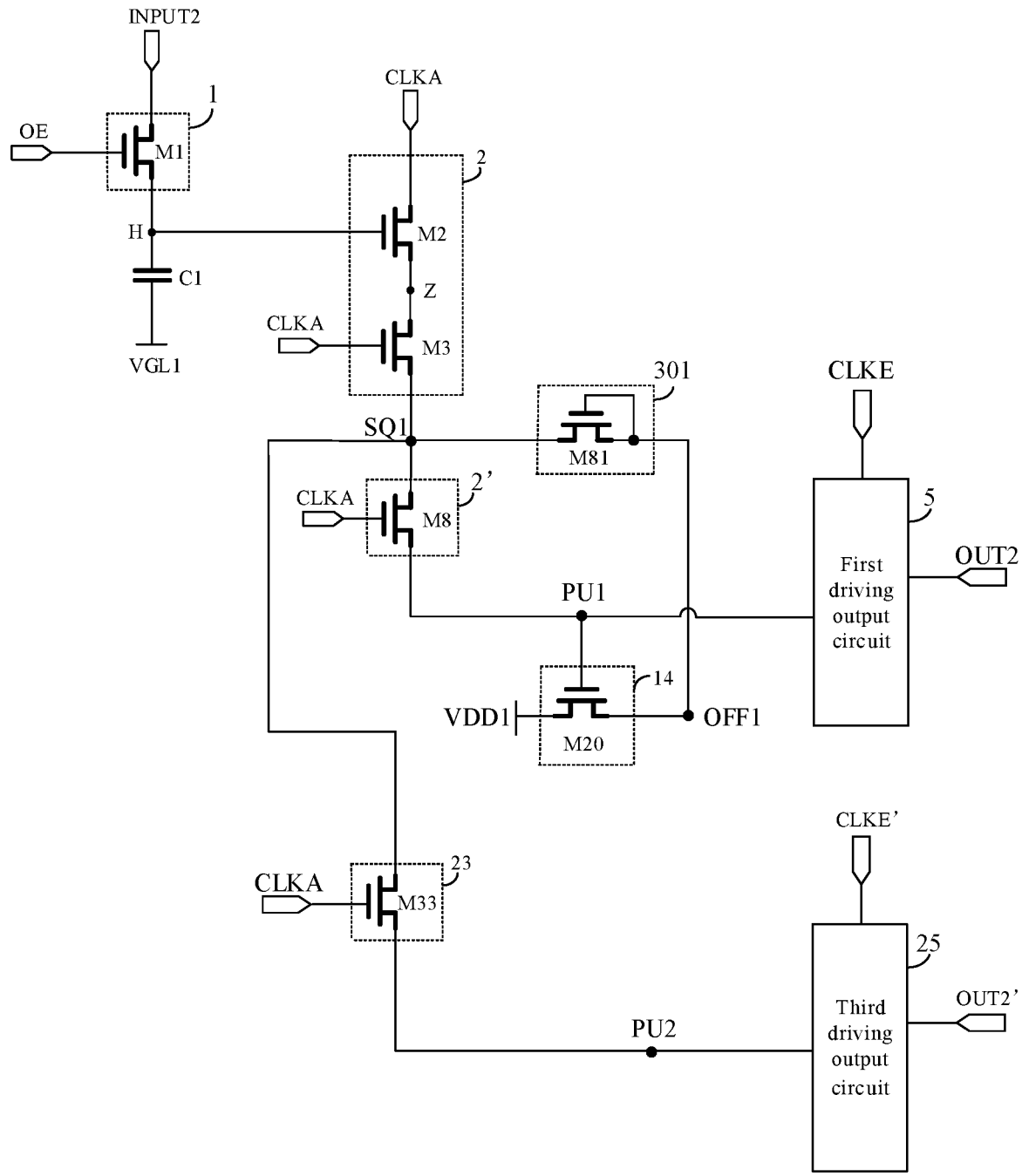
FIG. 13A and FIG. 13B are schematic diagrams of still another two circuit structures of a shift register unit according to an embodiment of the present disclosure.
Figure 13B:
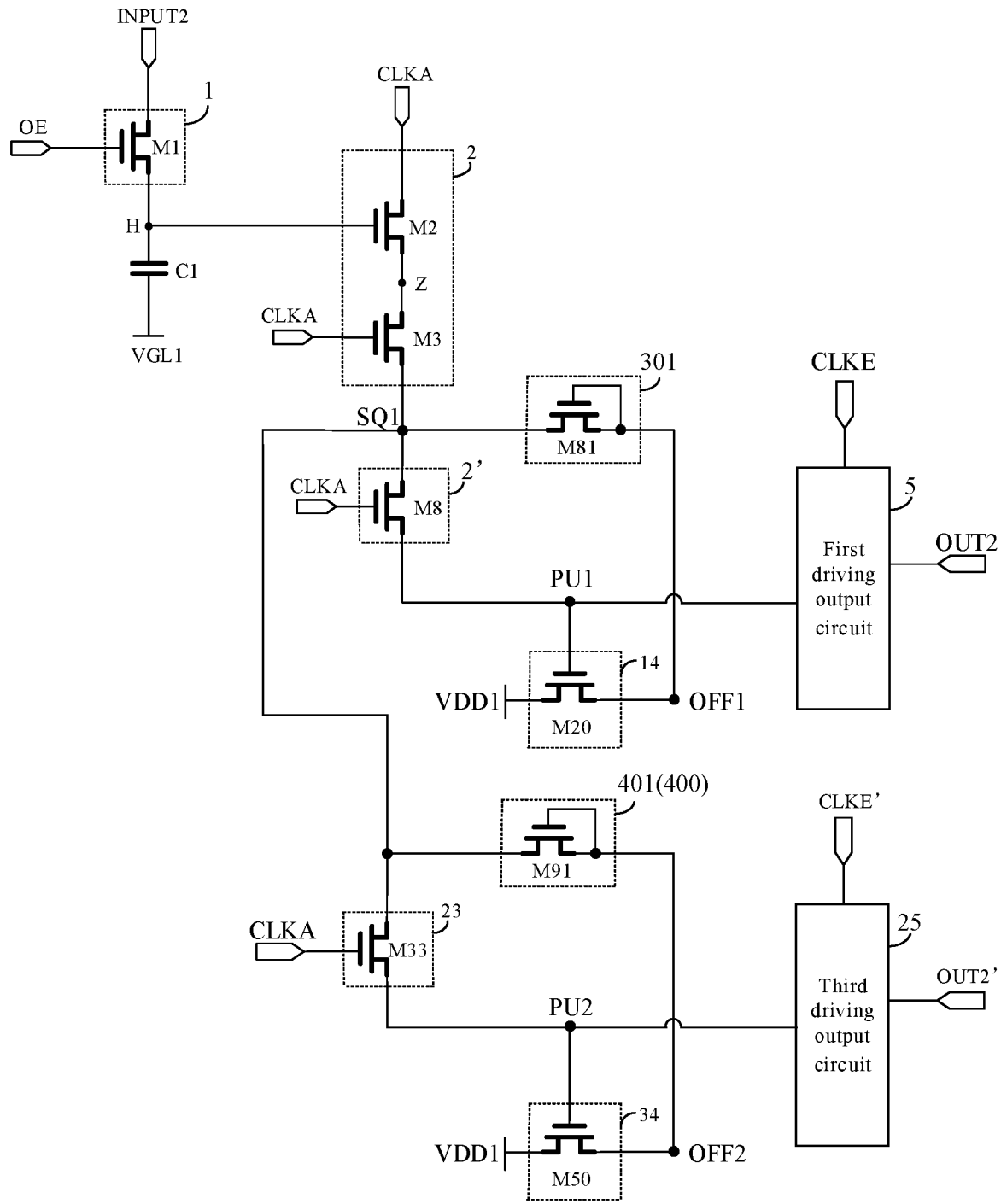

FIG. 13A and FIG. 13B are schematic diagrams of still another two circuit structures of a shift register unit according to an embodiment of the present disclosure. As shown in FIGS. 13A and 13B, in some embodiments the shift register unit includes not only the sensing control circuit 1, the first sensing input circuit 2, and at least one first output circuit (e.g., the first driving output circuit), but also a second sensing input circuit 23 and at least one second output circuit (e.g., a third driving output circuit). At this time, the shift register unit may provide driving signals to pixel units located in different rows in the display substrate based on the at least one first output circuit and the at least one second output circuit.

The second sensing input circuit 23 is connected to the clock control signal input terminal CLKA, the second pull-up node PU2 and a preset power supply node, and is configured to form a path between the preset power supply node and the second pull-up node PU2 in response to control of a valid level signal provided by the clock control signal input terminal CLKA;

The at least one second output circuit is connected to the second pull-up node PU2, a corresponding second clock signal input terminal, and a corresponding second signal output terminal, and is configured to write a signal provided by the corresponding second clock signal input terminal to the corresponding second signal output terminal in response to control of a valid level signal at the second pull-up node PU2.

In the present disclosure, the at least one second output circuit includes at least the third driving output circuit 25; the third driving output circuit 25 is connected to the second pull-up node PU2, a third driving clock signal input terminal CLKE' (a second clock signal input terminal corresponding to the third driving output circuit 25) and a third driving signal output terminal OUT2' (a second signal output terminal corresponding to the third driving output circuit 25), and is configured to write a signal provided by the third driving clock signal input terminal CLKE' to the third driving signal output terminal OUT2' in response to control of a valid level signal at the second pull-up node PU2.

With continued reference to FIGS. 13A and 13B, in some embodiments, the preset power supply node may be the first sensing input leakage prevention node, and the first sensing input circuit 2 and the second sensing input circuit 23 may share the voltage control node.

In some embodiments, the second sensing input circuit 23 includes: a thirty-third transistor M33; a control electrode of the thirty-third transistor M33 is connected to the clock control signal input terminal CLKA, a first electrode of the thirty-third transistor M33 is connected to the preset power supply node (in FIGS. 13A and 13B, the first sensing input leakage prevention node SQ1), and a second electrode of the thirty-third transistor M33 is connected to the second pull-up node PU2.

In the case shown in FIG. 13A, the first sensing input circuit 2 and the second sensing input circuit 23 may share the first voltage control node. At this time, the first sensing input circuit 2 and the second sensing input circuit 23 may also share the same first current limiting circuit, so as to improve the problem of the excessive transient current generated at the first voltage control node due to the switching of the level of the signal provided by the clock control signal input terminal CLKA (connected to both the first sensing input circuit and the second sensing input circuit 23).

In the case shown in FIG. 13A, it is only exemplarily shown that the first current limiting circuit includes the first load circuit 301 including the eighty-first transistor M81.

In addition, compared to the scheme shown in FIG. 13A, in the scheme shown in FIG. 13B, the shift register unit further includes: a second voltage control circuit 34 and a second current limiting circuit 400; the second voltage control circuit 34 is connected to the first power supply terminal, the second pull-up node PU2 and the second voltage control node OFF2, and is configured to write the valid level signal provided by the first power supply terminal to the second voltage control node OFF2 in response to control of a valid level signal at the second pull-up node PU2; the second current limiting circuit 400 is connected to the second voltage control node OFF2, and is configured to reduce a charging/discharging current at the second voltage control node OFF2.

In some embodiments, the second voltage control circuit 34 includes: a fiftieth transistor M50; a control electrode of the fiftieth transistor M50 is connected to the second pull-up node PU2, a first electrode of the fiftieth transistor M50 is connected to the first power supply terminal, and a second electrode of the fiftieth transistor M50 is connected to the second voltage control node OFF2.

In the case shown in FIG. 13B, the first and second sensing input circuits 2 and 23 may share the first and second control voltage nodes OFF1 and OFF2. The first and second sensing input circuits 2 and 23 may also share the first and second current limiting circuits 300 and 400; the problem of the excessive transient current generated at the first voltage control node OFF1 due to the switching of the level of the signal provided by the clock control signal input terminal can be improved by providing the first current limiting circuit 300; the problem of the excessive transient current generated at the second voltage control node OFF2 due to the switching of the level of the signal provided by the clock control signal input terminal can be improved by providing the second current limiting circuit 400.

In some embodiments, the second current limiting circuit 400 includes: an eleventh load circuit 401 located between the first sensing input leakage prevention node SQ1 and the second control voltage node OFF2, and configured to increase a load resistance between the first sensing input leakage prevention node SQ1 and the second control voltage node OFF2.

In some embodiments, the eleventh load circuit 401 includes: a ninety-first transistor M91; a control electrode of the ninety-first transistor M91 is connected to the second voltage control node OFF2, a first electrode of the ninety-first transistor M91 is connected to the second voltage control node OFF2, and a second electrode of the ninety-first transistor M91 is connected to the first sensing input leakage prevention node SQ1.

Figure 14A:
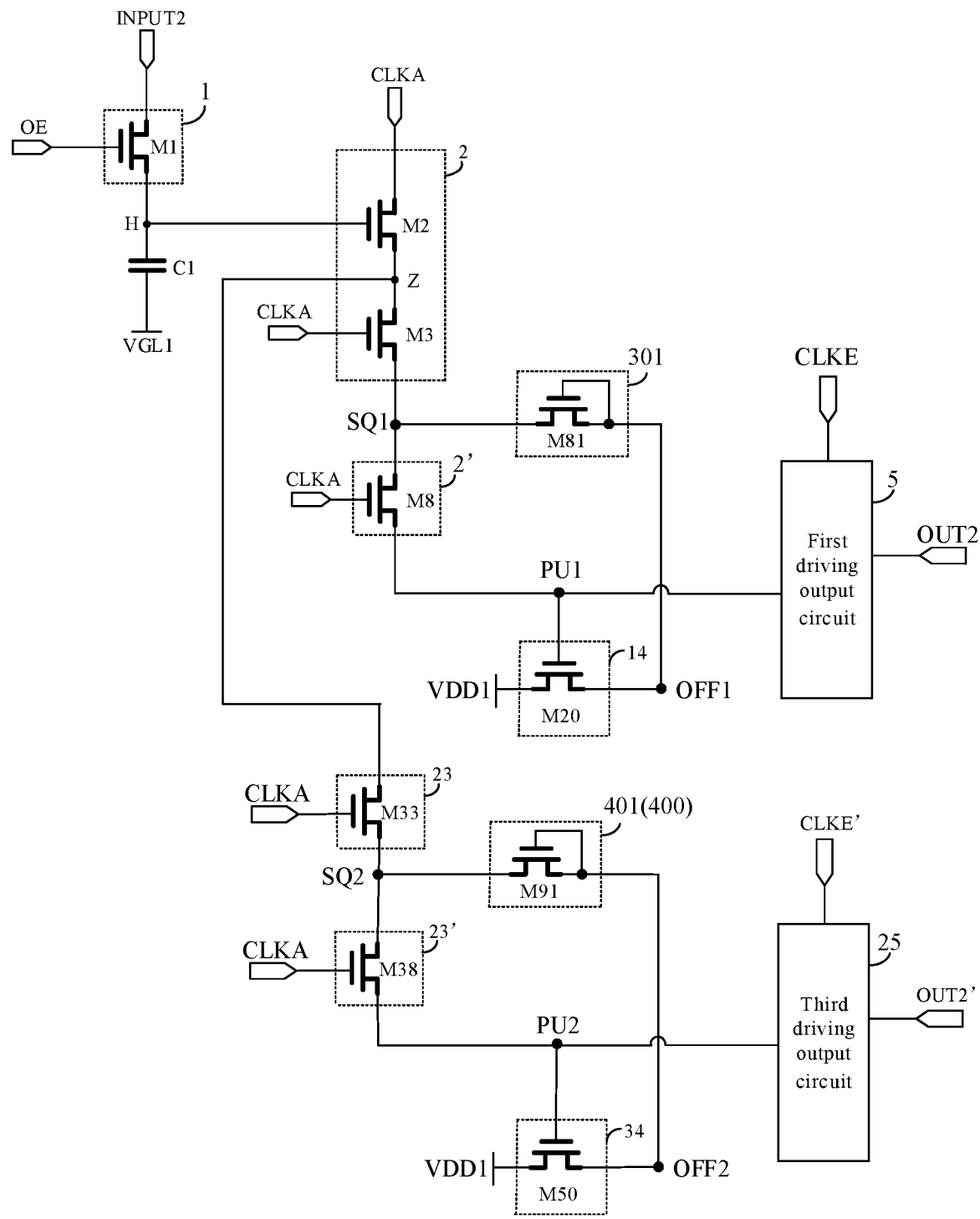
FIG. 14A and FIG. 14B are schematic diagrams of still another two circuit structures of a shift register unit according to an embodiment of the present disclosure.
Figure 14B:
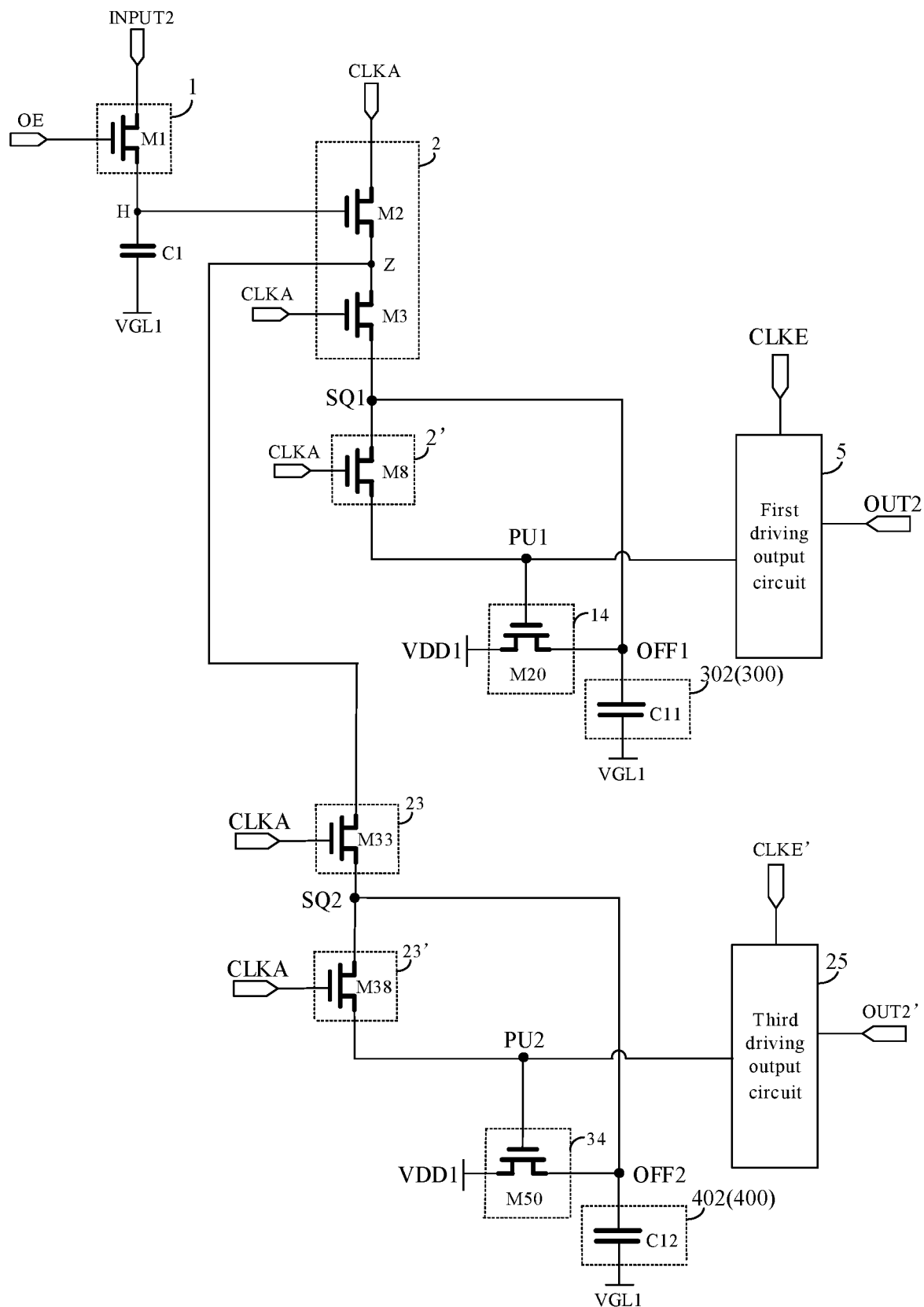

FIG. 14A and FIG. 14B are schematic diagrams of still another two circuit structures of a shift register unit according to an embodiment of the present disclosure. As shown in FIGS. 14A and 14B, unlike FIGS. 13A and 13B, the preset power supply node in FIGS. 14A and 14B is the sensing intermediate node Z. At this time, the shift register unit further includes: the second voltage control circuit 34, a second sensing input leakage prevention circuit 23' and the second current limiting circuit 400.

The second voltage control circuit 34 is connected to the first power supply terminal, the second pull-up node PU2 and the second voltage control node OFF2, and is configured to write a valid level signal provided by the first power supply terminal to the second voltage control node OFF2 in response to control of a valid level signal at the second pull-up node PU2.

The second sensing input circuit 23 is connected to the second pull-up node PU2 through the second sensing input leakage prevention circuit 23', the second sensing input circuit 23 is connected to the second sensing input leakage prevention circuit 23' at the second sensing input leakage prevention node SQ2 connected to the second voltage control node OFF2; the second sensing input leakage prevention circuit 23' is connected to the clock control signal input terminal CLKA and is configured to form a path between the second sensing input leakage prevention node SQ2 and the second pull-up node PU2 in response to control of a valid level signal at the clock control signal input terminal CLKA, and to disconnect the second sensing input leakage prevention node SQ2 from the second pull-up node PU2 in response to control of an invalid level signal at the clock control signal input terminal CLKA.

The second current limiting circuit 400 is connected to the second voltage control node OFF2, and is configured to reduce a charging/discharging current at the second voltage control node OFF2.

It should be noted that in the embodiment of the present disclosure, the second current limiting circuit 400 may be disposed between the second sensing input leakage prevention node SQ2 and the second voltage control node OFF2 as shown in FIG. 14A, or may not be disposed between the second sensing input leakage prevention node SQ2 and the second voltage control node OFF2 as shown in FIG. 14B. Alternatively, the second current limiting circuit 400 in the embodiment of the present disclosure may be partially disposed between the second sensing input leakage prevention node SQ2 and the second voltage control node OFF2, and partially not disposed between the second sensing input leakage prevention node SQ2 and the second voltage control node OFF2, that is, both cases shown in FIG. 14A and FIG. 14B are included (not shown).

In some embodiments, the second sensing input leakage prevention circuit 23' includes: a thirty-eighth transistor M38; a control electrode of the thirty-eighth transistor M38 is connected to the clock control signal input terminal CLKA, a first electrode of the thirty-eighth transistor M38 is connected to the second sensing input circuit 23, and a second electrode of the thirty-eighth transistor M38 is connected to the second pull-up node PU2;

Referring to FIG. 14A, in some embodiments, the second current limiting circuit 400 includes: the eleventh load circuit 401 located between the second sensing input leakage prevention node SQ2 and the second voltage control node OFF2, and configured to increase a load resistance between the second sensing input leakage prevention node SQ2 and the second voltage control node OFF2.

In some embodiments, the eleventh load circuit 401 includes: the ninety-first transistor M91; the control electrode of the ninety-first transistor M91 is connected to the second voltage control node OFF2, the first electrode of the ninety-first transistor M91 is connected to the second sensing input leakage prevention node SQ2, and the second electrode of the ninety-first transistor M91 is connected to the second voltage control node OFF2. In this case, the ninety-first transistor M91 may be equivalent to a diode, which does not affect the writing of the valid level signal into the second sensing input leakage prevention node SQ2 by the second voltage control circuit, and can also serve as a load resistor for limiting the current.

Referring to FIG. 14B, in some embodiments, the second current limiting circuit 400 includes: a twelfth load circuit 402 connected to the second voltage control node OFF2 and the second power supply terminal, and configured to increase a load capacitance at the second voltage control node OFF2. By increasing the load capacitance at the second voltage control node OFF2, the transient current generated at the second voltage control node OFF2 can be reduced when the level of the signal provided at the clock control signal input terminal CLKA is switched; and the load capacitor has a certain voltage stabilizing effect, so that the voltage drift at the second voltage control node OFF2 can be effectively reduced.

In some embodiments, the twelfth load circuit 402 includes: a twelfth capacitor C12; a first terminal of the twelfth capacitor C12 is connected to the second voltage control node OFF2, and a second terminal of the twelfth capacitor C12 is connected to the second power supply terminal.

Figure 15A:
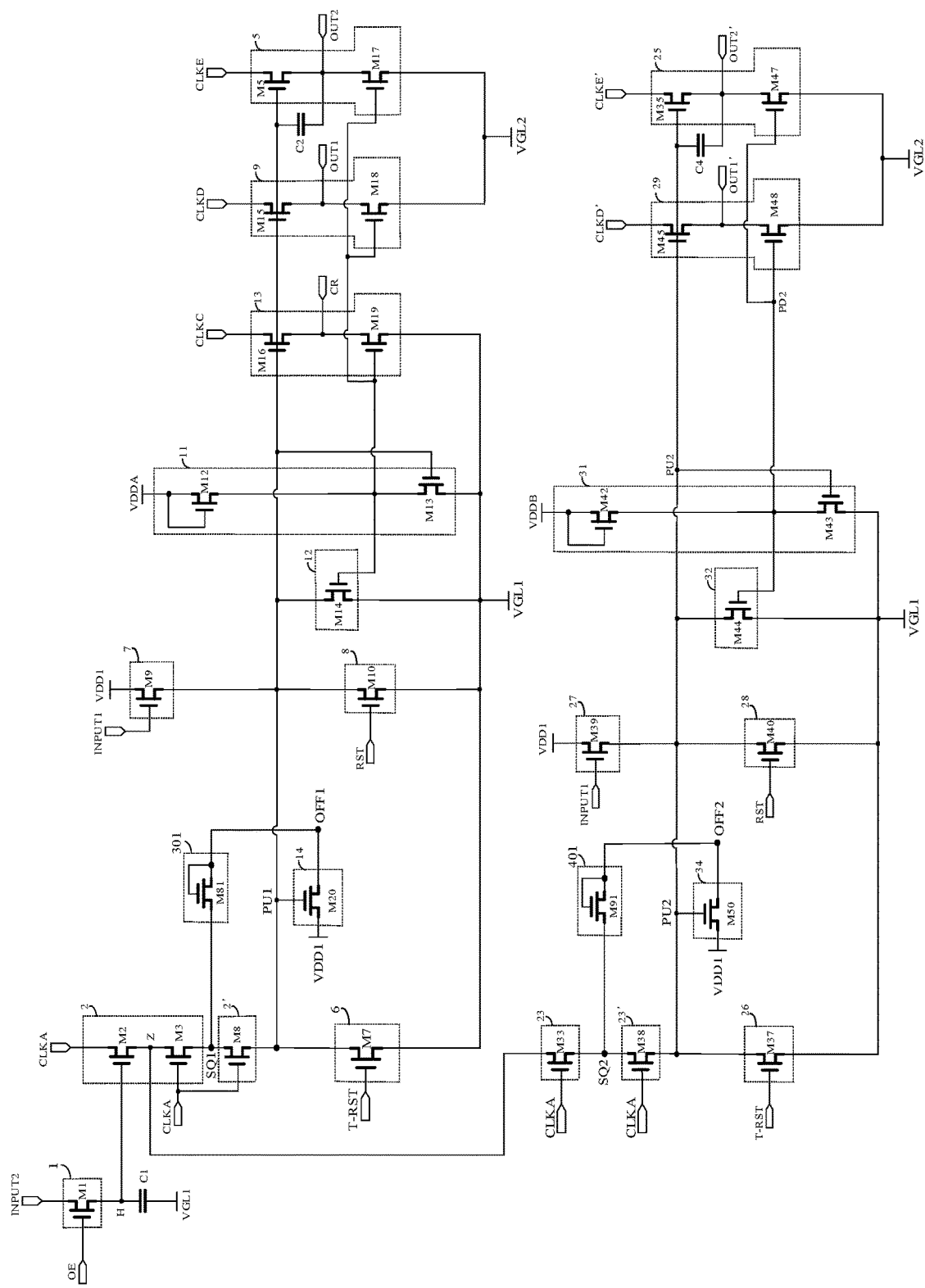
FIG. 15A and FIG. 15B are schematic diagrams of still another two circuit structures of a shift register unit according to an embodiment of the present disclosure.
Figure 15B:
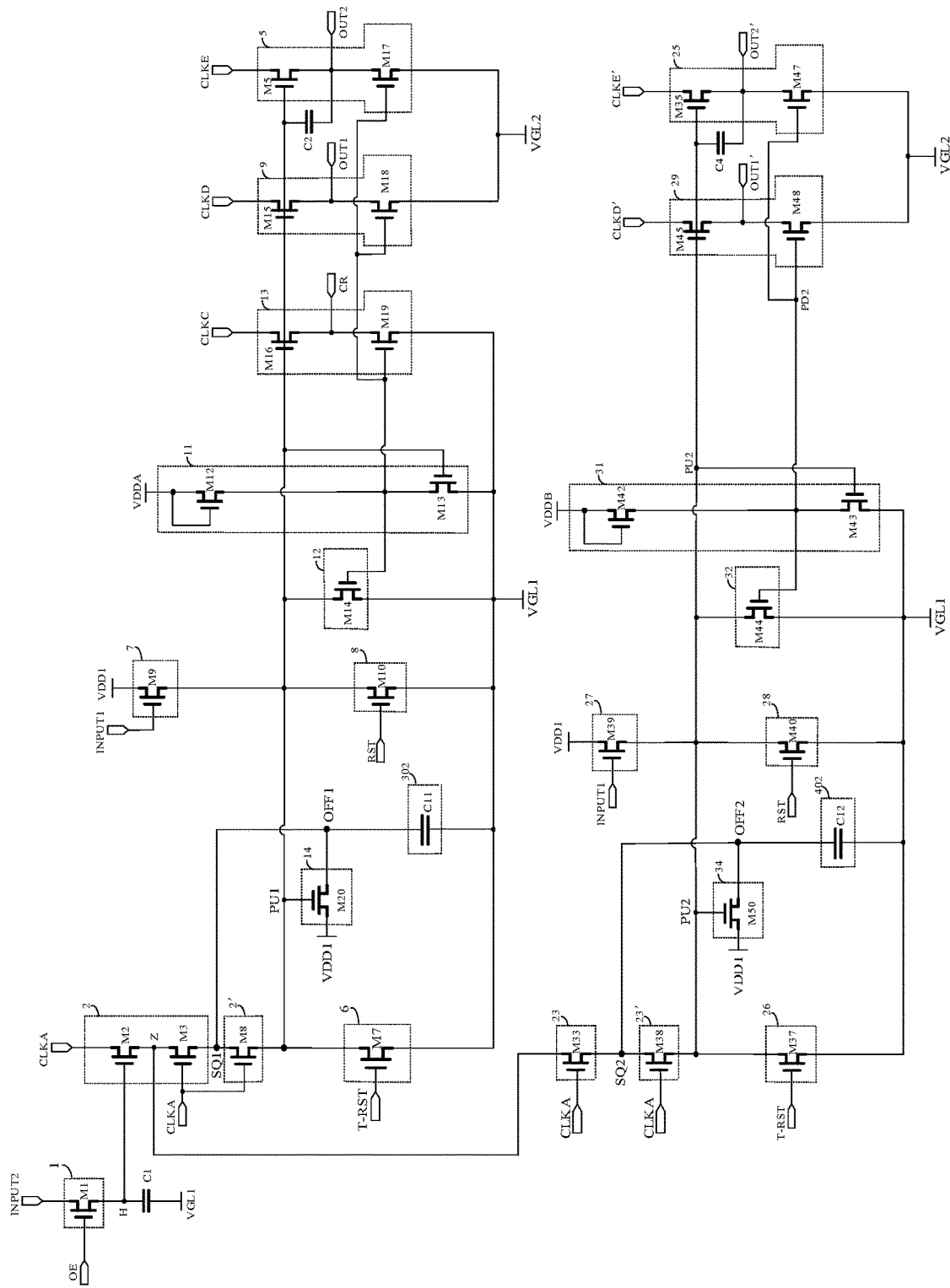

FIG. 15A and FIG. 15B are schematic diagrams of still another two circuit structures of a shift register unit according to an embodiment of the present disclosure. As shown in FIGS. 15A and 15B, in some embodiments, the shift register unit further includes a second global reset circuit 26, a second display input circuit 27, and a second display reset circuit 28. The at least one second output circuit includes not only the third driving output circuit 25 but also a fourth driving output circuit 29.

The second global reset circuit 26 is connected to the global reset signal input terminal T-RST, the second power supply terminal, and the second pull-up node PU2, and is configured to write an invalid level signal provided by the second power supply terminal to the second pull-up node PU2 in response to control of a valid level signal provided by the global reset signal input terminal T-RST.

The second display input circuit 27 is connected to the display signal input terminal INPUT1 and the second pull-up node PU2, and is configured to write a valid level signal to the second pull-up node PU2 in response to control of a valid level signal provided by the display signal input terminal INPUT1.

The second display reset circuit 28 is connected to the display reset signal input terminal RST, the second power supply terminal, and the second pull-up node PU2, and is configured to write an invalid level signal provided by the second power supply terminal to the second pull-up node PU2 in response to control of a valid level signal provided by the display reset signal input terminal RST.

The fourth driving output circuit 29 is connected to the second pull-up node PU2, a fourth driving clock signal input terminal CLKD', and a fourth driving signal output terminal OUT1' and is configured to write a signal provided by the fourth driving clock signal input terminal CLKD' to the fourth driving signal output terminal OUT1' in response to control of a valid level signal at the second pull-up node PU2.

The fourth driving output circuit 29 may provide a driving signal to a first gate line G1 except for a first gate line G1 connected to the second driving output circuit 9 on the display panel.

In the embodiment of the present disclosure, when the shift register unit includes all the first driving output circuit 5, the second driving output circuit 9, the third driving output circuit 25, and the fourth driving output circuit 29, the first driving output circuit 5 and the second driving output circuit 9 may be respectively used to provide corresponding driving signals to one first gate line and one second gate line configured for a certain row of pixel units in the display panel; and the third driving output circuit 25 and the fourth driving output circuit 29 may be respectively used to provide corresponding driving signals to one first gate line and one second gate line configured for another row of pixel units in the display panel. That is, the shift register unit in this embodiment may be used to drive four gate lines configured by two rows of pixel units (for example, two adjacent rows of pixel units). With the design, the number of stages of the shift register units in the gate driving circuit can be effectively reduced, a size of a space occupied by the gate driving circuit is reduced, and a narrow frame design of a product is facilitated.

In some embodiments, the shift register unit further includes: a second pull-down control circuit 31 and a second pull-up noise reduction circuit 32.

The second pull-down control circuit 31 is connected to the second power supply terminal, a sixth power supply terminal, the second pull-up node PU2 and the second pull-down node PD2, and is configured to write a voltage having a phase opposite to that of the voltage at the second pull-up node PU2 to the second pull-down node PD2;

The second pull-up noise reduction circuit 32 is connected to the second power supply terminal, the second pull-up node PU2 and the second pull-down node PD2, and is configured to write an invalid level signal provided by the second power supply terminal to the second pull-up node PU2 in response to control of a valid level signal at the second pull-down node PD2.

At this time, the third driving output circuit 25 is further connected to the second pull-down node PD2 and the fourth power supply terminal, and is further configured to write an invalid level signal provided by the fourth power supply terminal to the third driving signal output terminal OUT2' in response to control of a valid level signal at the second pull-down node PD2.

The fourth driving output circuit 29 is further connected to the second pull-down node PD2 and the fourth power supply terminal, and is further configured to write an invalid level signal provided by the fourth power supply terminal to the fourth driving signal output terminal OUT1' in response to control of a valid level signal at the second pull-down node PD2.

It should be noted that in some embodiments, the shift register unit may further include a second cascade output circuit (not shown). The second cascade output circuit is connected to the second pull-up node PU2, a second cascade clock signal input terminal, and a second cascade signal output terminal, and is configured to write a signal provided by the second cascade clock signal input terminal to the second cascade signal output terminal in response to control of a valid level signal at the second pull-up node PU2. In addition, the second cascade output circuit may be further connected to the second power supply terminal and the second pull-down node PD2, and be configured to write an invalid level signal provided by the second power supply terminal to the second cascade signal output terminal in response to control of a valid level signal at the second pull-down node PD2.

In some embodiments, the second sensing input circuit 23 includes: the thirty-third transistor M33; the control electrode of the thirty-third transistor M33 is connected to the clock control signal input terminal CLKA, the first electrode of the thirty-third transistor M33 is connected to the preset power supply node (the sensing intermediate node in FIGS. 15A and 15B), and the second electrode of the thirty-third transistor M33 is connected to the second sensing input leakage prevention node SQ2.

The second sensing input leakage prevention circuit 23' includes: the thirty-eighth transistor M38; the control electrode of the thirty-eighth transistor M38 is connected to the clock control signal input terminal CLKA, the first electrode of the thirty-eighth transistor M38 is connected to the second sensing input circuit 23, and the second electrode of the thirty-eighth transistor M38 is connected to the second pull-up node PU2;

The second display input circuit 27 includes a thirty-ninth transistor M39. A control electrode of the thirty-ninth transistor M39 is connected to the display signal input terminal INPUT1, a first electrode of the thirty-ninth transistor M39 is connected to the first power supply terminal, and a second electrode of the thirty-ninth transistor M39 is connected to the second pull-up node PU2.

The third driving output circuit 25 includes a thirty-fifth transistor M35 and a forty-seventh transistor M47, and the fourth driving output circuit 29 includes a forty-fifth transistor M45 and a forty-eighth transistor M48;

A control electrode of the thirty-fifth transistor M35 is connected to the second pull-up node PU2, a first electrode of the thirty-fifth transistor M35 is connected to the third driving clock signal input terminal CLKE', and a second electrode of the thirty-fifth transistor M35 is connected to the third driving signal output terminal OUT2'.

A control electrode of the forty-seventh transistor M47 is connected to the second pull-down node PD2, a first electrode of the forty-seventh transistor M47 is connected to the third driving signal output terminal OUT2', and a second electrode of the forty-seventh transistor M47 is connected to the fourth power supply terminal.

A control electrode of the forty-fifth transistor M45 is connected to the second pull-up node PU2, a first electrode of the forty-fifth transistor M45 is connected to the fourth driving clock signal input terminal CLKD', and a second electrode of the forty-fifth transistor M45 is connected to the fourth driving signal output terminal OUT1'.

A control electrode of the forty-eighth transistor M48 is connected to the second pull-down node PD2, a first electrode of the forty-eighth transistor M48 is connected to the fourth driving signal output terminal OUT1', and a second electrode of the forty-eighth transistor M48 is connected to the fourth power supply terminal.

In some embodiments, a fourth capacitor C4 is configured for the third driving signal output terminal OUT2'.

In some embodiments, the second global reset circuit 26 includes a thirty-seventh transistor M37, the second display reset circuit 28 includes a fortieth transistor M40, the second pull-down control circuit 31 includes a forty-second transistor M42 and a forty-third transistor M43, and the second pull-up noise reduction circuit 32 includes a forty-fourth transistor M44.

A control electrode of the thirty-seventh transistor M37 is connected to the global reset signal input terminal T-RST, a first electrode of the thirty-seventh transistor M37 is connected to the second pull-up node PU2, and a second electrode of the thirty-seventh transistor M37 is connected to an invalid level supply terminal.

A control electrode of the fortieth transistor M40 is connected to the display reset signal input terminal RST, a first electrode of the fortieth transistor M40 is connected to the second pull-up node PU2, and a second electrode of the fortieth transistor M40 is connected to the invalid level supply terminal.

A control electrode of the forty-second transistor M42 is connected to the sixth power supply terminal, a first electrode of the forty-second transistor M42 is connected to the sixth power supply terminal (providing a voltage VDDB), and a second electrode of the forty-second transistor M42 is connected to the second pull-down node PD2.

A control electrode of the forty-third transistor M43 is connected to the second pull-up node PU2, a first electrode of the forty-third transistor M43 is connected to the second pull-down node PD2, and a second electrode of the forty-third transistor M43 is connected to the invalid level supply terminal.

A control electrode of the forty-fourth transistor M44 is connected to the second pull-down node PD2, a first electrode of the forty-fourth transistor M44 is connected to the second pull-up node PU2, and a second electrode of the forty-fourth transistor M44 is connected to the invalid level supply terminal.

In some embodiments, the fifth power supply terminal provides the voltage VDDA and the sixth power supply terminal provides the voltage VDDB; the voltages VDDA and VDDB may be switched between a high level voltage and a low level voltage (e.g., once every one or a few frames), and one of the voltages VDDA and VDDB is the high level voltage and the other one is the low level voltage at any time.

FIGS. 16A to 16D are schematic diagrams of still another four circuit structures of a shift register unit according to an embodiment of the present disclosure. As shown in FIGS. 16A to 16D, in some embodiments, the shift register unit includes not only the second global reset circuit but also a fourth leakage prevention circuit 35.

The second global reset circuit 26 is connected to the second power supply terminal through the fourth leakage prevention circuit 35, the second global reset circuit 26 is connected to the fourth leakage prevention circuit 35 at a fourth leakage prevention node Q4 connected to the second voltage control node OFF2; the fourth leakage prevention circuit 35 is connected to the sensing reset signal input terminal T-RST, and is configured to form a path between the fourth leakage prevention node Q4 and the second power supply terminal in response to control of a valid level signal provided by the sensing reset signal input terminal T-RST, and to disconnect the fourth leakage prevention node Q4 from the second power supply terminal in response to control of an invalid level signal provided by the cascade reset signal input terminal.

Similar to the clock control signal input terminal CLKA, when the level of the signal provided by the global reset signal input terminal T-RST is switched, for example, from a high level to a low level, or from a low level to a high level, an excessive transient current is generated between the second leakage prevention node and the second voltage control node.

Figure 16A:
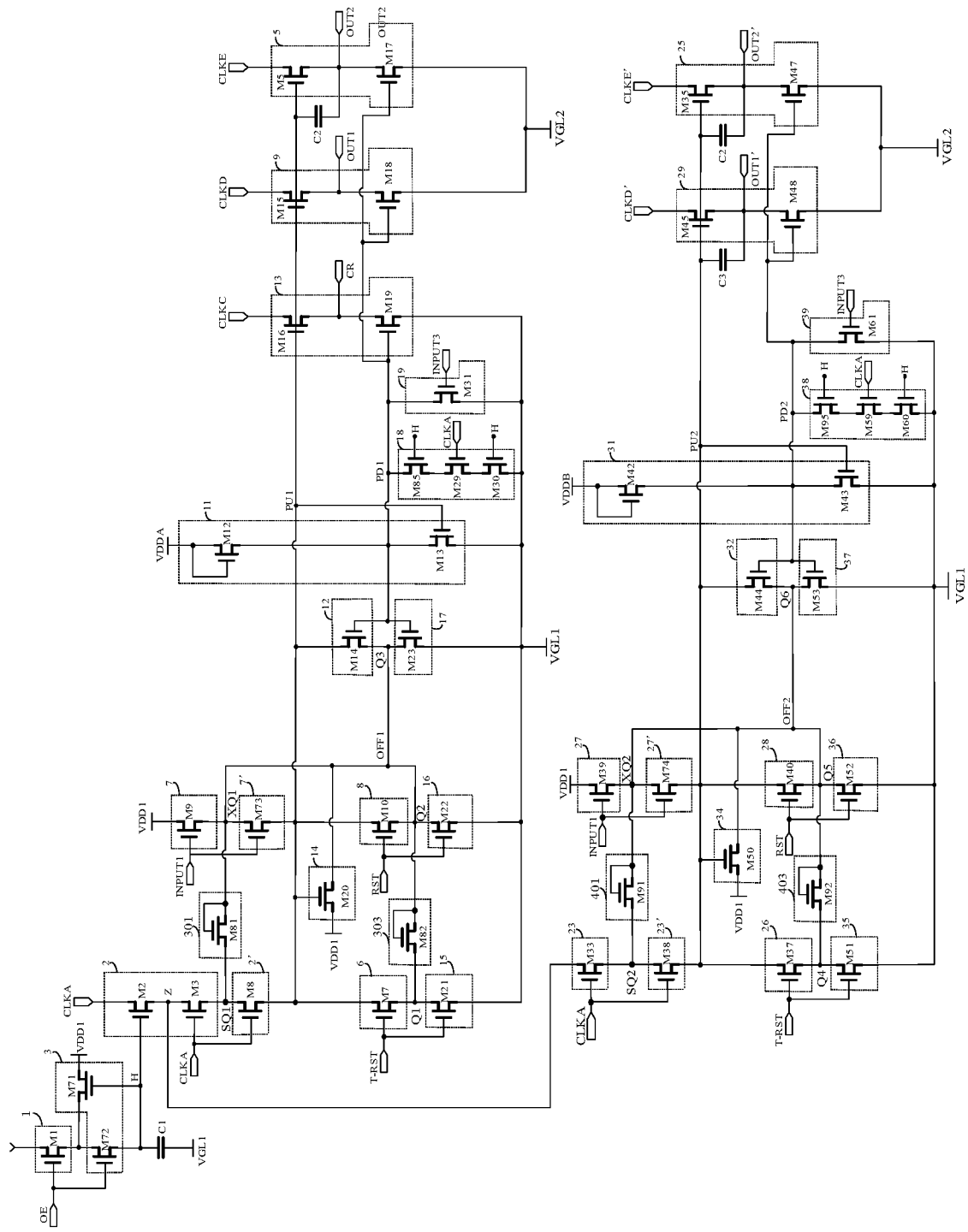
FIGS. 16A to 16D are schematic diagrams of still another four circuit structures of a shift register unit according to an embodiment of the present disclosure.
Figure 16B:
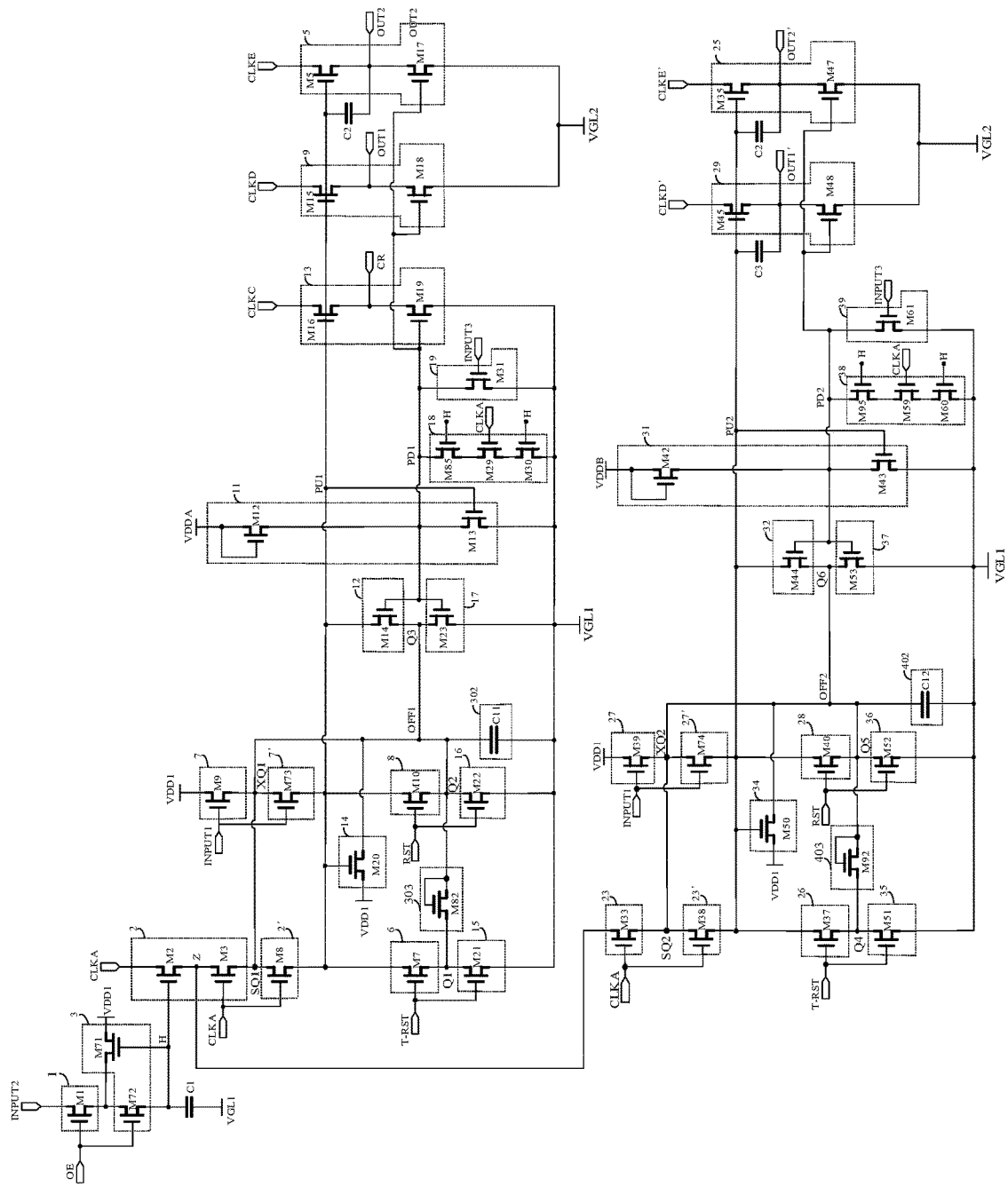

Referring to FIGS. 16A and 16B, in order to effectively improve the problem that the excessive transient current is generated at the second voltage control node OFF2 due to the switching of the level of the signal provided by the global reset signal input terminal, in some embodiments, the second current limiting circuit 400 includes: a thirteenth load circuit 403 located between fourth leakage prevention node Q4 and the second voltage control node OFF2, and configured to increase a load resistance between fourth leakage prevention node Q4 and the second voltage control node OFF2.

In some embodiments, the thirteenth load circuit 403 includes: a ninety-second transistor M92; a control electrode of the ninety-second transistor M92 is connected to the second voltage control node OFF2, a first electrode of the ninety-second transistor M92 is connected to the fourth leakage prevention node Q4, and a second electrode of the ninety-second transistor M92 is connected to the second voltage control node OFF2. At this time, the ninety-second transistor M92 may be equivalent to a diode, which does not affect the writing of the valid level signal into the fourth leakage prevention node Q4 by the second voltage control circuit, and also serves as a load resistor to limit the current.

In some embodiments, the shift register unit includes not only the second pull-up noise reduction circuit 32 but also a sixth leakage prevention circuit 37. The second pull-up noise reduction circuit 32 is connected to the second power supply terminal through the sixth leakage prevention circuit 37, the second pull-up noise reduction circuit 32 is connected to the sixth leakage prevention circuit 37 at a sixth leakage prevention node Q6 connected to the second voltage control node OFF2; the sixth leakage prevention circuit 37 is connected to the second pull-down node PD2, and is configured to form a path between the sixth leakage prevention node Q6 and the second power supply terminal in response to control of a valid level signal at the second pull-down node PD2, and to disconnect the sixth leakage prevention node Q6 from the second power supply terminal in response to control of an invalid level signal at the second pull-down node PD2.

Similar to the case with the third leakage prevention circuit 17, when the sixth leakage prevention circuit 37 is provided in the shift register unit, if a transient current is generated at the second control node OFF2, a transient current is generated between the sixth leakage prevention circuit 37 and the second power supply terminal. The clock control signal input terminal CLKA and the global reset signal input terminal T-RST are both global signal input terminals, that is, all the shift register units in the gate driving circuit are connected to the same clock control signal input terminal CLKA and the same global reset signal input terminal T-RST, so that when the level of the signal provided by the clock control signal input terminal CLKA or the global reset signal input terminal T-RST is switched, transient currents in the same direction may be simultaneously generated at the second voltage control node OFF2 in all the shift register units in the gate driving circuit, and correspondingly, transient currents in the same direction may be simultaneously generated between the sixth leakage prevention circuit 37 and the second power supply terminal in each of all the shift register units. All of the transient currents may be finally superposed on the second power supply terminal or a certain signal transmission line connected to the second power supply terminal, resulting in an extreme transient current on the second supply terminal or the certain signal transmission line connected to the second supply terminal.

In the embodiment of the present disclosure, the transient current between the sixth leakage prevention circuit 37 and the second power supply terminal can be reduced by reducing the transient current between the second voltage control node OFF2 and the sixth leakage prevention node in the shift register unit. For example, as shown in FIGS. 16A and 16B, by providing at least one of the ninety first transistor, the ninety-second transistor M92 and the twelfth capacitor C12, the transient current between the second voltage control node OFF2 and the third leakage prevention node Q3 can be effectively reduced. The schemes shown in FIGS. 16A and 16B can improve the problem of the excessive transient current at the second power supply terminal due to the switching of the level of the signal provided by the clock control signal input terminal CLKA or the global reset signal input terminal T-RST.

Figure 16C:
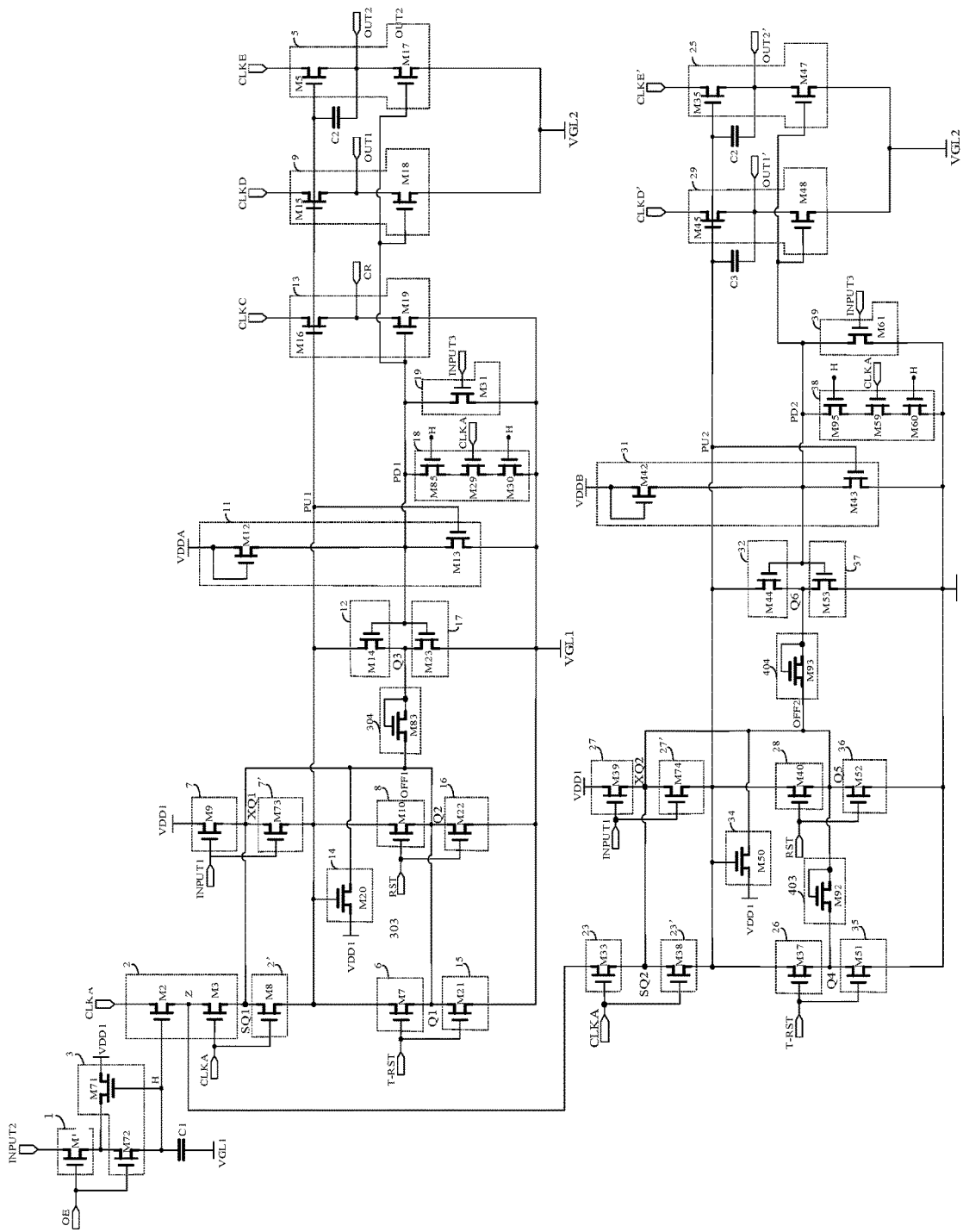
Figure 16D:
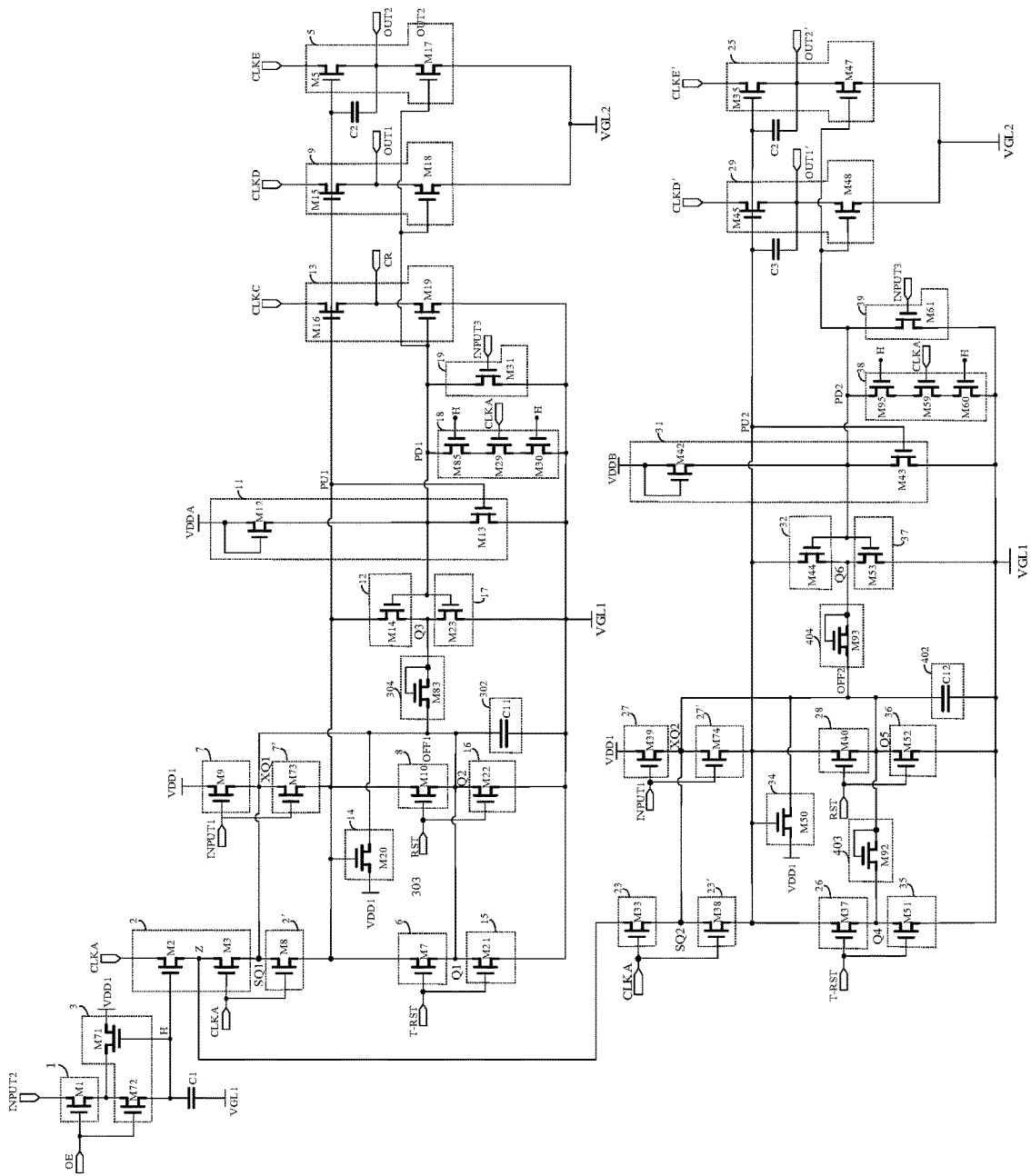

Unlike in FIGS. 16A and 16B, the second current limiting circuit 400 as shown in FIGS. 16C and 16D includes: a fourteenth load circuit 404 located between the second voltage control node OFF2 and the sixth leakage prevention node Q6 and configured to increase the load resistance between the second voltage control node OFF2 and the sixth leakage prevention node Q6.

In some embodiments, the fourteenth load circuit 404 includes: a ninety-third transistor M93; a control electrode of the ninety-third transistor M93 is connected to the second voltage control node OFF2, a first electrode of the ninety-third transistor M93 is connected to the second voltage control node OFF2, and a second electrode of the ninety-third transistor M93 is connected to the sixth leakage prevention node Q6. At this time, the ninety third transistor M93 may be equivalent to a diode, which does not affect the writing of the valid level signal into the sixth leakage prevention node Q6 by the second voltage control circuit 34, and also serves as a load resistor to limit the current.

It should be noted that in the embodiment of the present disclosure, the second current limiting circuit 400 may selectively include at least one of the eleventh load circuit 401 (the ninety first transistor M91), the twelfth load circuit 402 (the twelfth capacitor C12), the thirteenth load circuit 403 (the ninety-second transistor M92), and the fourteenth load circuit 404 (the ninety third transistor M93), which may all effectively improve the problem of the excessive transient current at the second power supply terminal due to the switching of the level of the signal provided by the clock control signal input terminal CLKA or the global reset signal input terminal T-RST.

Figure 16E:
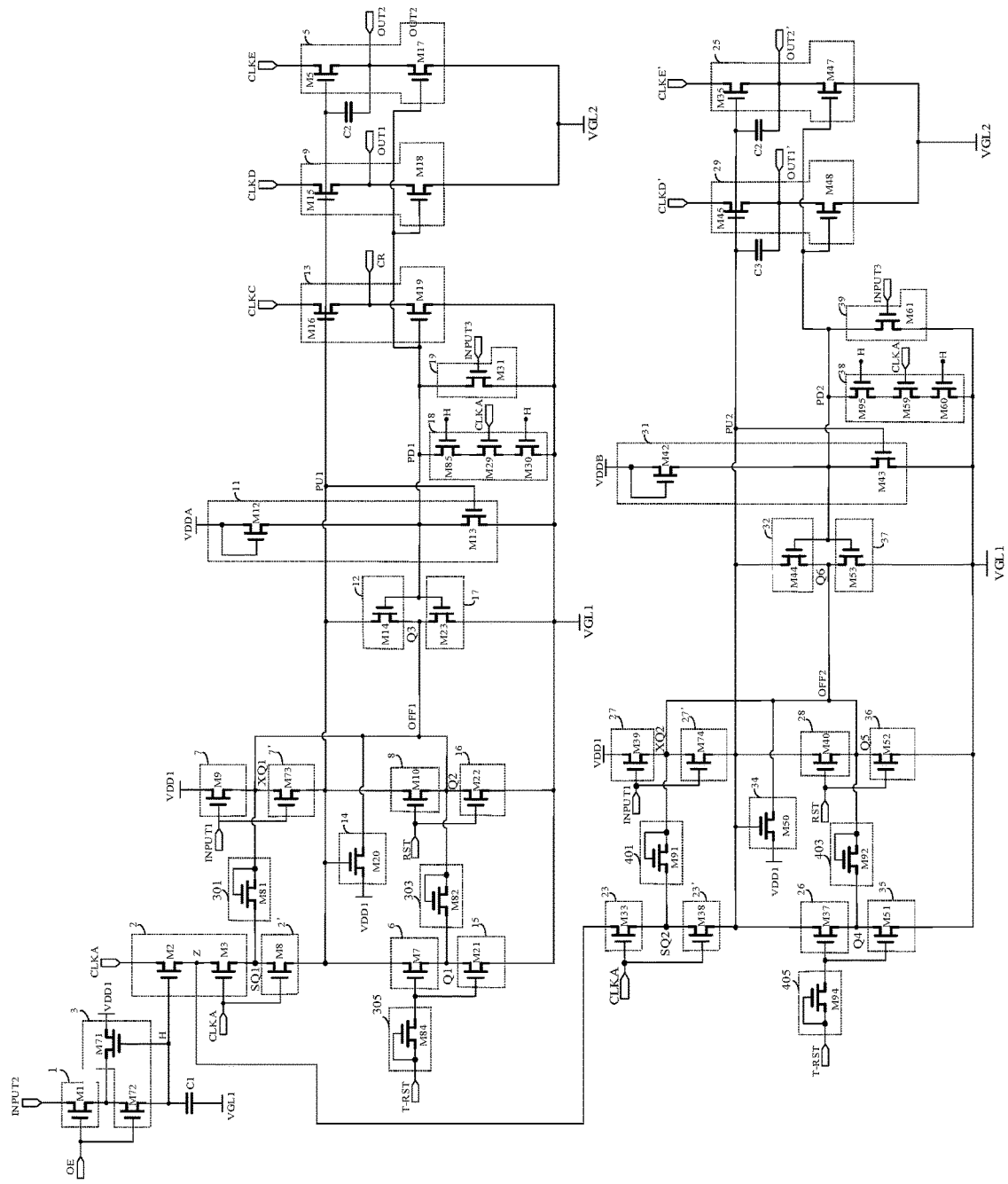
FIG. 16E is a schematic diagram of another circuit structure of a shift register unit according to an embodiment of the present disclosure.

FIG. 16E is a schematic diagram of another circuit structure of a shift register unit according to an embodiment of the present disclosure. As shown in FIG. 16E, unlike the previous embodiment, the shift register unit shown in FIG. 16E includes a fifteenth load circuit 405; at least one of the second global reset circuit 26 and the fourth leakage prevention circuit 35 is connected to the global reset signal input terminal T-RST through the fifteenth load circuit 405; the fifteenth load circuit 405 is configured to increase a load resistance between the global reset signal input terminal T-RST and at least one of the second global reset circuit 26 and the fourth leakage prevention circuit 35.

By taking the case as an example where the second global reset circuit 26 and the fourth leakage prevention circuit 35 are both connected to the global reset signal input terminal T-RST through the fifteenth load circuit 405, by providing the fifteenth load circuit 405 to increase the load resistance between the global reset signal input terminal T-RST and each of the second global reset circuit 26 and the fourth leakage prevention circuit 35, the transient current between the global reset signal input terminal T-RST and each of the second global reset circuit 26 and the fourth leakage prevention circuit 35 may be smaller when the level of the signal provided by the global reset signal input terminal T-RST is switched, so that the transient current between the fourth leakage prevention circuit 35 and the second voltage control node may be smaller.

In some embodiments, the fifteenth load circuit 405 includes: a ninety-fourth transistor M94; a control electrode of the ninety-fourth transistor M94 is connected to the global reset signal input terminal T-RST, a first electrode of the ninety-fourth transistor M94 is connected to the global reset signal input terminal T-RST, and a second electrode of the ninety-fourth transistor M94 is connected to at least one of the first global reset circuit and the fourth leakage prevention circuit 35.

It should be noted that the fifteenth load circuit 405 in FIG. 12G may be selectively provided as needed in the shift register unit shown in the previous embodiments (for example, the shift register unit shown in FIGS. 16B to 16D), which belongs to the protection scope of the present disclosure.

With continued reference to FIGS. 12A to 12D and 12G, in some embodiments, the shift register unit further includes: at least one of a second display input leakage prevention circuit 27' and a fifth leakage prevention circuit.

The second display input circuit 27 is connected to the second pull-up node through the second display input leakage prevention circuit 27', the second display input circuit 27 is connected to the second display input leakage prevention circuit 27' at a second display input leakage prevention node XQ2 connected to the second voltage control node; the second display input leakage prevention circuit 27' is connected to the display signal input terminal INPUT1, and is configured to form a path between the second display input leakage prevention node XQ2 and the second pull-up node PU2 in response to control of a valid level signal provided by the second display input leakage prevention node, and to disconnect the second display input leakage prevention node XQ2 from the second pull-up node PU2 in response to control of an invalid level signal provided by the second display input leakage prevention node.

The second display reset circuit 28 is connected to the second power supply terminal through the fifth leakage prevention circuit 36, the second display reset circuit 28 is connected to the fifth leakage prevention circuit 36 at a fifth leakage prevention node Q5 connected to the second voltage control node OFF2; the fifth leakage prevention circuit 36 is connected to the display reset signal input terminal RST, and is configured to form a path between the fifth leakage prevention node Q5 and the second power supply terminal in response to control of a valid level signal provided by the display reset signal input terminal RST, and to disconnect the fifth leakage prevention node Q5 from the second power supply terminal in response to control of an invalid level signal provided by the display reset signal input terminal RST.

In some embodiments, the fourth leakage prevention circuit 35 includes a fifty-first transistor M51; a control electrode of the fifty-first transistor M51 is connected to the sensing reset signal input terminal T-RST, a first electrode of the fifty-first transistor M51 is connected to the sensing reset circuit and the second voltage control node OFF2, and a second electrode of the fifty-first transistor M51 is connected to the second power supply terminal.

In some embodiments, the fifth leakage prevention circuit 36 includes a fifty-second transistor M52; a control electrode of the fifty-second transistor M52 is connected to the display reset signal input terminal RST, a first electrode of the fifty-second transistor M52 is connected to the display reset circuit and the second voltage control node OFF2, and a second electrode of the fifty-second transistor M52 is connected to the second power supply terminal.

In some embodiments, the sixth leakage prevention circuit 37 includes: a fifty-third transistor M53; a control electrode of the fifty-third transistor M53 is connected to the second pull-down node PD2, a first electrode of the fifty-third transistor M53 is connected to the second pull-down control circuit and the second voltage control node OFF2, and a second electrode of the fifty-third transistor M53 is connected to the second power supply terminal.

In some embodiments, the second display input leakage prevention circuit 27' includes: a seventy-fourth transistor M74; a control electrode of the seventy-fourth transistor M74 is connected to the display signal input terminal INPUT1, a first electrode of the seventy-fourth transistor M74 is connected to the second display input leakage prevention node XQ2, and a second electrode of the seventy-fourth transistor M74 is connected to the second pull-up node PU2.

With continued reference to FIGS. 16A to 16E, in some embodiments, the shift register unit further includes: a third pull-down noise reduction circuit 38 connected to the second pull-down node PD2, the second power supply terminal, the sensing control node H, and the clock control signal input terminal CLKA, and configured to write an invalid level signal provided by the second power supply terminal to the second pull-down node PD2 in response to control of a valid level signal at the sensing control node H and a valid level signal provided by the clock control signal input terminal CLKA, to reduce noise of the voltage at the first pull-down node PD2.

In some embodiments, the third pull-down noise reduction circuit 38 includes: a fifty-ninth transistor M59 and a sixtieth transistor M60; a control electrode of the fifty-ninth transistor M59 is connected to the clock control signal input terminal CLKA, a first electrode of the fifty-ninth transistor M59 is connected to the second pull-down node PD2, and a second electrode of the fifty-ninth transistor M59 is connected to a first electrode of the sixtieth transistor M60; a control electrode of the sixtieth transistor M60 is connected to the sensing control node H, and a second electrode of the sixtieth transistor M60 is connected to the second power supply terminal.

It is found in practical applications that when the level of the signal provided by the clock control signal input terminal CLKA is switched, the voltage at the second pull-down node PD2 may drift due to the influence of a coupling capacitor between a gate electrode and a source/drain electrode of the fifty-ninth transistor M59, and thus, there is a risk of abnormal operation of the shift register unit.

To avoid the voltage at the second pull-down node PD2 being affected by the switching of the level of the signal provided by the clock control signal input terminal CLKA, in some embodiments, the third pull-down noise reduction circuit 38 preferably further includes: a ninety-fifth transistor M95; the first electrode of the fifty-ninth transistor M59 is connected to the second pull-down node PD2 through the ninety-fifth transistor M95; a control electrode of the ninety-fifth transistor M95 is connected to the sensing control node H, a first electrode of the ninety-fifth transistor M95 is connected to the second pull-down node PD2, and a second electrode of the ninety-fifth transistor M95 is connected to the first electrode of the fifty-ninth transistor M59.

In some embodiments, the shift register unit further includes a fourth pull-down noise reduction circuit 39 connected to the second pull-down node PD2, the second power supply terminal, and the pull-down noise reduction signal input terminal INPUT3, and configured to write an invalid level signal provided by the second power supply terminal to the second pull-down node PD2 in response to control of a valid level signal provided by the pull-down noise reduction signal input terminal INPUT3, to reduce noise of the voltage at the second pull-down node PD2.

In some embodiments, a control electrode of the sixty-first transistor M61 is connected to the pull-down noise reduction signal input terminal INPUT3, a first electrode of the sixty-first transistor M61 is connected to the second pull-down node PD2, and a second electrode of the sixty-first transistor M61 is connected to the second power supply terminal.

Figure 17:
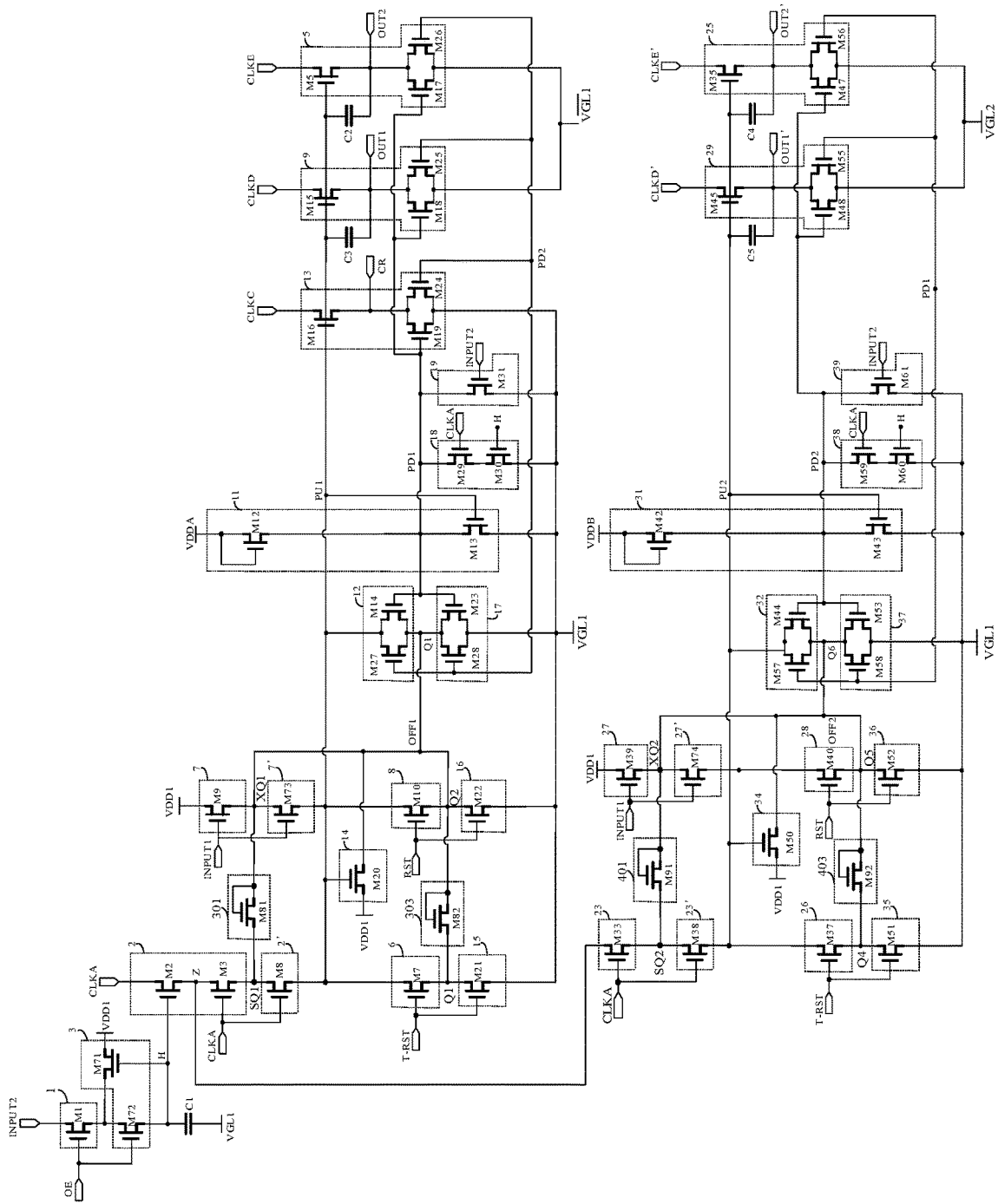
FIG. 17 is a schematic diagram of another circuit structure of a shift register unit according to an embodiment of the present disclosure.

FIG. 17 is a schematic diagram of another circuit structure of a shift register unit according to an embodiment of the present disclosure. As shown in FIG. 17, when the shift register unit includes both the first pull-down node PD1 and the second pull-down node PD2, in some embodiments, the third leakage prevention circuit 17, the first pull-up noise reduction circuit 12, the first cascade output circuit 13, the first driving output circuit 5, and the second driving output circuit 9 are also connected to the second pull-down node PD2.

The third leakage prevention circuit 17 is further configured to write an invalid level signal to the third leakage prevention node in response to control of a valid level signal at the second pull-down node PD2. Optionally, the third leakage prevention circuit 17 includes a twenty-third transistor M23 and a twenty-eighth transistor M28, wherein a control electrode of the twenty-third transistor M23 is connected to the first pull-down node PD1, and a control electrode of the twenty-eighth transistor M28 is connected to the second pull-down node PD2.

The first pull-up noise reduction circuit 12 is further configured to write an invalid level signal to the first pull-up node PU1 in response to control of a valid level signal at the second pull-down node PD2. Optionally, the first pull-up noise reduction circuit 12 includes a fourteenth transistor M14 and a twenty-seventh transistor M27, wherein a control electrode of the fourteenth transistor M14 is connected to the first pull-down node PD1, and a control electrode of the twenty-seventh transistor M27 is connected to the second pull-down node PD2.

The first cascade output circuit 13 is further configured to write an invalid level signal to the first cascade signal output terminal CR in response to control of a valid level signal at the second pull-down node PD2. Optionally, the first cascade output circuit 13 includes a nineteenth transistor M19 and a twenty-fourth transistor M24, wherein a control electrode of the nineteenth transistor M19 is connected to the first pull-down node PD1, and a control electrode of the twenty-fourth transistor M24 is connected to the second pull-down node PD2.

The first driving output circuit 5 is further configured to write an invalid level signal to the first driving signal output terminal OUT2 in response to control of a valid level signal at the second pull-down node PD2. Optionally, the first driving output circuit 5 further includes a seventeenth transistor M17 and a twenty sixth transistor M26, wherein a control electrode of the seventeenth transistor M17 is connected to the first pull-down node PD1, and a control electrode of the twenty sixth transistor M26 is connected to the second pull-down node PD2.

The second driving output circuit 9 is further configured to write an invalid level signal to the second driving signal output terminal OUT1 in response to control of a valid level signal at the second pull-down node PD2. Optionally, the second driving output circuit 9 further includes an eighteenth transistor M18 and a twenty-fifth transistor M25, wherein a control electrode of the eighteenth transistor M18 is connected to the first pull-down node PD1, and a control electrode of the twenty-fifth transistor M25 is connected to the second pull-down node PD2.

In some embodiments, the sixth leakage prevention circuit 37, the second pull-up noise reduction circuit 32, the third driving output circuit 25, and the fourth driving output circuit 29 are connected to the first pull-down node PD1.

The sixth leakage prevention circuit 37 is further configured to write an invalid level signal to the sixth leakage prevention node Q6 in response to control of a valid level signal at the first pull-down node PD1. Optionally, the sixth leakage prevention circuit 37 includes a fifty-third transistor M53 and a fifty-eighth transistor M58, wherein a control electrode of the fifty-third transistor M53 is connected to the second pull-down node PD2, and a control electrode of the fifty-eighth transistor M58 is connected to the first pull-down node PD1.

The second pull-up noise reduction circuit 32 is further configured to write an invalid level signal to the second pull-up node PU2 in response to control of a valid level signal at the first pull-down node PD1. Optionally, the second pull-up noise reduction circuit 32 includes a forty-fourth transistor M44 and a fifty-seventh transistor M57, wherein a control electrode of the forty-fourth transistor M44 is connected to the second pull-down node PD2, and a control electrode of the fifty-seventh transistor M57 is connected to the first pull-down node PD1.

The third driving output circuit 25 is further configured to write an invalid level signal to the third driving signal output terminal in response to control of a valid level signal at the first pull-down node PD1. Optionally, the third driving output circuit 25 further includes a forty-seventh transistor M47 and a fifty-sixth transistor M56, wherein a control electrode of the forty-seventh transistor M47 is connected to the second pull-down node PD2, and a control electrode of the fifty-sixth transistor M56 is connected to the first pull-down node PD1.

The fourth driving output circuit 29 is further configured to write an invalid level signal to the fourth driving signal output terminal in response to control of a valid level signal at the first pull-down node PD1. Optionally, the fourth driving output circuit 29 further includes a forty-eighth transistor M48 and a fifty-fifth transistor M55, wherein a control electrode of the forty-eighth transistor M48 is connected to the second pull-down node PD2, and a control electrode of the fifty-fifth transistor M55 is connected to the first pull-down node PD1.

It should be noted that the shift register units shown in the above embodiments may all adopt the timing shown in FIG. 11, and the specific operation is not described herein again.

In addition, different circuit structure portions in different embodiments in the present disclosure may be combined with each other, and a new technical solution obtained by the combination also belongs to the protection scope of the present disclosure.

In addition, in practical applications, an inductor may be disposed between each power supply terminal (especially the second power supply terminal) and the gate driving circuit (an output terminal of a power management integrated circuit (PMIC) is generally used to provide the display substrate with a power supply voltage and used as a power supply terminal of the gate driving circuit, so that the inductor disposed at the power supply terminal may be disposed at the corresponding output terminal of the PMIC, and the power supply voltage output from the output terminal is transmitted through the inductor to the gate driving circuit), and an inductor is disposed between each of the first/second clock signal input terminals and the gate driving circuit (an output terminal of a level shifter is generally used to provide a clock signal to the gate driving circuit, so that the inductor disposed at the clock signal input terminal may be disposed at the corresponding output terminal of the level shifter, and the clock signal output from the output terminal is transmitted through the inductor to the gate driving circuit). By providing the inductors between each power supply terminal and the gate driving circuit and between each clock signal input terminal and the gate driving circuit, the transient current at each power supply terminal and each clock signal input terminal can be effectively reduced.

Figure 18:
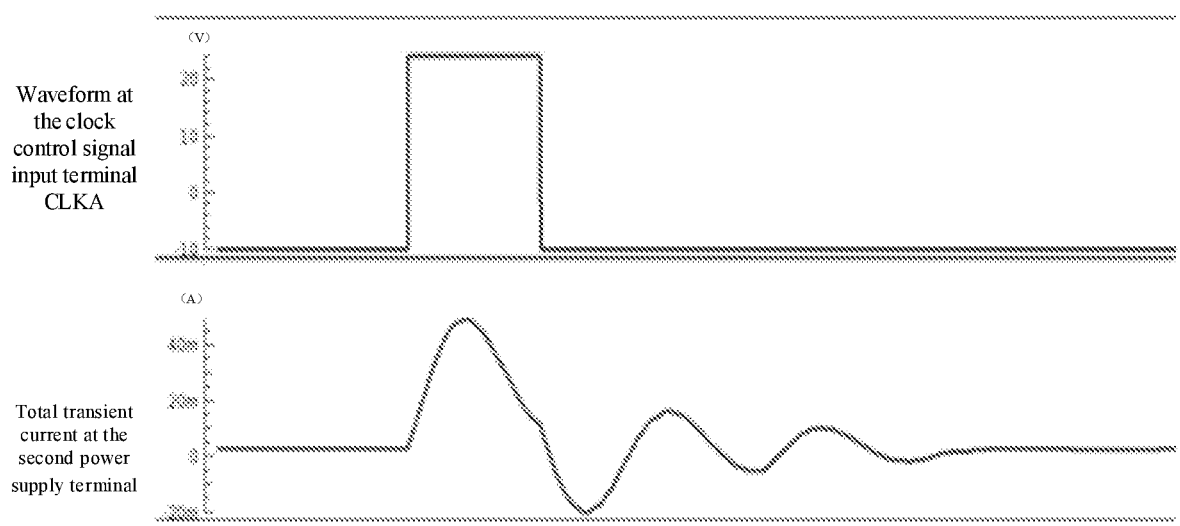
FIG. 18 is a simulation diagram illustrating a current change at a second power supply terminal with an inductor between an output terminal as the second power supply terminal on a power supply management chip and a gate driving circuit according to an embodiment of the present disclosure.

FIG. 18 is a simulation diagram of a current change at a second power supply terminal with an inductor between an output terminal as the second power supply terminal on a power supply management chip and a gate driving circuit according to an embodiment of the present disclosure. As shown in FIG. 18, with the inductor disposed between the output terminal of the power management integrated circuit as the second power supply terminal and the gate driving circuit, when the level of the signal provided by the clock control signal input terminal CLKA is switched, the current peak value of the transient current at the second power supply terminal is about 47 mA, which is much smaller than the current peak values of 0.42 A and 0.28 A at the second power supply terminal shown in FIGS. 12E and 12F. Therefore, by additionally providing the inductor, the current change at the second power supply terminal can be effectively slowed down, and the current peak value of the transient current can be reduced.

Figure 19:
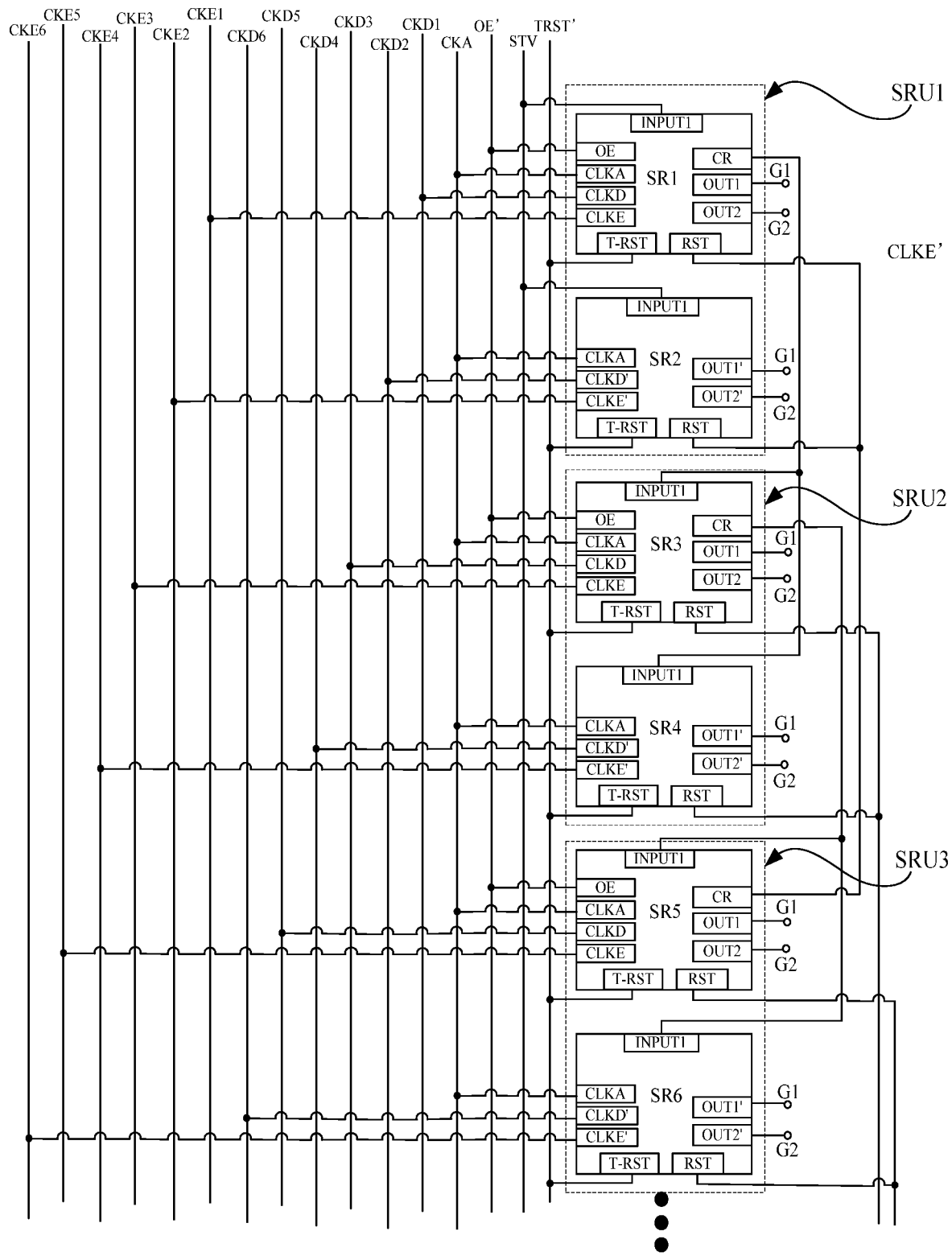
FIG. 19 is a schematic diagram of a circuit structure of a gate driving circuit according to an embodiment of the present disclosure.
Figure 20:
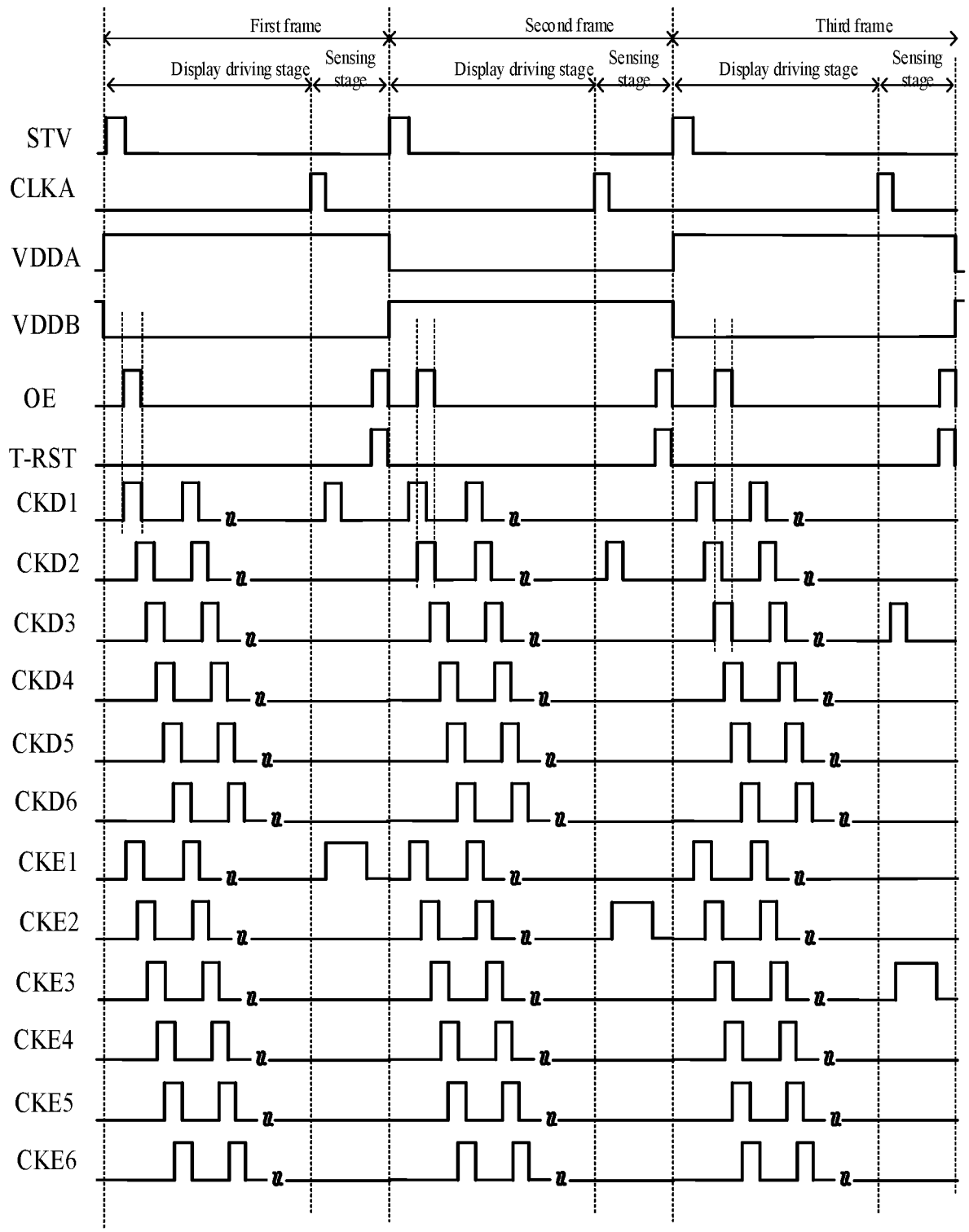
FIG. 20 is a timing diagram illustrating operation of the gate driving circuit shown in FIG. 19.

FIG. 19 is a schematic diagram of a circuit structure of a gate driving circuit according to an embodiment of the present disclosure. FIG. 20 is a timing diagram illustrating operation of the gate driving circuit shown in FIG. 19. As shown in FIGS. 19 and 20, the gate driving circuit includes a plurality of cascaded shift register units SRU1 to SRU3, where the shift register units SRU1 to SRU3 may adopt the shift register units provided in any of the foregoing embodiments. For specific description of the shift register units, reference may be made to the contents in the foregoing embodiments, and details are not repeated here.

In some embodiments, each of the shift register units SRU1 to SRU3 is configured to drive a gate line corresponding to two rows of pixel units, that is, each shift register unit includes the first driving output circuit 5, the second driving output circuit 9, the third driving output circuit 25, the fourth driving output circuit 29 and the first cascade output circuit 13. At this time, each stage of the shift register units SRU1 to SRU3 may be regarded as two shift register circuits. For example, the shift register unit SRU1 includes shift register circuits SR1 and SR2, the shift register unit SRU2 includes shift register circuits SR3 and SR4, and the shift register unit SRU3 includes shift register circuits SR5 and SR6.

As an example, 2N rows of pixel units are disposed in the display panel, N cascaded shift register units may be disposed in the gate driving circuit, and may be regarded as 2N cascaded shift register circuit; wherein an odd-numbered shift register circuit SR2$n$-1 is configured with the sensing signal input terminal INPUT2, the random signal input terminal OE, and the cascade signal output terminal CR, and an even-numbered shift register circuit SR2$n$ is not configured with the sensing signal input terminal INPUT2 and the first cascade signal output terminal CR, wherein 1≤n≤N and n is an integer.

The case of the 3 stage shift register units SRU1 to SRU3 (6 stage shift register circuits SR1 to SR6) is merely exemplarily shown in FIG. 19, which is merely for illustrative purposes.

In some embodiments, the sensing signal input terminal INPUT2 of each stage of the shift register units SRU1 to SRU3 is connected to the first cascade signal output terminal CR configured for the shift register unit; the clock control signal input terminal CLKA of each stage of the shift register units SRU1 to SRU3 is connected to the clock control signal line CKA; the global reset signal input terminal T-RST of each stage of the shift register units SRU1 to SRU3 is connected to the global reset signal input line TRST'; and the random signal input terminal OE of each stage of the shift register units is connected to the random signal input line OE'.

In some embodiments, in any one shift register unit except for the shift register units located in previous a stages, a sensing valid level supply terminal of the shift register unit is connected to the first pull-up node in one shift register unit located in its previous a stages; or, in any one stage of the shift register unit except for the shift register units located in last a stages, a sensing valid level supply terminal of the shift register unit is connected to the first pull-up node in one shift register unit located in a stages after the shift register unit; where a is a positive integer (e.g., a is 1). That is to say, the shift register unit in the present stage may charge the first sensing control node in the shift register unit in the present stage by a voltage at the first pull-up node in one shift register unit located in its previous a stages or a stages after the shift register unit.

Alternatively, in the embodiment of the present disclosure, the sensing signal input terminal of the shift register unit may further be connected to other terminals. For example, the sensing signal input terminal of the shift register unit in the present stage is connected to the cascade signal output terminal of in a shift register unit located in its previous b stages or b stages after the shift register unit (b is a positive integer).

The technical scheme of the present disclosure does not limit the terminals connected to the sensing signal input terminal of the shift register unit. Alternatively, in order to ensure that the sensing signal input terminal has a better charging capability, preferably, the sensing signal input terminal is connected to a third power supply terminal.

The display signal input terminal INPUT1 of the first stage of the shift register unit SRU1 is connected to a frame start signal input terminal STV. In any one stage of the shift register unit except for the first stage of the shift register unit SRU1, the display signal input terminal INPUT1 of the shift register unit is connected to the first cascade signal output terminal CR of its previous stage of the shift register unit; the global reset signal input terminal T-RST of each stage of shift register unit is connected to the global reset signal line; the display reset signal input terminal RST of the shift register unit in the Nth stage and the display reset signal input terminal RST of the shift register unit in the (N−1)th stage are connected to a frame ending reset signal line; in any one stage of the shift register unit except for the shift register unit in the Nth stage and the shift register unit in the (N−1)th stage, the display reset signal input terminal RST of the shift register unit is connected to the first cascade signal output terminals CR of the shift register units at the two stages after the shift register unit.

Alternatively, in practical applications, the specific cascading manner may be adjusted according to actual needs.

In some embodiments, 6 first driving clock signal lines CKE1 to CKE6 and 6 second driving clock signal lines CKD1 to CKD6 are provided for the gate driving circuit;

The first driving clock signal input terminal CLKE of the (3$i$+1)th stage shift register unit SRU3$i$+1 is connected to the first driving clock signal line CKE1; the second driving clock signal input terminal CLKD of the (3$i$+1)th stage shift register unit SRU3$i$+1 is connected to the second driving clock signal line CKD1; the third driving clock signal input terminal CLKE' of the (3$i$+1)th stage shift register unit SRU3$i$+1 is connected to the second driving clock signal line CKE2; the fourth driving clock signal input terminal CLKD' of the (3$i$+1)th stage shift register unit SRU3$i$+1 is connected to the second driving clock signal line CKD2; and the cascade clock signal input terminal (not shown in FIG. 19) of the (3$i$+1)th stage shift register unit SRU3$i$+1 is connected to the second driving clock signal line CKD2.

The first driving clock signal input terminal CLKE of the (3$i$+2)th stage shift register unit SRU3$i$+2 is connected to the first driving clock signal line CKE3; the second driving clock signal input terminal CLKD of the (3$i$+2)th stage shift register unit SRU3$i$+2 is connected to the second driving clock signal line CKD3; the third driving clock signal input terminal CLKE' of the (3$i$+2)th stage shift register unit SRU3$i$+2 is connected to the second driving clock signal line CKE4; the fourth driving clock signal input terminal CLKD' of the (3$i$+2)th stage shift register unit SRU3$i$+2 is connected to the second driving clock signal line CKD4; and the cascade clock signal input terminal (not shown in FIG. 19) of the (3$i$+2)th stage shift register unit SRU3$i$+2 is connected to the second driving clock signal line CKD4.

The first driving clock signal input terminal CLKE of the (3$i$+3)th stage shift register unit SRU3$i$+3 is connected to the first driving clock signal line CKE5; the second driving clock signal input terminal CLKD of the (3$i$+3)th stage shift register unit SRU3$i$+3 is connected to the second driving clock signal line CKD5; the third driving clock signal input terminal CLKE' of the (3$i$+3)th stage shift register unit SRU3$i$+3 is connected to the second driving clock signal line CKE6; the fourth driving clock signal input terminal CLKD' of the (3$i$+3)th stage shift register unit SRU3$i$+3 is connected to the second driving clock signal line CKD6; and the cascade clock signal input terminal (not shown in FIG. 19) of the (3$i$+3)th stage shift register unit SRU3$i$+3 is connected to the second driving clock signal line CKD6; where i is a positive integer and 3$i$+3≤N.

Based on the same inventive concept, an embodiment of the present disclosure further provides a display substrate, where the display substrate includes a base substrate and a gate driving circuit located on the base substrate, where the gate driving circuit may adopt the gate driving circuit provided in the foregoing embodiments. For specific description of the gate driving circuit, reference may be made to the contents in the foregoing embodiments, and details are not repeated here.

In some embodiments, the gate driving circuit is formed on the display substrate by using a GOA (gate on array), and the display substrate may specifically be an array substrate.

Based on the same inventive concept, an embodiment of the present disclosure further provides a display apparatus, including the display panel provided in the foregoing embodiments. For specific description of the display panel, reference may be made to the contents in the foregoing embodiments, and details are not repeated here.

The display apparatus provided by the embodiment of the present disclosure may be: any product or component with a display function, such as a liquid crystal display screen, a wearable device, a mobile phone, a tablet personal computer, a television, a display, a notebook computer, a digital photo frame, a navigator and the like. Other essential components of the display apparatus are understood by one of ordinary skill in the art, and are not described herein and should be construed as limiting the present disclosure.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register unit, comprising:
a first sensing control input circuit connected to a sensing control node, a sensing signal input terminal, a random signal input terminal, a clock control signal input terminal, and a first pull-up node; and configured to write a signal from the sensing signal input terminal to the sensing control node in response to control of a valid level signal from the random signal input terminal, and write a valid level signal to the first pull-up node in response to control of a valid level signal at the sensing control node and a valid level signal from the clock control signal input terminal; and
at least one first output circuit, each of which is connected to the first pull-up node, a first clock signal input terminal, and a first signal output terminal; and configured to write a signal from the first clock signal input terminal to the first signal output terminal in response to control of a valid level signal at the first pull-up node;
wherein the shift register unit further comprises: a first voltage control circuit, a first sensing input leakage prevention circuit and a first current limiting circuit;
the first voltage control circuit is connected to a first power supply terminal, the first pull-up node and a first voltage control node, and is configured to write a valid level signal from the first power supply terminal to the first voltage control node in response to control of a valid level signal at the first pull-up node;
the first sensing control input circuit is connected to the first pull-up node through the first sensing input leakage prevention circuit, the first sensing control input circuit is connected to the first sensing input leakage prevention circuit at a first sensing input leakage prevention node connected to the first voltage control node, the first sensing input leakage prevention circuit is connected to the clock control signal input terminal and is configured to form a path between the first sensing input leakage prevention node and the first pull-up node in response to control of a valid level signal at the clock control signal input terminal, and to disconnect the first sensing input leakage prevention node from the first pull-up node in response to control of an invalid level signal at the clock control signal input terminal; and
the first current limiting circuit is connected to the first voltage control node.

2. The shift register unit of claim 1, wherein the first current limiting circuit comprises:
a first load circuit between the first sensing input leakage prevention node and the first voltage control node; and configured to increase a load resistance between the first sensing input leakage prevention node and the first voltage control node;
the first load circuit comprises: an eighty-first transistor; and
a control electrode of the eighty-first transistor is connected to the first voltage control node, a first electrode of the eighty-first transistor is connected to the first sensing input leakage prevention node, and a second electrode of the eighty-first transistor is connected to the first voltage control node.

3. The shift register unit of claim 1, wherein the first current limiting circuit comprises:
a second load circuit connected to the first voltage control node and a second power supply terminal; and configured to increase a load capacitance at the first voltage control node;
wherein the second load circuit comprises: an eleventh capacitor; and
a first terminal of the eleventh capacitor is connected to the first voltage control node, and a second terminal of the eleventh capacitor is connected to the second power supply terminal.

4. The shift register unit of claim 1, further comprising:
a first global reset circuit connected to a global reset signal input terminal, a second power supply terminal and the first pull-up node, and configured to write an invalid level signal from the second power supply terminal to the first pull-up node in response to control of a valid level signal from the global reset signal input terminal; and
a first leakage prevention circuit; wherein the first global reset circuit is connected to the second power supply terminal through the first leakage prevention circuit; the first global reset circuit is connected to the first leakage prevention circuit at a first leakage prevention node connected to the first voltage control node; the first leakage prevention circuit is connected to the global reset signal input terminal and is configured to form a path between the first leakage prevention node and the second power supply terminal in response to control of a valid level signal from the global reset signal input terminal, and to disconnect the first leakage prevention node from the second power supply terminal in response to control of an invalid level signal from the global reset signal input terminal;
wherein the first current limiting circuit comprises:
a third load circuit between the first leakage prevention node and the first voltage control node, and configured to increase a load resistance between the first leakage prevention node and the first voltage control node;
wherein the third load circuit comprises: an eighty-second transistor; and
a control electrode of the eighty-second transistor is connected to the first voltage control node, a first electrode of the eighty-second transistor is connected to the first leakage prevention node, and a second electrode of the eighty-second transistor is connected to the first voltage control node;
the shift register unit further comprises:
a fifth load circuit, wherein at least one of the first global reset circuit and the first leakage prevention circuit is connected to the global reset signal input terminal through the fifth load circuit, the fifth load circuit is configured to increase a load resistance between the global reset signal input terminal and at least one of the first global reset circuit and the first leakage prevention circuit; and
wherein the fifth load circuit comprises: an eighty-fourth transistor; and
a control electrode of the eighty-fourth transistor is connected to the global reset signal input terminal, a first electrode of the eighty-fourth transistor is connected to the global reset signal input terminal, and a second electrode of the eighty-fourth transistor is connected to at least one of the first global reset circuit and the first leakage prevention circuit.

5. The shift register unit of claim 1, further comprising:
a first pull-down control circuit connected to a second power supply terminal, a fifth power supply terminal, the first pull-up node, and a first pull-down node, and configured to write a voltage having a phase opposite to that of a voltage at the first pull-up node to the first pull-down node; and
a first pull-up noise reduction circuit connected to the second power supply terminal, the first pull-up node, and the first pull-down node, and configured to write an invalid level signal from the second power supply terminal to the first pull-up node in response to control of a valid level signal at the first pull-down node;
wherein the first output circuit is further connected to the first pull-down node and the second power supply terminal, and is further configured to write an invalid level signal from the second power supply terminal to the first signal output terminal in response to control of a valid level signal at the first pull-down node;
the shift register unit further comprises:
a third leakage prevention circuit; wherein the first pull-up noise reduction circuit is connected to the second power supply terminal through the third leakage prevention circuit; the first pull-up noise reduction circuit is connected to the third leakage prevention circuit at a third leakage prevention node connected to the first voltage control node; the third leakage prevention circuit is connected to the first pull-down node, and is configured to form a path between the third leakage prevention node and the second power supply terminal in response to control of a valid level signal at the first pull-down node, and to disconnect the third leakage prevention node from the second power supply terminal in response to control of an invalid level signal at the first pull-down node;
the first voltage control node is between the first sensing input leakage prevention node and the third leakage prevention node; and
the first current limiting circuit comprises:
a fourth load circuit between the first voltage control node and the third leakage prevention node, and configured to increase a load resistance between the first voltage control node and the third leakage prevention nod; and
the fourth load circuit comprises: an eighty-third transistor; and
a control electrode of the eighty-third transistor is connected to the first voltage control node, a first electrode of the eighty-third transistor is connected to the first voltage control node, and a second electrode of the eighty-third transistor is connected to the third leakage prevention node.

6. The shift register unit of claim 1, further comprising:
a first pull-down noise reduction circuit connected to a first pull-down node, a second power supply terminal, the sensing control node and the clock control signal input terminal, and configured to write an invalid level signal from the second power supply terminal to the first pull-down node in response to control of a valid level signal at the sensing control node and a valid level signal from the clock control signal input terminal;
wherein the first pull-down noise reduction circuit comprises: a twenty-ninth transistor and a thirtieth transistor;
a control electrode of the twenty-ninth transistor is connected to the clock control signal input terminal, a first electrode of the twenty-ninth transistor is connected to the first pull-down node, and a second electrode of the twenty-ninth transistor is connected to a first electrode of the thirtieth transistor; and
a control electrode of the thirtieth transistor is connected to the sensing control node, and a second electrode of the thirtieth transistor is connected to the second power supply terminal; and
wherein the first pull-down noise reduction circuit further comprises: an eighty-fifth transistor; the first electrode of the twenty-ninth transistor is connected to the first pull-down node through the eighty-fifth transistor; and
a control electrode of the eighty-fifth transistor is connected to the sensing control node, a first electrode of the eighty-fifth transistor is connected to the first pull-down node, and a second electrode of the eighty-fifth transistor is connected to the first electrode of the twenty-ninth transistor.

7. The shift register unit of claim 1, further comprising:
a first display input circuit connected to a display signal input terminal, the first power supply terminal, and the first pull-up node, and configured to write a valid level signal from the first power supply terminal to the first pull-up node in response to control of a valid level signal from the display signal input terminal; and
a first display reset circuit connected to a display reset signal input terminal, a second power supply terminal and the first pull-up node; and configured to write an invalid level signal from the second power supply terminal to the first pull-up node in response to control of a valid level signal from the display reset signal input terminal;
the shift register unit further comprises at least one of a first display input leakage prevention circuit and a second leakage prevention circuit;
wherein the first display input circuit is connected to the first pull-up node through the first display input leakage prevention circuit; the first display input circuit is connected to the first display input leakage prevention circuit at a first display input leakage prevention node connected to the first voltage control node; the first display input leakage prevention circuit is connected to the display signal input terminal and is configured to form a path between the first display input leakage prevention node and the first pull-up node in response to control of a valid level signal from the display signal input terminal, and to disconnect the first display input leakage prevention node from the first pull-up node in response to control of an invalid level signal from the display signal input terminal; and
the first display reset circuit is connected to the second power supply terminal through the second leakage prevention circuit, the first display reset circuit is connected to the second leakage prevention circuit at a second leakage prevention node connected to the first voltage control node; the second leakage prevention circuit is connected to the display reset signal input terminal, and configured to form a path between the second leakage prevention node and the second power supply terminal in response to control of a valid level signal from the display reset signal input terminal, and to disconnect the second leakage prevention node from the second power supply terminal in response to control of an invalid level signal from the display reset signal input terminal.

8. The shift register unit of claim 1, wherein the first sensing control input circuit comprises: a sensing control circuit and a first sensing input circuit;

the sensing control circuit is connected to the sensing control node, the sensing signal input terminal and the random signal input terminal, and is configured to write a signal from the sensing signal input terminal to the sensing control node in response to control of a valid level signal from the random signal input terminal; and the first sensing input circuit is connected to the sensing control node, the clock control signal input terminal, a sensing intermediate node and the first pull-up node, and configured to write a valid level signal to the sensing intermediate node in response to control of a valid level signal at the sensing control node and to form a path between the sensing intermediate node and the first pull-up node in response to control of a valid level signal from the clock control signal input terminal; and the shift register unit further comprises a sensing control leakage prevention circuit;

wherein the sensing control circuit is connected to the sensing control node through the sensing control leakage prevention circuit; the sensing control leakage prevention circuit is connected to the sensing control circuit at a sensing control leakage prevention node; the sensing control leakage prevention circuit is further connected to the first power supply terminal, the sensing control node and the random signal input terminal; and configured to write a valid level signal from the first power supply terminal to the sensing control leakage prevention node in response to control of a valid level signal at the sensing control node; configured to form a path between the sensing control leakage prevention node and the sensing control node in response to control of a valid level signal from the random signal input terminal; and to disconnect the sensing control leakage prevention node from the sensing control node in response to control of an invalid level signal from the random signal input terminal.

9. The shift register unit of claim 8, further comprising:

a second sensing input circuit connected to the clock control signal input terminal, a second pull-up node and a preset power supply node, and configured to form a path between the preset power supply node and the second pull-up node in response to control of a valid level signal from the clock control signal input terminal; and at least one second output circuit, each of which is connected to the second pull-up node, a corresponding second clock signal input terminal, and a corresponding second signal output terminal, and configured to write a signal from the corresponding second clock signal input terminal to the corresponding second signal output terminal in response to control of a valid level signal at the second pull-up node;

wherein the preset power supply node is the sensing intermediate node or the first sensing input leakage prevention node.

10. The shift register unit of claim 9, wherein the preset power supply node is the first sensing input leakage prevention node;

the shift register unit further comprises: a second voltage control circuit and a second current limiting circuit;

the second voltage control circuit is connected to the first power supply terminal, the second pull-up node and a second voltage control node, and is configured to write a valid level signal from the first power supply terminal to the second voltage control node in response to control of a valid level signal at the second pull-up node; and the second current limiting circuit is connected to the second voltage control node, and is configured to reduce a charging/discharging current at the second voltage control node.

11. The shift register unit of claim 10, wherein the second current limiting circuit comprises:

an eleventh load circuit between the first sensing input leakage prevention node and the second voltage control node, and configured to increase a load resistance between the first sensing input leakage prevention node and the second voltage control node; and wherein the eleventh load circuit comprises: a ninety first transistor; and a control electrode of the ninety-first transistor is connected to the second voltage control node, a first electrode of the ninety-first transistor is connected to the second voltage control node, and a second electrode of the ninety-first transistor is connected to the first sensing input leakage prevention node.

12. The shift register unit of claim 9, wherein the preset power supply node is the sensing intermediate node;

the shift register unit further comprises: a second voltage control circuit, a second sensing input leakage prevention circuit and a second current limiting circuit;

the second voltage control circuit is connected to the first power supply terminal, the second pull-up node and the second voltage control node, and is configured to write a valid level signal from the first power supply terminal to the second voltage control node in response to control of a valid level signal at the second pull-up node;

the second sensing input circuit is connected to the second pull-up node through the second sensing input leakage prevention circuit, the second sensing input circuit is connected to the second sensing input leakage prevention circuit at a second sensing input leakage prevention node connected to the second voltage control node; the second sensing input leakage prevention circuit is connected to the clock control signal input terminal and is configured to form a path between the second sensing input leakage prevention node and the second pull-up node in response to control of a valid level signal at the clock control signal input terminal, and to disconnect the second sensing input leakage prevention node from the second pull-up node in response to control of an invalid level signal at the clock control signal input terminal; and the second current limiting circuit is connected to the second voltage control node, and is configured to reduce a charging/discharging current at the second voltage control node;

wherein the second current limiting circuit comprises:

an eleventh load circuit between the second sensing input leakage prevention node and the second voltage control node, and configured to increase a load resistance between the second sensing input leakage prevention node and the second voltage control node; and wherein the eleventh load circuit comprises: a ninety first transistor; and a control electrode of the ninety-first transistor is connected to the second voltage control node, a first electrode of the ninety-first transistor is connected to the second sensing input leakage prevention node, and a second electrode of the ninety-first transistor is connected to the second voltage control node.

13. The shift register unit of claim 10, wherein the second current limiting circuit comprises:
a twelfth load circuit connected to the second voltage control node and the second power supply terminal; and configured to increase a load capacitance at the second voltage control node; and
wherein the twelfth load circuit comprises: a twelfth capacitor; and
a first terminal of the twelfth capacitor is connected to the second voltage control node, and a second terminal of the twelfth capacitor is connected to the second power supply terminal.

14. The shift register unit of claim 10, further comprising:
a second global reset circuit connected to a global reset signal input terminal, the second power supply terminal, and the second pull-up node, and configured to write an invalid level signal from the second power supply terminal to the second pull-up node in response to control of a valid level signal from the global reset signal input terminal; and
a fourth leakage prevention circuit, wherein the second global reset circuit is connected to the second power supply terminal through the fourth leakage prevention circuit, the second global reset circuit is connected to the fourth leakage prevention circuit at a fourth leakage prevention node connected to the second voltage control node; the fourth leakage prevention circuit is connected to the global reset signal input terminal, and is configured to form a path between the fourth leakage prevention node and the second power supply terminal in response to control of a valid level signal from the global reset signal input terminal, and to disconnect the fourth leakage prevention node from the second power supply terminal in response to control of an invalid level signal from the global reset signal input terminal;
wherein the second current limiting circuit comprises:
a thirteenth load circuit between the fourth leakage prevention node and the second voltage control node, and configured to increase a load resistance between the fourth leakage prevention node and the second voltage control node;
wherein the thirteenth load circuit comprises: a ninety-second transistor; and
a control electrode of the ninety-second transistor is connected to the second voltage control node, a first electrode of the ninety-second transistor is connected to the fourth leakage prevention node, and a second electrode of the ninety-second transistor is connected to the second voltage control node; and
the shift register unit further comprises a fifteenth load circuit, wherein at least one of the second global reset circuit and the fourth leakage prevention circuit is connected to the global reset signal input terminal through the fifteenth load circuit, the fifteenth load circuit is configured to increase a load resistance between the global reset signal input terminal and at least one of the first global reset circuit and the first leakage prevention circuit; and
wherein the fifteenth load circuit comprises: a ninety-fourth transistor; and
a control electrode of the ninety-fourth transistor is connected to the global reset signal input terminal, a first electrode of the ninety-fourth transistor is connected to the global reset signal input terminal, and a second electrode of the ninety-fourth transistor is connected to at least one of the second global reset circuit and the fourth leakage prevention circuit.

15. The shift register unit of claim 10, further comprising:
a second pull-down control circuit connected to the second power supply terminal, a fifth power supply terminal, the second pull-up node and a second pull-down node, and configured to write a voltage having a phase opposite to that of a voltage at the second pull-up node to the second pull-down node; and
a second pull-up noise reduction circuit connected to the second power supply terminal, the second pull-up node and the second pull-down node, and configured to write an invalid level signal from the second power supply terminal to the second pull-up node in response to control of a valid level signal at the second pull-down node;
wherein the second output circuit is further connected to the second pull-down node and the second power supply terminal, and is further configured to write an invalid level signal from the second power supply terminal to the corresponding second signal output terminal in response to control of a valid level signal at the second pull-down node;
the shift register unit further comprises: a sixth leakage prevention circuit; wherein the second pull-up noise reduction circuit is connected to the second power supply terminal through the sixth leakage prevention circuit, the second pull-up noise reduction circuit is connected to the sixth leakage prevention circuit at a sixth leakage prevention node connected to the second voltage control node; the sixth leakage prevention circuit is connected to the second pull-down node, and is configured to form a path between the sixth leakage prevention node and the second power supply terminal in response to control of a valid level signal at the second pull-down node, and to disconnect the sixth leakage prevention node from the second power supply terminal in response to control of an invalid level signal at the second pull-down node.

16. The shift register unit of claim 15, wherein the second voltage control node is between the second sensing input leakage prevention node and the sixth leakage prevention node; and
the second current limiting circuit comprises:
a fourteenth load circuit between the second voltage control node and the sixth leakage prevention node, and configured to increase a load resistance between the second voltage control node and the sixth leakage prevention node; and
wherein the fourteenth load circuit comprises: a ninety-third transistor; and
a control electrode of the ninety-third transistor is connected to the second voltage control node, a first electrode of the ninety-third transistor is connected to the second voltage control node, and a second electrode of the ninety-third transistor is connected to the sixth leakage prevention node.

17. The shift register unit of claim 9, further comprising:
a third pull-down noise reduction circuit connected to the second pull-down node, the second power supply terminal, the sensing control node and the clock control signal input terminal; and configured to write an invalid level signal from the second power supply terminal to the second pull-down node in response to control of a valid level signal at the sensing control node and a valid level signal from the clock control signal input terminal;

wherein the third pull-down noise reduction circuit comprises: a fifty-ninth transistor and a sixtieth transistor;
a control electrode of the fifty-ninth transistor is connected to the clock control signal input terminal, a first electrode of the fifty-ninth transistor is connected to the second pull-down node, and a second electrode of the fifty-ninth transistor is connected to a first electrode of the sixtieth transistor; and
a control electrode of the sixtieth transistor is connected to the sensing control node, and a second electrode of the sixtieth transistor is connected to the second power supply terminal; and
wherein the third pull-down noise reduction circuit further comprises: a ninety-fifth transistor through which the first electrode of the fifty-ninth transistor is connected to the second pull-down node; and
a control electrode of the ninety-fifth transistor is connected to the sensing control node, a first electrode of the ninety-fifth transistor is connected to the second pull-down node, and a second electrode of the ninety-fifth transistor is connected to the first electrode of the fifty-ninth transistor.

18. The shift register unit of claim 9, further comprising:
a second display input circuit connected to the display signal input terminal, the first power supply terminal and the second pull-up node, and configured to write a valid level signal from the first power supply terminal to the second pull-up node in response to control of a valid level signal from the display signal input terminal; and
a second display reset circuit connected to the display reset signal input terminal, the second power supply terminal and the second pull-up node; and configured to write an invalid level signal from the second power supply terminal to the second pull-up node in response to control of a valid level signal from the display reset signal input terminal;
the shift register unit further comprises: at least one of a second display input leakage prevention circuit and a fifth leakage prevention circuit;
wherein the second display input circuit is connected to the second pull-up node through the second display input leakage prevention circuit, the second display input circuit is connected to the second display input leakage prevention circuit at a second display input leakage prevention node connected to the second voltage control node; the second display input leakage prevention circuit is connected to the display signal input terminal, and is configured to form a path between the second display input leakage prevention node and the second pull-up node in response to control of a valid level signal from the display signal input terminal, and to disconnect the second display input leakage prevention node from the second pull-up node in response to control of an invalid level signal from the display signal input terminal; and
the second display reset circuit is connected to the second power supply terminal through the fifth leakage prevention circuit, the second display reset circuit is connected to the fifth leakage prevention circuit at a fifth leakage prevention node connected to the second voltage control node; the fifth leakage prevention circuit is connected to the display reset signal input terminal, and is configured to form a path between the fifth leakage prevention node and the second power supply terminal in response to control of a valid level signal from the display reset signal input terminal, and to disconnect the fifth leakage prevention node from the second power supply terminal in response to control of an invalid level signal from the display reset signal input terminal.

19. A gate driving circuit, comprising: a plurality of cascaded shift register units, each of which is the shift register unit of claim 1.

20. A display substrate, comprising: a base substrate and a gate driving circuit on the base substrate, wherein the gate driving circuit is the gate driving circuit of claim 19.

* * * * *